(12) United States Patent
Shen et al.

(10) Patent No.: US 7,451,386 B2
(45) Date of Patent: Nov. 11, 2008

(54) LDPC (LOW DENSITY PARITY CHECK) CODED MODULATION HYBRID DECODING

(75) Inventors: Ba-Zhong Shen, Irvine, CA (US); Hau Thien Tran, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 119 days.

(21) Appl. No.: 11/701,156

(22) Filed: Feb. 1, 2007

(65) Prior Publication Data

US 2008/0005650 A1    Jan. 3, 2008

Related U.S. Application Data

(63) Continuation of application No. 10/723,574, filed on Nov. 26, 2003, now Pat. No. 7,185,270.

(60) Provisional application No. 60/519,457, filed on Nov. 12, 2003, provisional application No. 60/490,967, filed on Jul. 29, 2003.

(51) Int. Cl.
*G06F 11/00* (2006.01)
*H03M 13/00* (2006.01)

(52) U.S. Cl. .................................... 714/801

(58) Field of Classification Search ................. 714/801, 714/807
See application file for complete search history.

(56) References Cited

OTHER PUBLICATIONS

Matsumoto et al., Blind synchronization with enhanced sum product algorithm for LDPC codes, 2002, IEEE, p. 966 to 970.*
Tian et al., Construction of irregular LDPC codes with low error follor, 2003, IEEE, p. 3125-3129.*

* cited by examiner

*Primary Examiner*—Shelly A Chase
(74) *Attorney, Agent, or Firm*—Garlick Harrison & Markison; Shayne X. Short

(57) ABSTRACT

LDPC (Low Density Parity Check) coded modulation hybrid decoding. A novel approach is presented wherein a combination of bit decoding and symbol level decoding (e.g., hybrid decoding) is performed for LDPC coded signals. Check node updating and symbol node updating are successively and alternatively performed on bit edge messages for a predetermined number of decoding iterations or until a sufficient degree of precision is achieved. The symbol node updating of the bit edge messages involves using symbol metrics corresponding to the symbol being decoded as well as the bit edge messages most recently updated by check node updating. The check node updating of the bit edge messages involves using the bit edge messages most recently updated by symbol node updating. The symbol node updating also involves computing possible soft symbol estimates for the symbol during each decoding iteration.

20 Claims, 36 Drawing Sheets hybrid decoding functionality (having reduced complexity of symbol decoding) of LDPC coded modulation signals HDTV (High Definition Television) communication system

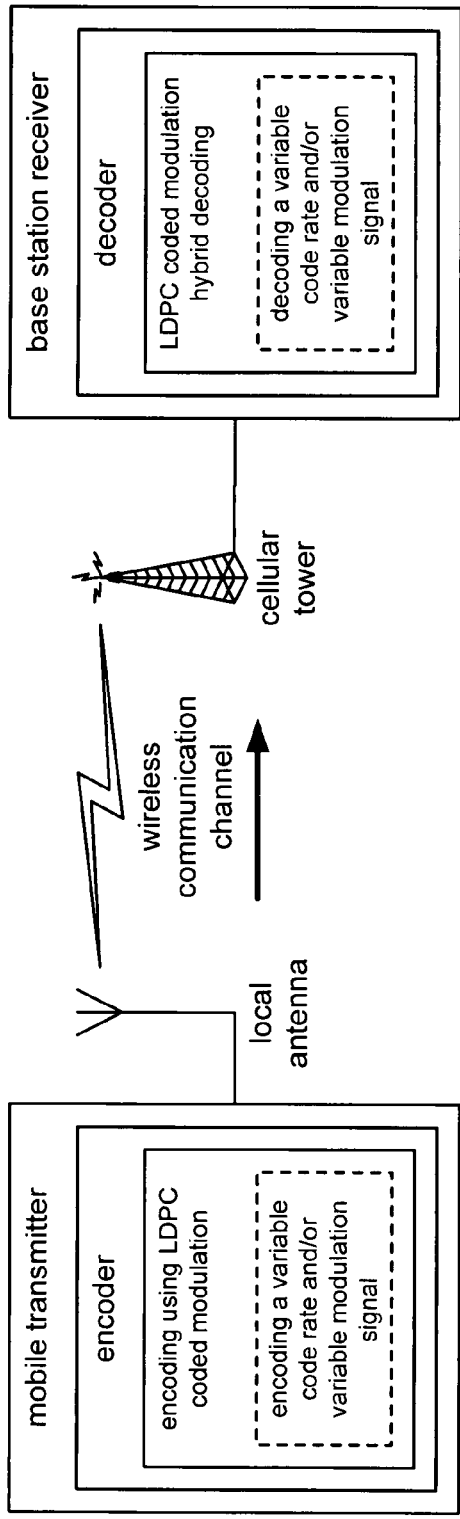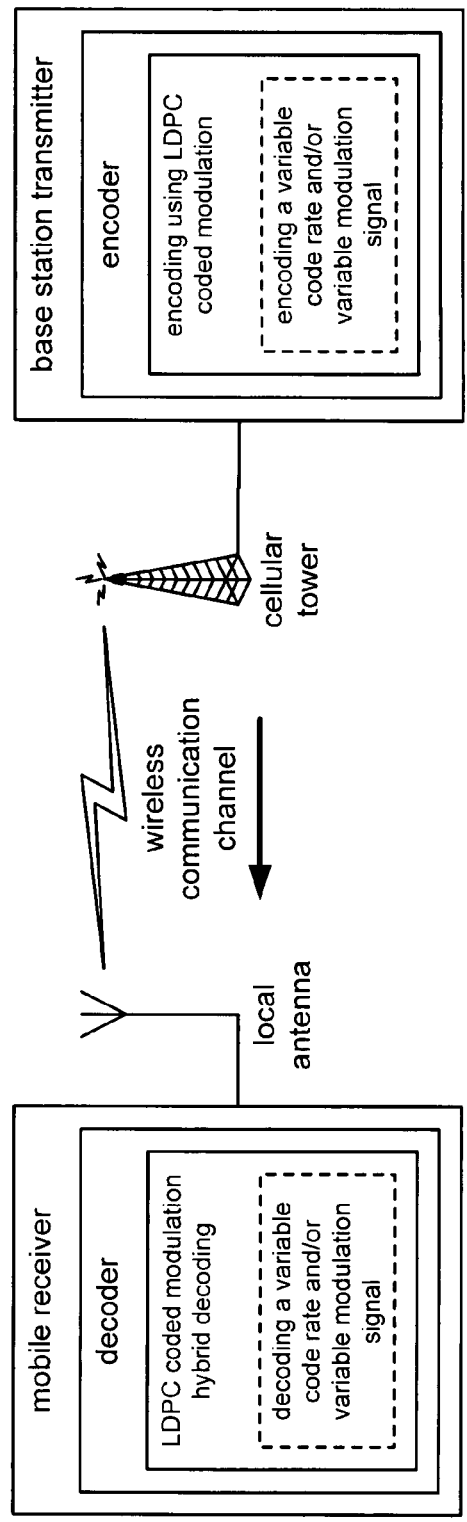

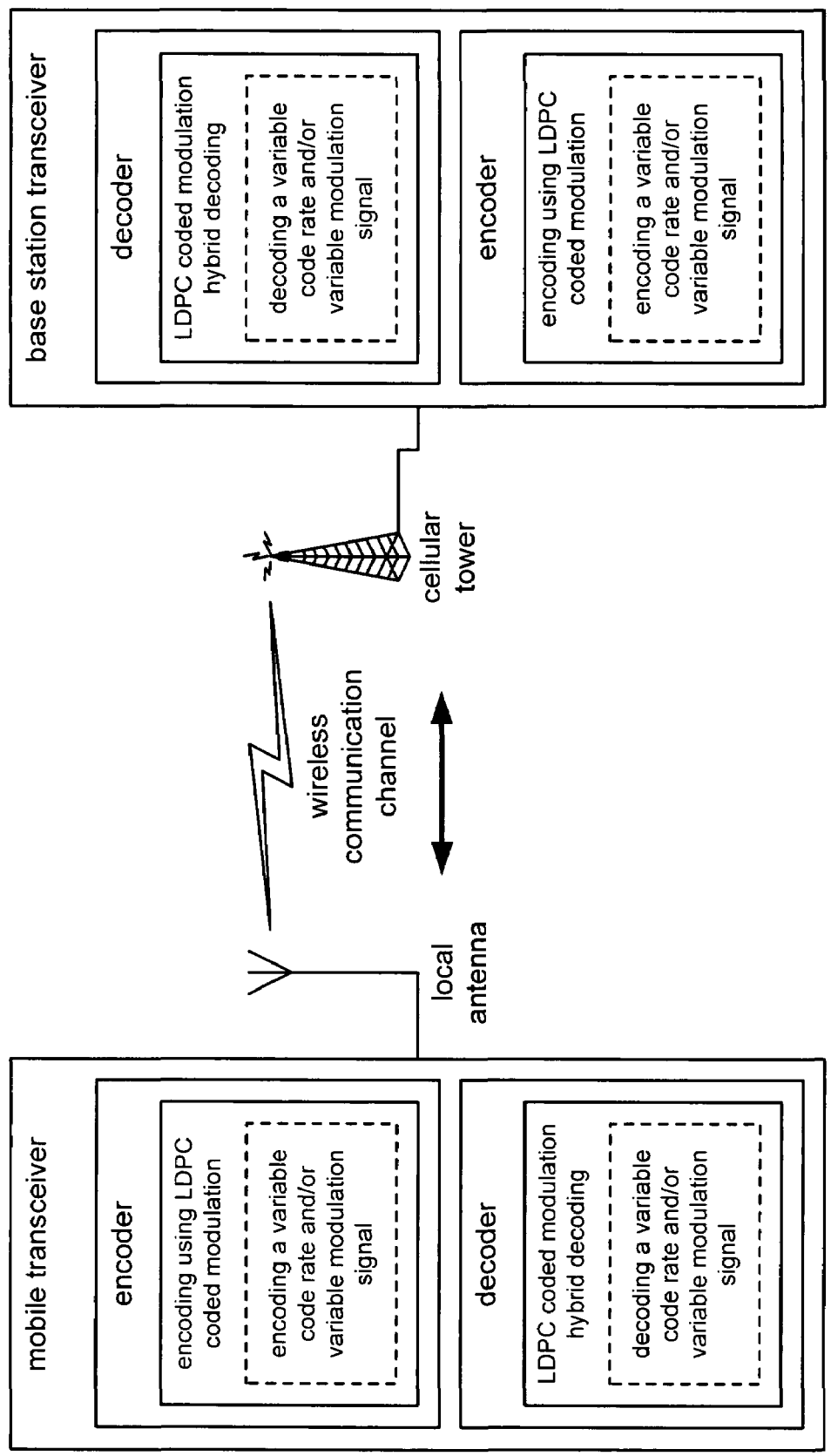

uni-directional microwave communication system uni-directional point-to-point radio communication system bi-directional point-to-point radio communication system uni-directional communication system bi-directional communication system one to many communication system WLAN (Wireless Local Area Network) communication system fiber-optic communication system satellite receiver STB (Set Top Box) system LDPC (Low Density Parity Check) code bipartite graph

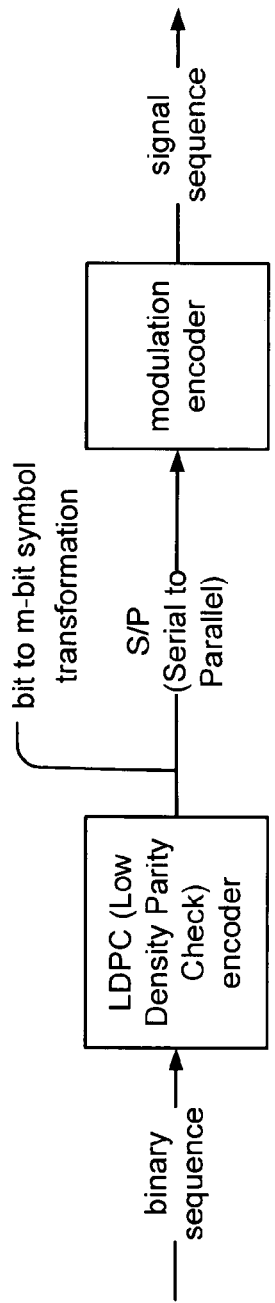
Fig. 17A direct combining of LDPC (Low Density Parity Check) coding and modulation
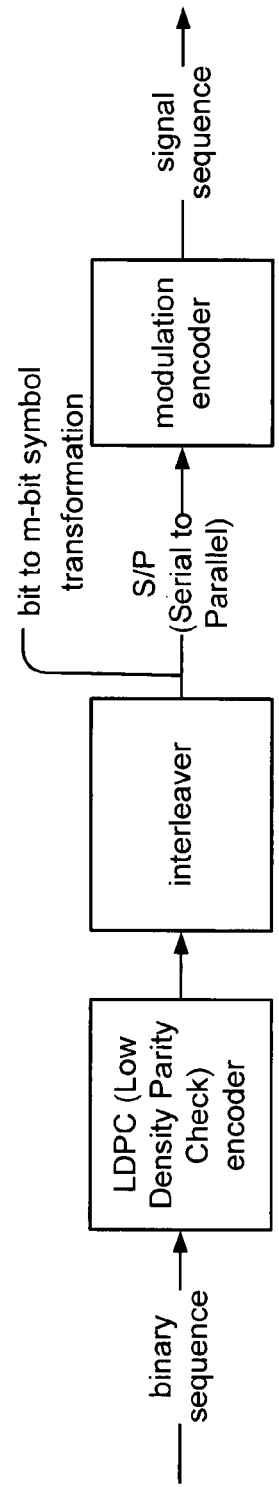
Fig. 17B BICM (Bit Interleaved Coded Modulation)
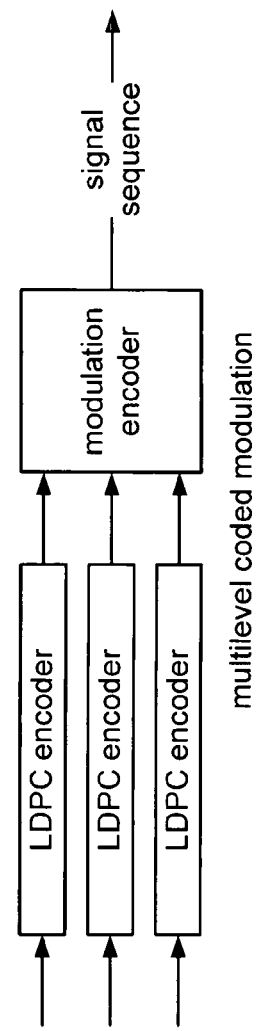
Fig. 17C multilevel coded modulation variable signal mapping LDPC (Low Density Parity Check) coded modulation system Fig. 19  LDPC (Low Density Parity Check) coded modulation decoding functionality using bit metric Fig. 20 alternative LDPC coded modulation decoding functionality using bit metric (when performing n number of iterations)

LDPC (Low Density Parity Check) coded modulation decoding functionality using bit metric (with bit metric updating)

alternative LDPC coded modulation decoding functionality using bit metric (with bit metric updating) (when performing n number of iterations)

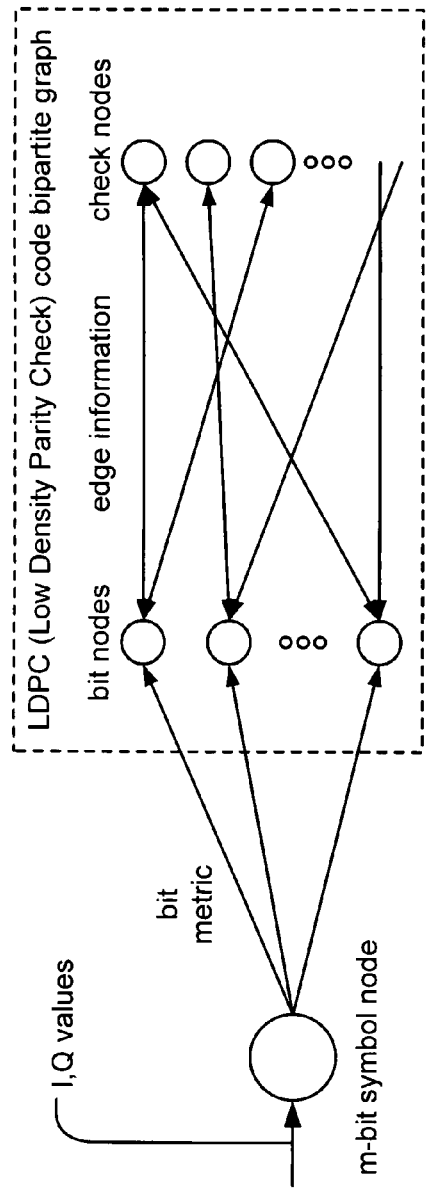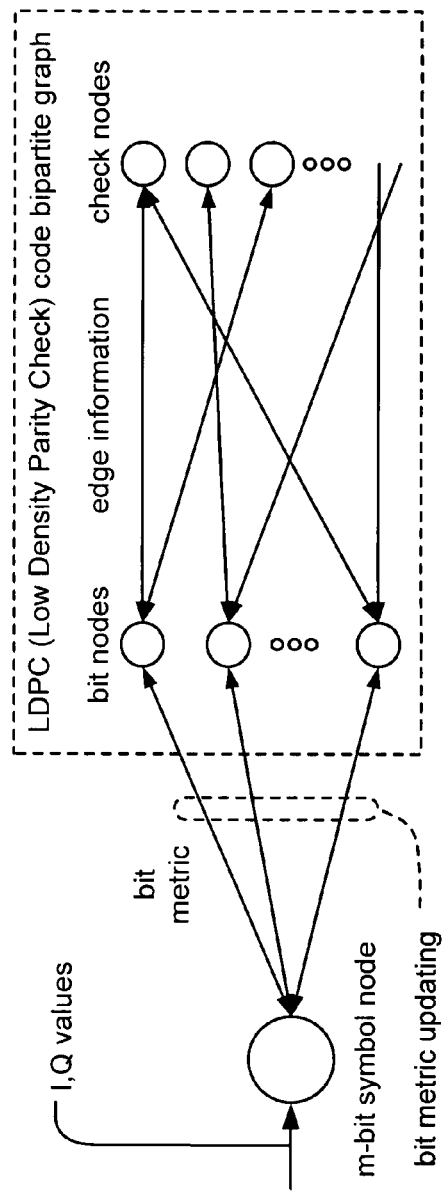

LDPC coded modulation bipartite graph (or symbol bipartite graph) with symbol nodes connected directly to check nodes (with labeled edges)

LDPC (Low Density Parity Check) coded modulation tripartite graph (or bit bipartite graph) with symbol nodes connected to bit nodes symbol decoding (shown with respect to LDPC (Low Density Parity Check) coded modulation bipartite graph)

symbol decoding functionality (supported with LDPC (Low Density Parity Check) coded modulation bipartite graph)

hybrid decoding functionality (having reduced complexity of symbol decoding) of LDPC coded modulation signals method for hybrid decoding of LDPC coded modulation signals method for hybrid decoding of LDPC coded modulation signals combined binary vector generation expanded binary vector generation method for updating edge messages (within symbol node updating)

method for calculating soft estimates of symbols (within symbol node updating)

projection of symbol onto label binary vector

LDPC (LOW DENSITY PARITY CHECK) CODED MODULATION HYBRID DECODING

CROSS REFERENCE TO RELATED PATENTS/PATENT APPLICATIONS

Continuation Priority Claim, 35 U.S.C. § 120

The present U.S. Utility Patent Application claims priority pursuant to 35 U.S.C. § 120, as a continuation, to the following U.S. Utility Patent Application which is hereby incorporated herein by reference in its entirety and made part of the present U.S. Utility Patent Application for all purposes:
1. U.S. application Ser. No. 10/723,574, entitled "LDPC (Low Density Parity Check) coded modulation hybrid decoding," filed Nov. 26, 2003 now U.S. Pat. No. 7,185,270, which claims priority pursuant to 35 U.S.C. § 119 (e) to the following U.S. Provisional Patent Applications which are hereby incorporated herein by reference in their entirety and made part of the present U.S. Utility Patent Application for all purposes:
   a. U.S. Provisional Application Ser. No. 60/490,967, "LDPC (Low Density Parity Check) coded modulation symbol decoding," filed Jul. 29, 2003.
   b. U.S. Provisional Application Ser. No. 60/519,457, "LDPC (Low Density Parity Check) coded modulation hybrid decoding," filed Nov. 12, 2003.

Incorporation by Reference

The following U.S. Utility Patent Application is hereby incorporated herein by reference in its entirety and is made part of the present U.S. Utility Patent Application for all purposes:
1. U.S. application Ser. No. 10/668,526, entitled "LDPC (Low Density Parity Check) coded modulation symbol decoding," filed Sep. 23, 2003, now U.S. Pat. No. 7,159,170 B2, issued on Jan. 2, 2007, which claims priority pursuant to 35 U.S.C. § 119(e) to the following U.S. Provisional Patent Applications which are hereby incorporated herein by reference in their entirety and made part of the present U.S. Utility Patent Application for all purposes:
   a. U.S. Provisional Application Ser. No. 60/478,690, "Coded modulation with LDPC (Low Density Parity Check) code using variable maps and metric updating," filed Jun. 13, 2003.
   b. U.S. Provisional Application Ser. No. 60/490,967, "LDPC (Low Density Parity Check) coded modulation symbol decoding," filed Jul. 29, 2003.

BACKGROUND OF THE INVENTION

1. Technical Field of the Invention

The invention relates generally to communication systems; and, more particularly, it relates to decoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Typical encoding of LDPC coded modulation signals is performed by generating a signal that includes symbols each having a common code rate and being mapped to a singular modulation. That is to say, all of the symbols of such an LDPC coded modulation signal have the same code rate and the same modulation (the same constellation having a singular mapping). Oftentimes, such prior art encoding designs are implemented as to maximize the hardware and processing efficiencies of the particular design employed to generate the LDPC coded modulation signal having the single code rate and single modulation for all of the symbols generated therein.

With respect to decoding of such LDPC coded modulation signals, decoding is most commonly performed based on a bipartite graph of a given LDPC code such that the graph includes both bit nodes and check nodes. The I, Q (In-phase, Quadrature) values associated with received symbols are associated with a symbol node, and that symbol node is associated with corresponding bit nodes. Bit metrics are then calculated for the individual bits of the corresponding symbols, and those bit metrics are provided to the bit nodes of the bipartite graph of the given LDPC code. Edge information corresponding to the edges that interconnect the bit nodes and the check nodes is calculated, and appropriately updated, and communicated back and forth between the bit nodes and the check nodes during iterative decoding of the LDPC coded signal. Within such typical decoding systems, the bit metric values that are employed are fixed values and used repeatedly in the iterative decoding processing. As such, the performance of such prior art, bit only decoding approaches is inherently limited and may require more iterations to converge on a best estimate of information contained within an LDPC coded modulation signal.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 3A and FIG. 3B are system diagrams illustrating embodiment of uni-directional cellular communication systems that are built according to the invention.

FIG. 4 is a system diagram illustrating an embodiment of a bi-directional cellular communication system that is built according to the invention.

FIG. 17A is a diagram illustrating an embodiment of direct combining of LDPC (Low Density Parity Check) coding and modulation encoding.

FIG. 17B is a diagram illustrating an embodiment of BICM (Bit Interleaved Coded Modulation) that is employed in conjunction with LDPC (Low Density Parity Check) coding and modulation encoding.

FIG. 17C is a diagram illustrating an embodiment of multilevel coded modulation encoding.

FIG. 23A is a diagram illustrating bit decoding using bit metric (shown with respect to an LDPC (Low Density Parity Check) code bipartite graph) according to the invention.

FIG. 23B is a diagram illustrating bit decoding using bit metric updating (shown with respect to an LDPC (Low Density Parity Check) code bipartite graph) according to the invention.

DETAILED DESCRIPTION OF THE INVENTION

Various aspects of the invention may be found in any number of devices that perform either one or both of encoding and decoding of LDPC (Low Density Parity Check) coded signals. Moreover, in some embodiments, the encoding and decoding may be performed by combining LDPC coding and modulation coding to generate an LDPC coded signal. In some instances of the invention, the LDPC encoding is combined with modulation encoding to generate a variable modulation signal whose modulation may vary as frequently as on a symbol by symbol basis. That is to say, the constellation and/or mapping of the symbols of an LDPC coded variable modulation signal may vary as frequently as on a symbol by symbol basis. In addition, the code rate of the symbols of the coded signal may also vary as frequently as on a symbol by symbol basis. In general, an LDPC signal generated according to the encoding aspects of the invention may be characterized as a variable code rate and/or modulation signal.

Various decoding aspects of the invention may be found in devices that perform hybrid decoding of LDPC coded modulation signals. In addition, these aspects may be found in devices that perform hybrid decoding of LDPC coded variable modulation signals. It is also noted that the hybrid decoding aspects of the invention are also applicable to decode LDPC signals that have a single code rate and/or single modulation for all of the symbols of the LDPC signal. For example, for an LDPC signal whose symbols all have a common code rate and a common modulation (constellation and mapping), the hybrid decoding aspects of the invention may also be employed. Also, various hybrid decoding aspects of the invention may be found in devices that perform hybrid decoding of LDPC coded signals that do not necessarily include combined LDPC coding and modulation encoding. For example, these hybrid decoding aspects of the invention are also operable to perform hybrid decoding of signals that are generated using only LDPC coding (e.g., not be using combined LDPC coding and modulation coding). The LDPC hybrid decoding may be implemented to perform updating of a bit metric that is employed.

Various system embodiments are described below where any of the various aspects of the invention may be implemented. In general, any device that performs encoding and/or hybrid decoding of LDPC coded signals may benefit from the invention. Again, this also includes those LDPC coded signals that have variable code rate and/or modulation as well as those that include combined LDPC coding and modulation coding.

Figure 1:
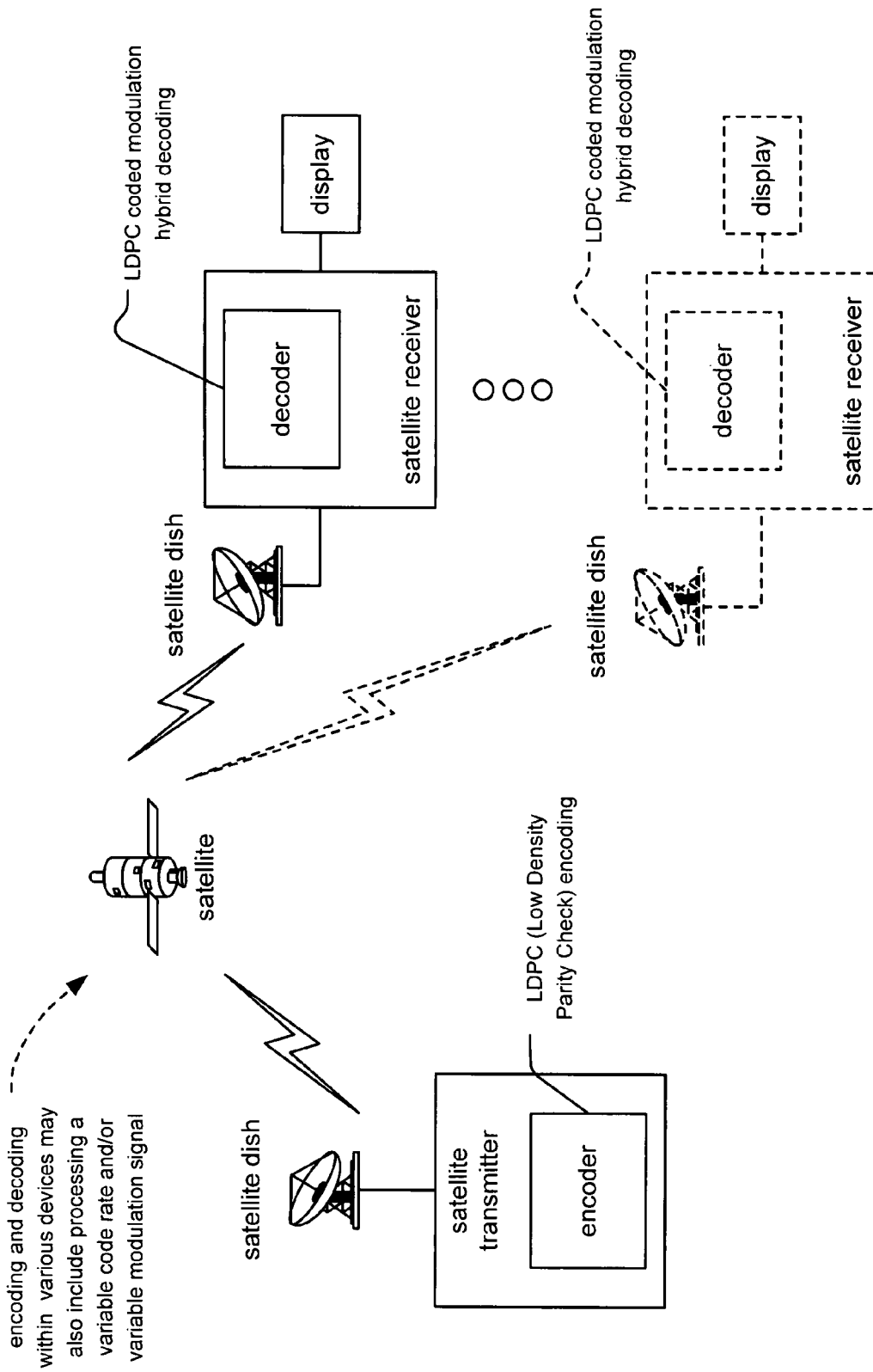
FIG. 1 is a system diagram illustrating an embodiment of a satellite communication system that is built according to the invention.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). The encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoders within the satellite receivers may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows just one of the many embodiments where one or more of the various aspects of the invention may be found.

Figure 2:
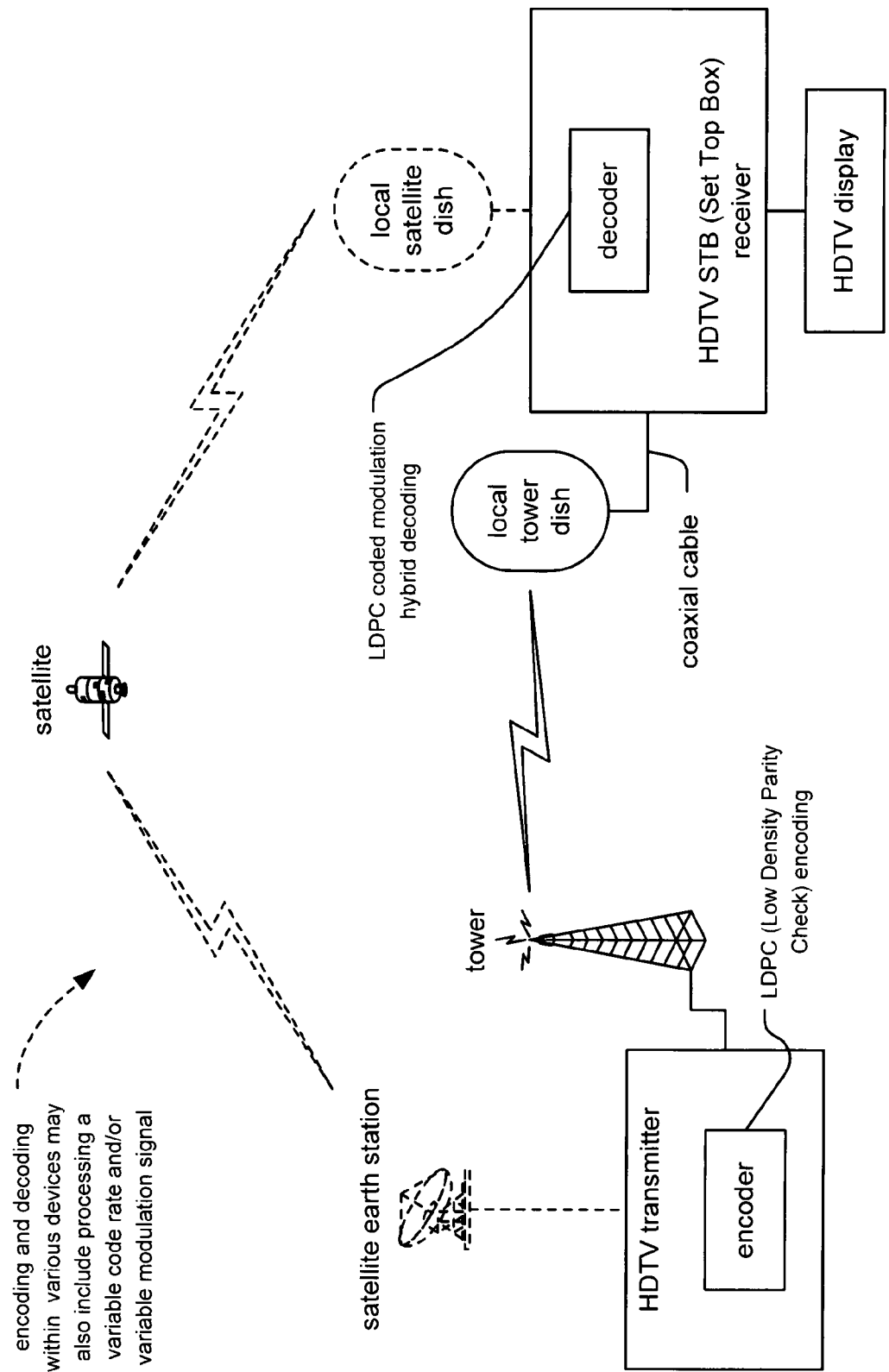
FIG. 2 is a system diagram illustrating an embodiment of an HDTV (High Definition Television) communication system that is built according to the invention.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate any up-converting that may have been performed before and during transmission of the signal from the HDTV transmitter and its corresponding tower to transform the signal into a format that is compatible with the communication channel across which it is transmitted.

The HDTV STB receiver is also communicatively coupled to an HDTV display that is able to display the demodulated and decoded wireless transmitted signals received by the HDTV STB receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel.

In this situation, the HDTV transmitter operates as a relaying element to transfer a signal originally provided by the satellite that is destined for the HDTV STB receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and whichever signal path the HDTV transmitter employs to communicate with the HDTV STB receiver, the HDTV STB receiver is operable to receive communication transmissions from the HDTV transmitter.

The HDTV transmitter is operable to encode information (using an encoder) that is to be transmitted to the HDTV STB receiver; the HDTV STB receiver is operable to decode the transmitted signal (using a decoder).

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmission functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder).

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder).

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

FIG. 4 is a system diagram illustrating an embodiment of a bi-directional cellular communication system, built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver; the mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder of either of the base station transceiver or the mobile transceiver may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 5:
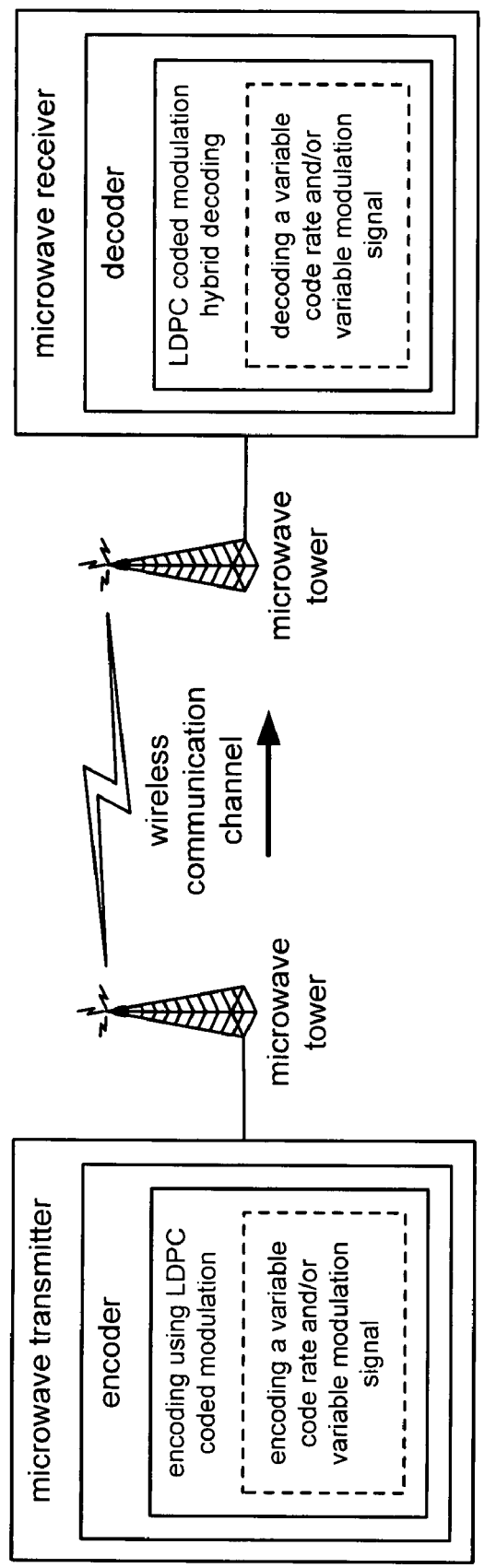
FIG. 5 is a system diagram illustrating an embodiment of a uni-directional microwave communication system that is built according to the invention.

FIG. 5 is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder).

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 6:
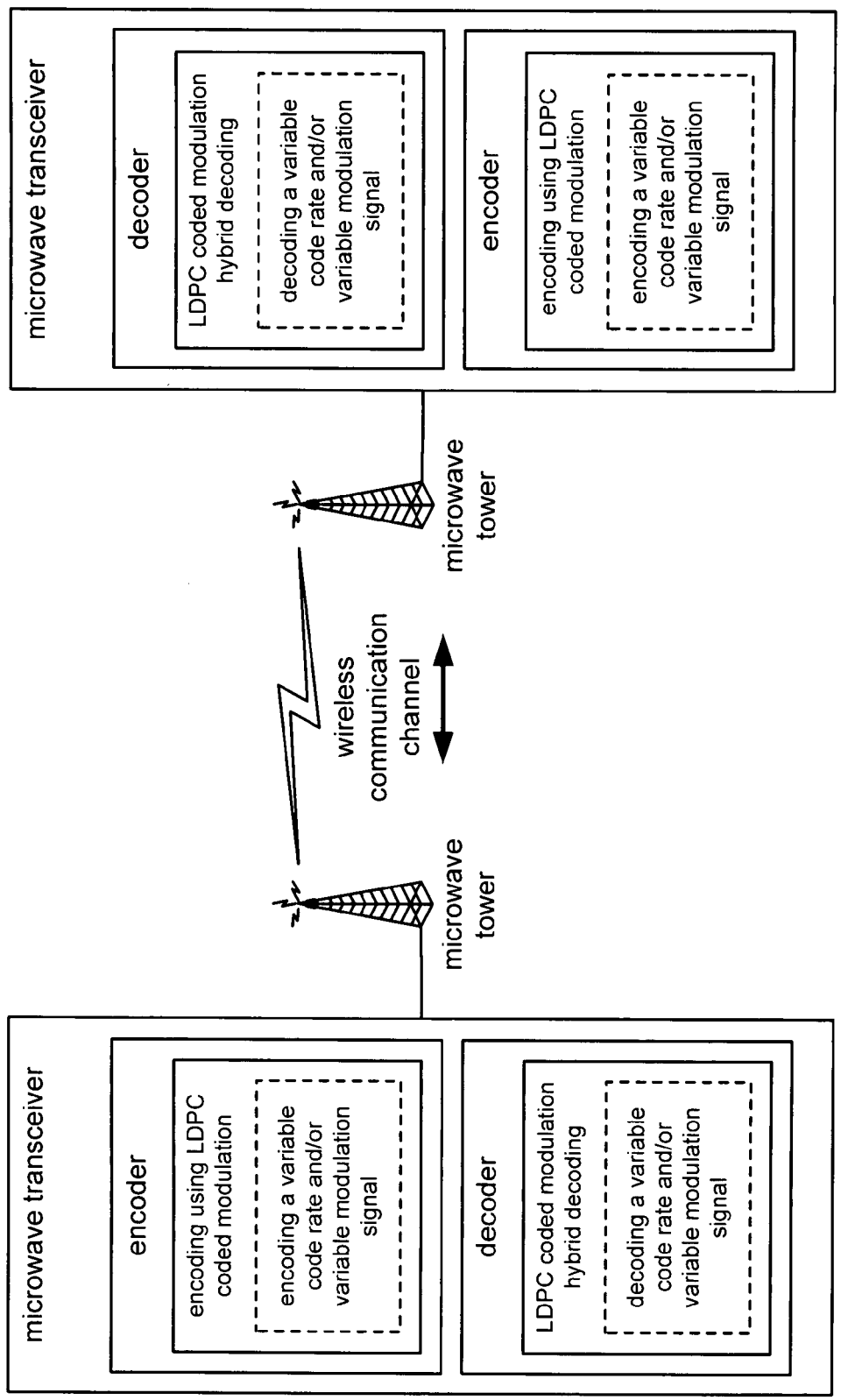
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within the FIG. 6, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder.

As within other embodiments that employ an encoder and a decoder, the encoder of either of the microwave transceivers may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder of either of the microwave transceivers may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 7:
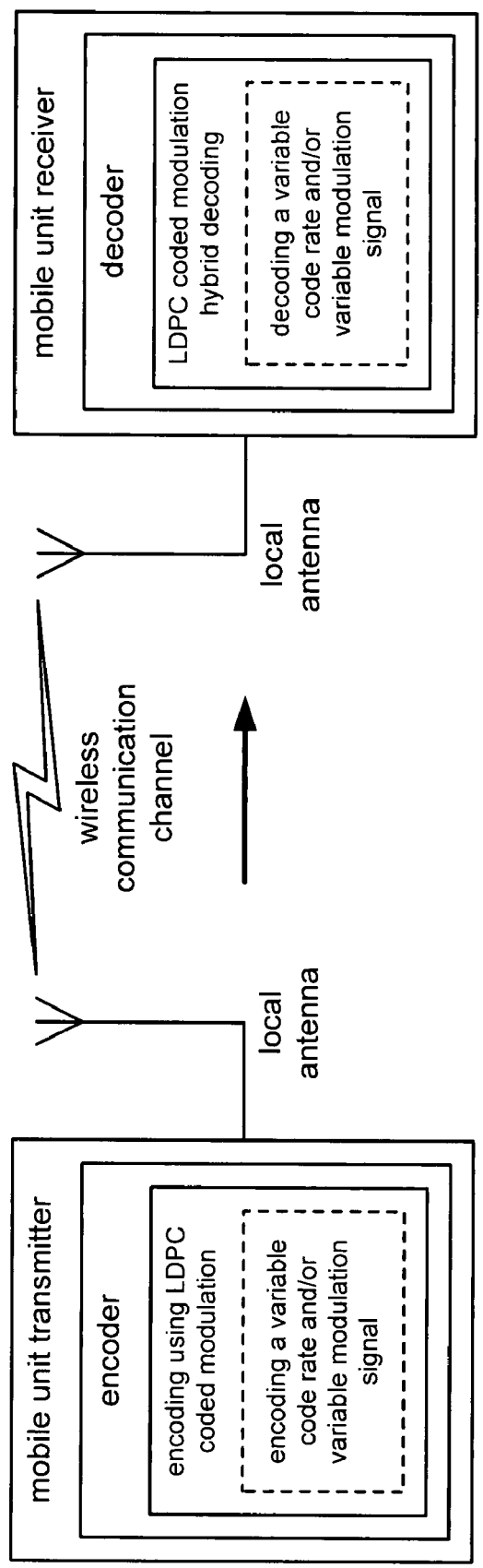
FIG. 7 is a system diagram illustrating an embodiment of a uni-directional point-to-point radio communication system that is built according to the invention.

FIG. 7 is a system diagram illustrating an embodiment of a uni-directional point-to-point radio communication system, built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder).

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 8:
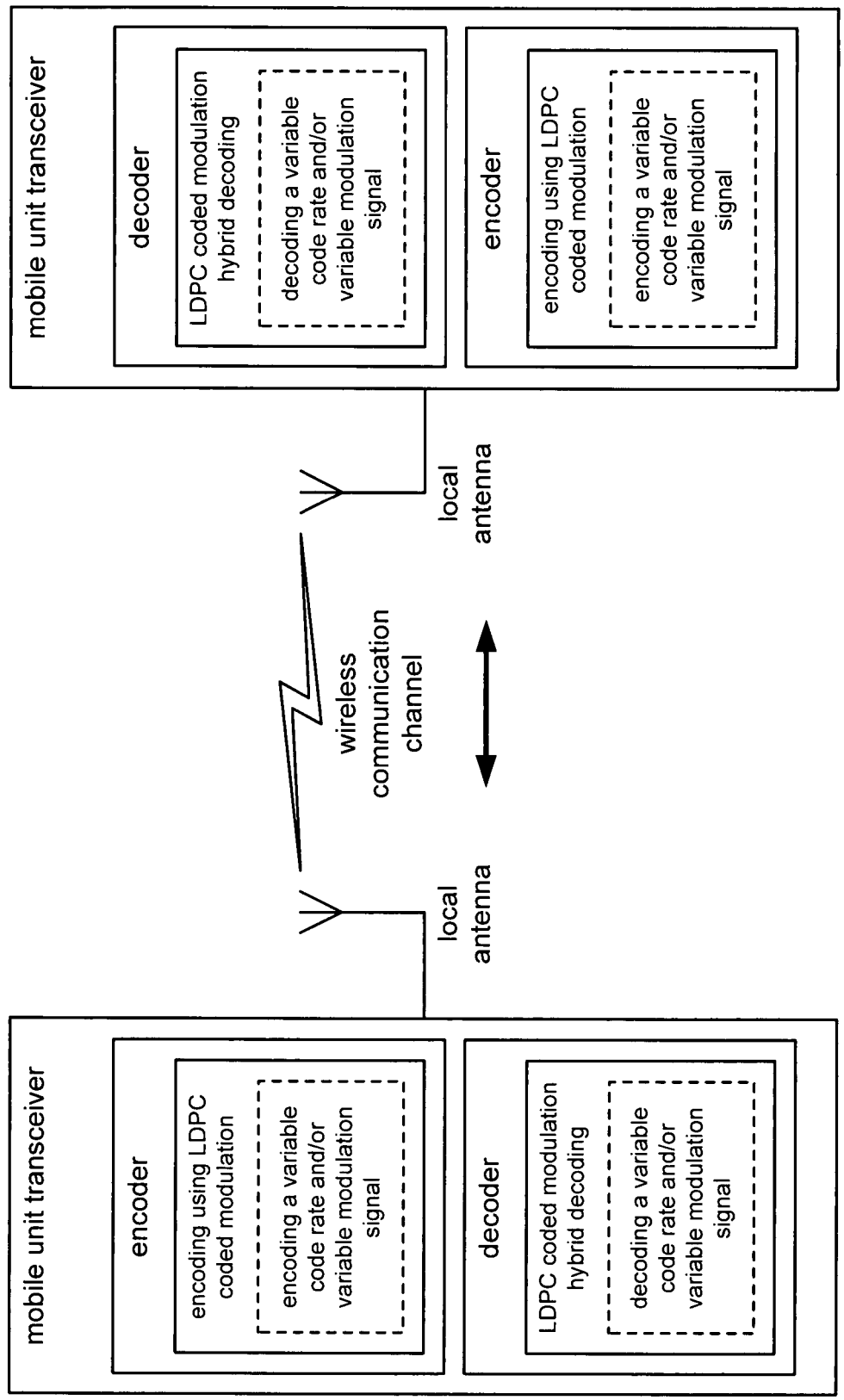
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. A first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using its corresponding encoder) that is to be transmitted to the other mobile unit transceiver; each mobile unit transceiver is operable to decode the transmitted signal (using its corresponding decoder) that it receives.

As within other embodiments that employ an encoder and a decoder, the encoder of either of the mobile unit transceivers may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder of either of the mobile unit transceivers may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 9:
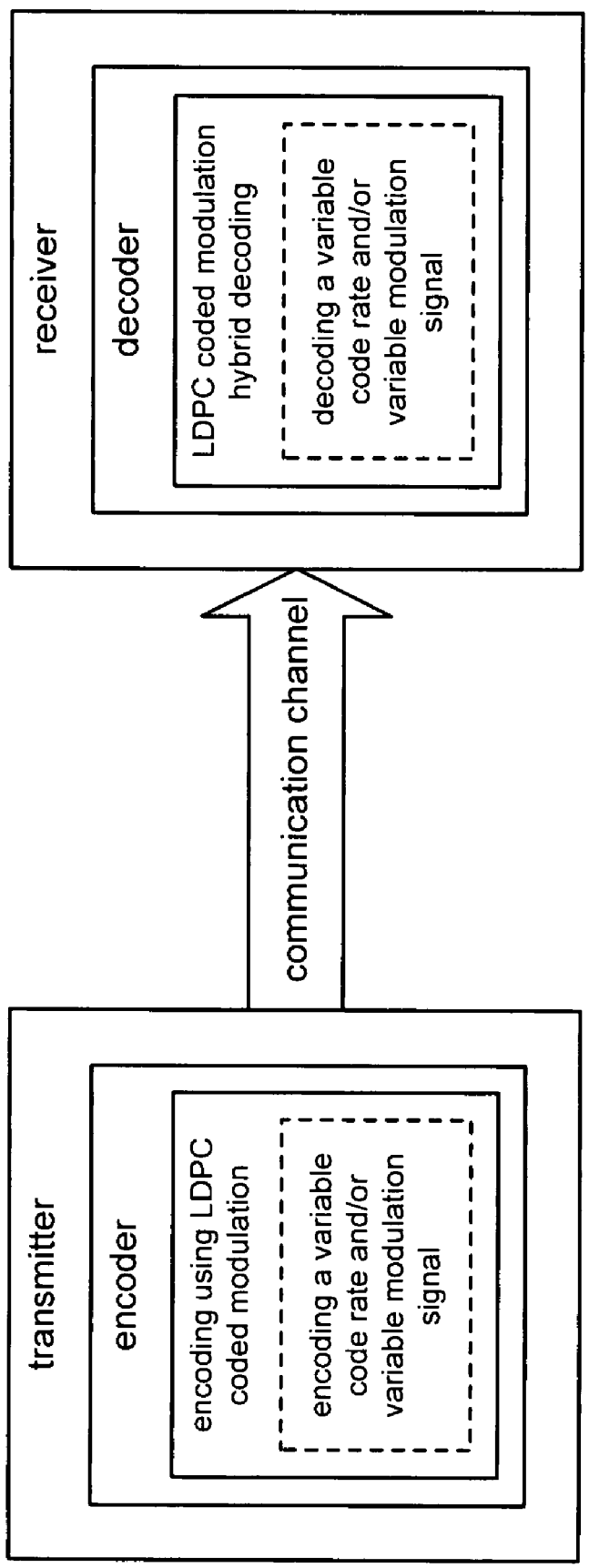
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder).

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 10:
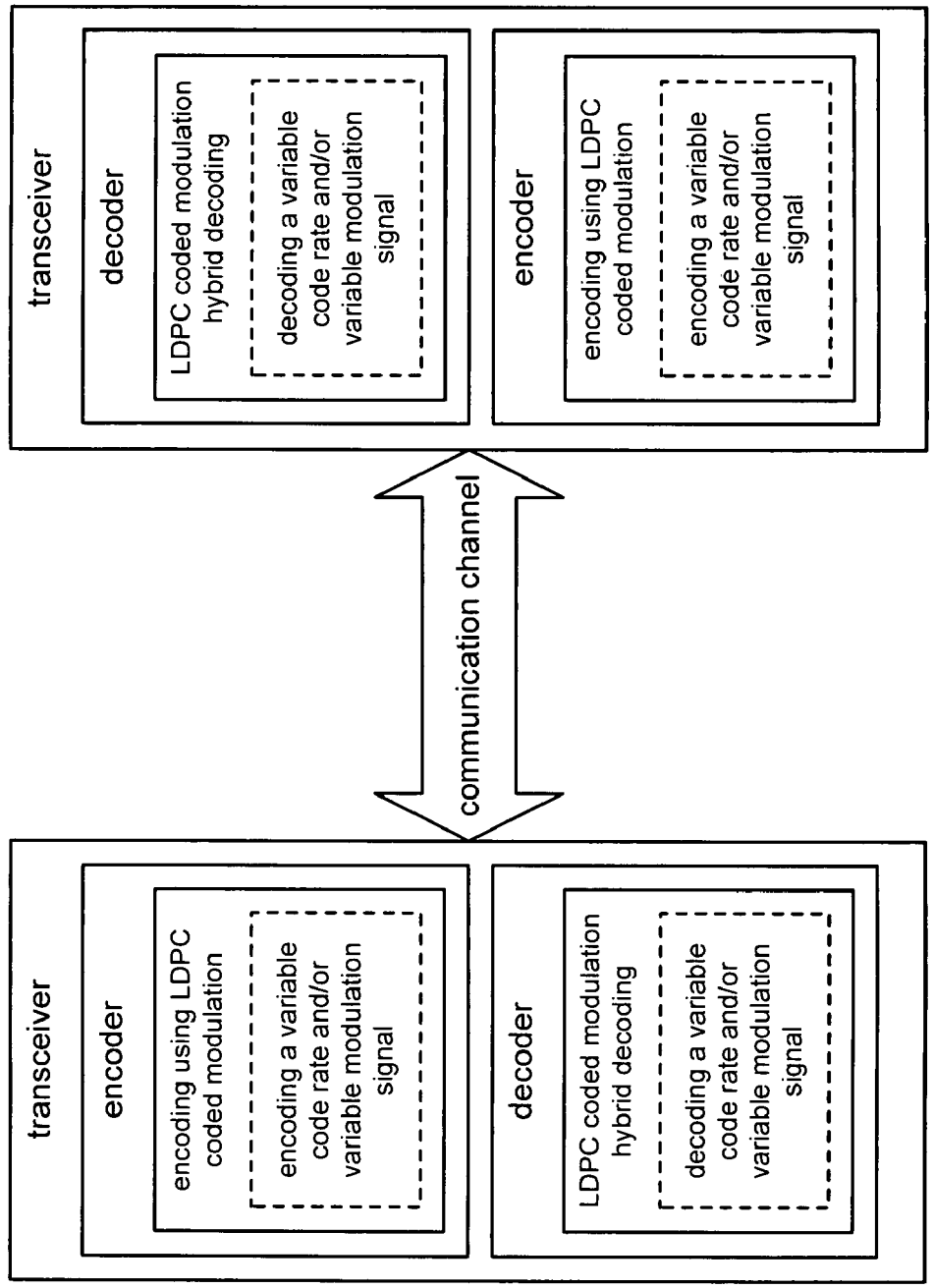
FIG. 10 is a system diagram illustrating an embodiment of a bi-directional communication system that is built according to the invention.

FIG. 10 is a system diagram illustrating an embodiment of a bi-directional communication system that is built according to the invention. A first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted to the other transceiver; each transceiver is operable to decode the transmitted signal (using its corresponding decoder) that it receives.

As within other embodiments that employ an encoder and a decoder, the encoder of either of the transceivers may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder of either of the transceivers may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 11:
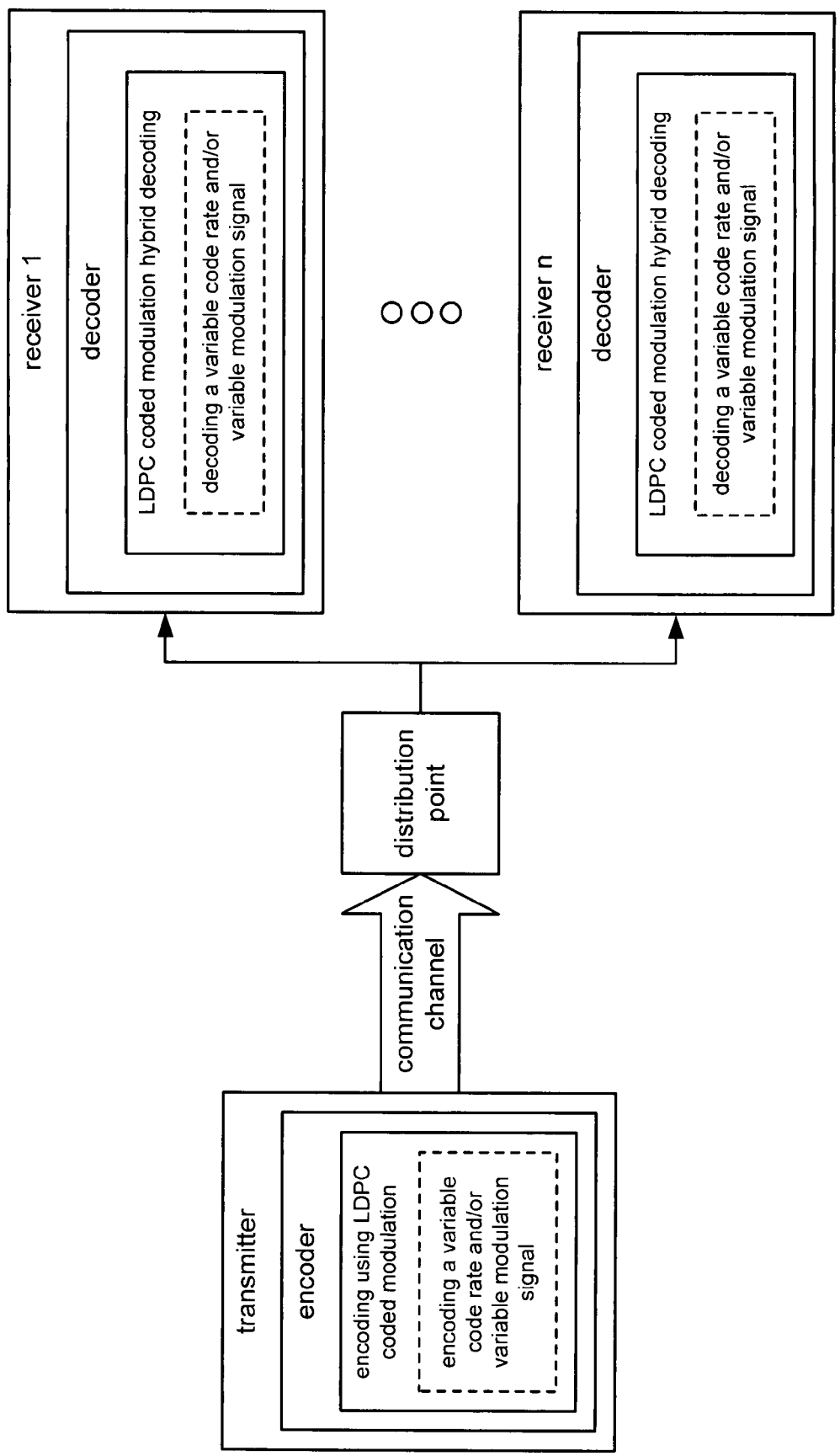
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, . . . , n via a uni-directional communication channel. The uni-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

A distribution point is employed within the one to many communication system to provide the appropriate communication to the receivers 1, . . . , and n. In certain embodiments, the receivers 1, . . . , and n each receive the same communication and individually discern which portion of the total communication is intended for them.

The transmitter is operable to encode information (using an encoder) that is to be transmitted to the receivers 1, . . . , and n; each of the receivers 1, . . . , and n is operable to decode the transmitted signal (using a decoder).

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoders of any of the receivers 1, . . . , and n may be implemented to perform decoding of LDPC coded signals.

This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 12:
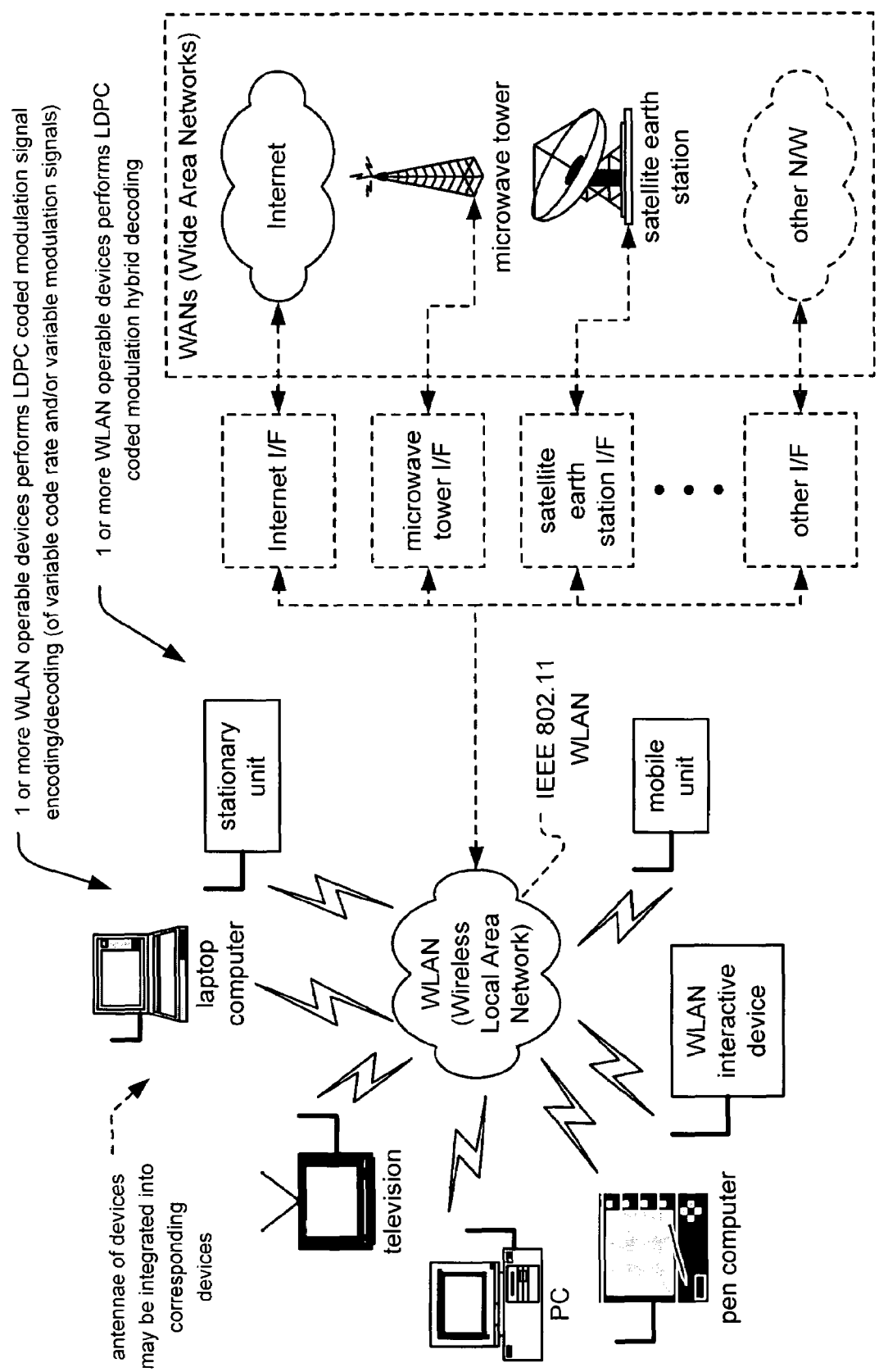
FIG. 12 is a diagram illustrating an embodiment of a WLAN (Wireless Local Area Network) that may be implemented according to the invention.

FIG. 12 is a diagram illustrating an embodiment of a WLAN (Wireless Local Area Network) that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of the various WLAN interactive devices may be integrated into the corresponding devices without departing from the scope and spirit of the invention as well.

This illustrated group of devices that may interact with the WLAN is not intended to be an exhaustive list of device that may interact with a WLAN, and a generic device shown as a WLAN interactive device represents a generic device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs.

Again, as within other embodiments that employ an encoder and a decoder, any of the encoder of within the various devices may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoders of any of the various devices may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an 802.11 operable device may be an 802.11a operable device, an 802.11b operable device, or an 802.11g operable device. The IEEE 802.11g specification extends the rates for packet transmission in the 2.4 GHz frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the 802.11b standard. The 802.11a standard uses a different frame format with OFDM (Orthogonal Frequency Division Multiplexing) to transmit at rates up to 54 Mbps with carrier frequencies in the 5 GHz range. The 802.11g specification allows for such OFDM frames to coexist with DSSS/CCK frames at 2.4 GHz.

Figure 13:
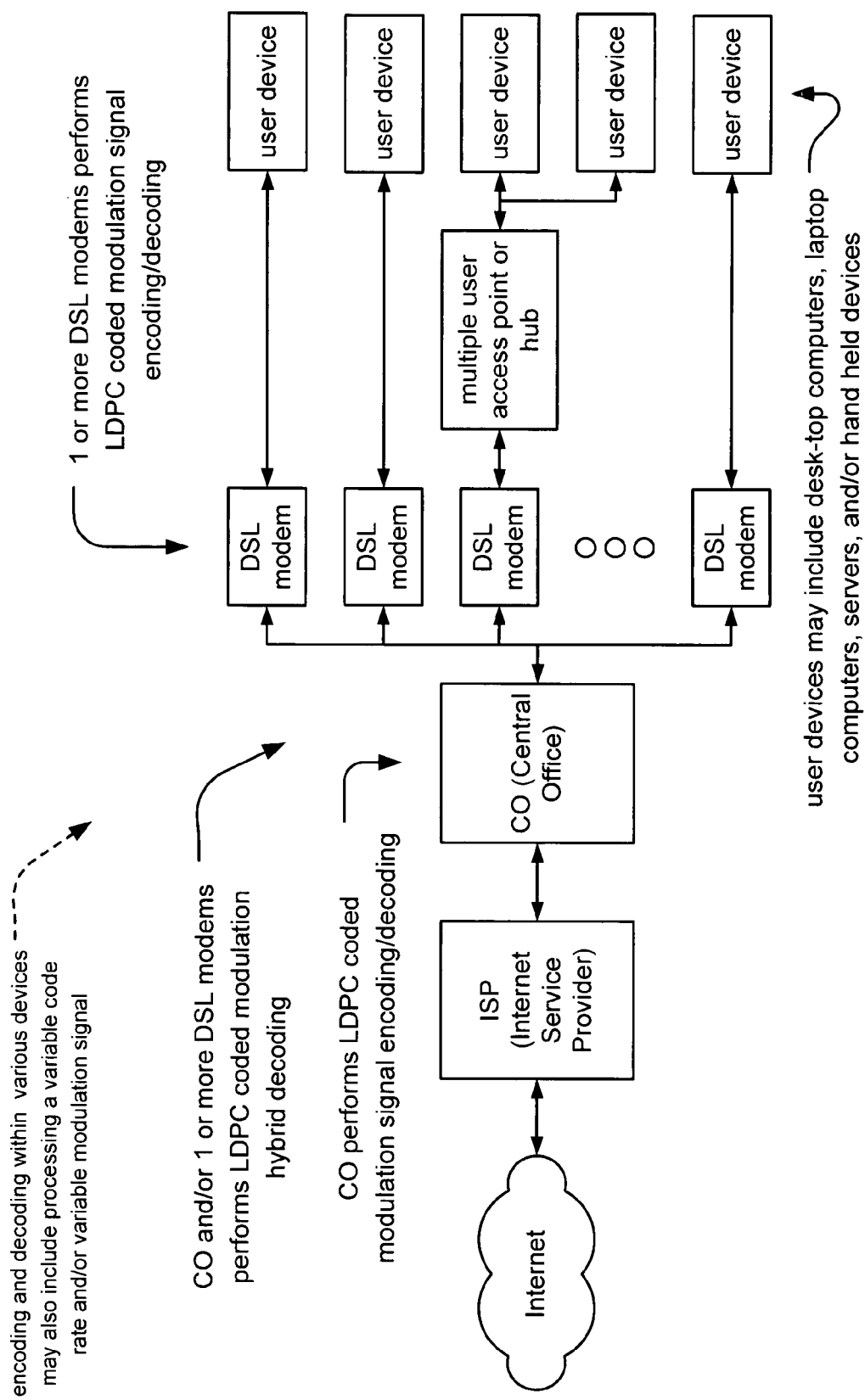
FIG. 13 is a diagram illustrating an embodiment of a DSL (Digital Subscriber Line) communication system that may be implemented according to the invention.

FIG. 13 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephone services company. The CO may also allow for the providing of telephone services to one or more subscribers. However, the CO may also be implemented to allow interfacing of Internet traffic to and from one or more users (whose interactive devices are shown as user devices). These user devices may be a wide variety of devices including desk-top computers, laptop computers, servers, and/or hand held devices without departing from the scope and spirit of the invention. Any of these user devices may be wired or wireless typed devices as well. Each of the user devices is operably coupled to the CO via a DSL modem. The DSL modem may also be communicatively coupled to a multiple user access point or hub to allow more than one user device to access the Internet.

The CO and the various DSL modems may also be implemented to include an encoder and a decoder to allow bi-directional communication therein. For example, the CO is operable to encode and decode data when communicating to and from the various DSL modems and the ISP. Similarly, each of the various DSL modems is operable to encode and decode data when communicating to and from the CO and its respective one or more user devices.

Again, as within other embodiments that employ an encoder and a decoder, the encoder of any of the CO and the various DSL modems may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder of any of the CO and the various DSL modem may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 14:
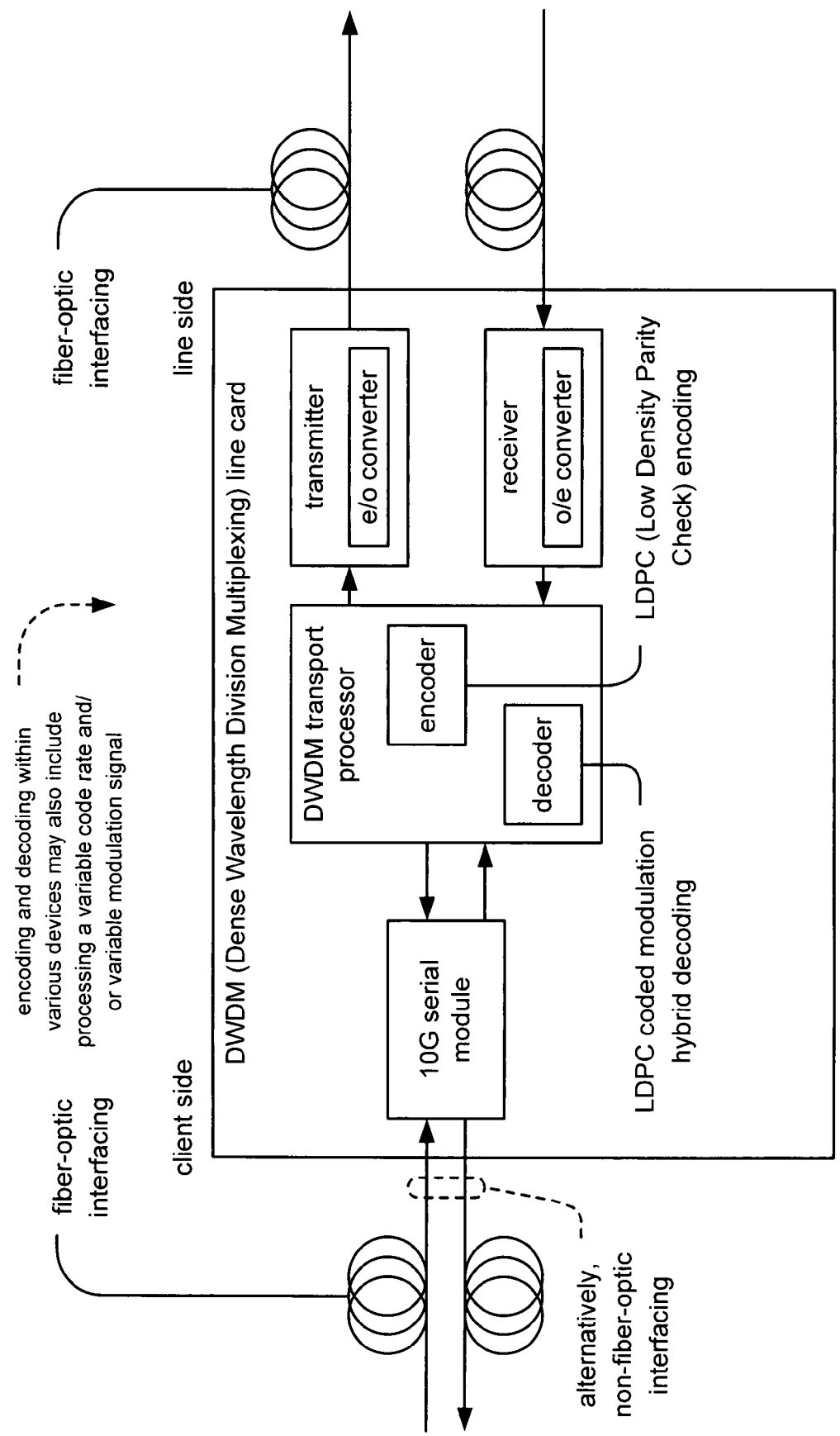
FIG. 14 is a system diagram illustrating an embodiment of a fiber-optic communication system that is built according to the invention.

FIG. 14 is a system diagram illustrating an embodiment of a fiber-optic communication system that is built according to the invention. The fiber-optic communication system may be implemented to support encoding and/or decoding of LDPC coded signals. In some instances, these LDPC coded signals include a code rate and/or modulation (constellation and mapping) that may vary as frequently as on a symbol by symbol basis. Moreover, the fiber-optic communication system may be implemented to support LDPC hybrid decoding within the iterative decoding processing.

The fiber-optic communication system includes a DWDM (Dense Wavelength Division Multiplexing (within the context of fiber optic communications)) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: Because DWDM is a PHY (physical layer) architecture, it can transparently support both TDM (Time Division Multiplexing) and data formats such as ATM (Asynchronous Transfer Mode), Gigabit Ethernet, ESCON (Enterprise System CONnection), and Fibre Channel with open interfaces over a common physical layer.

The scalability of DWDM: DWDM can leverage the abundance of dark fiber in many metropolitan area and enterprise networks to quickly meet demand for capacity on point-to-point links and on spans of existing SONET/SDH (Synchronous Optical NETwork)/(Synchronous Digital Hierarchy) rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder may be implemented to perform encoding using LDPC coded modulation, and the LDPC encoding may be performed to generate an LDPC coded signal whose code rate and/or modulation (constellation and mapping) may vary as frequently as on a symbol by symbol basis. The decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis. This diagram shows yet another embodiment where one or more of the various aspects of the invention may be found.

Figure 15:
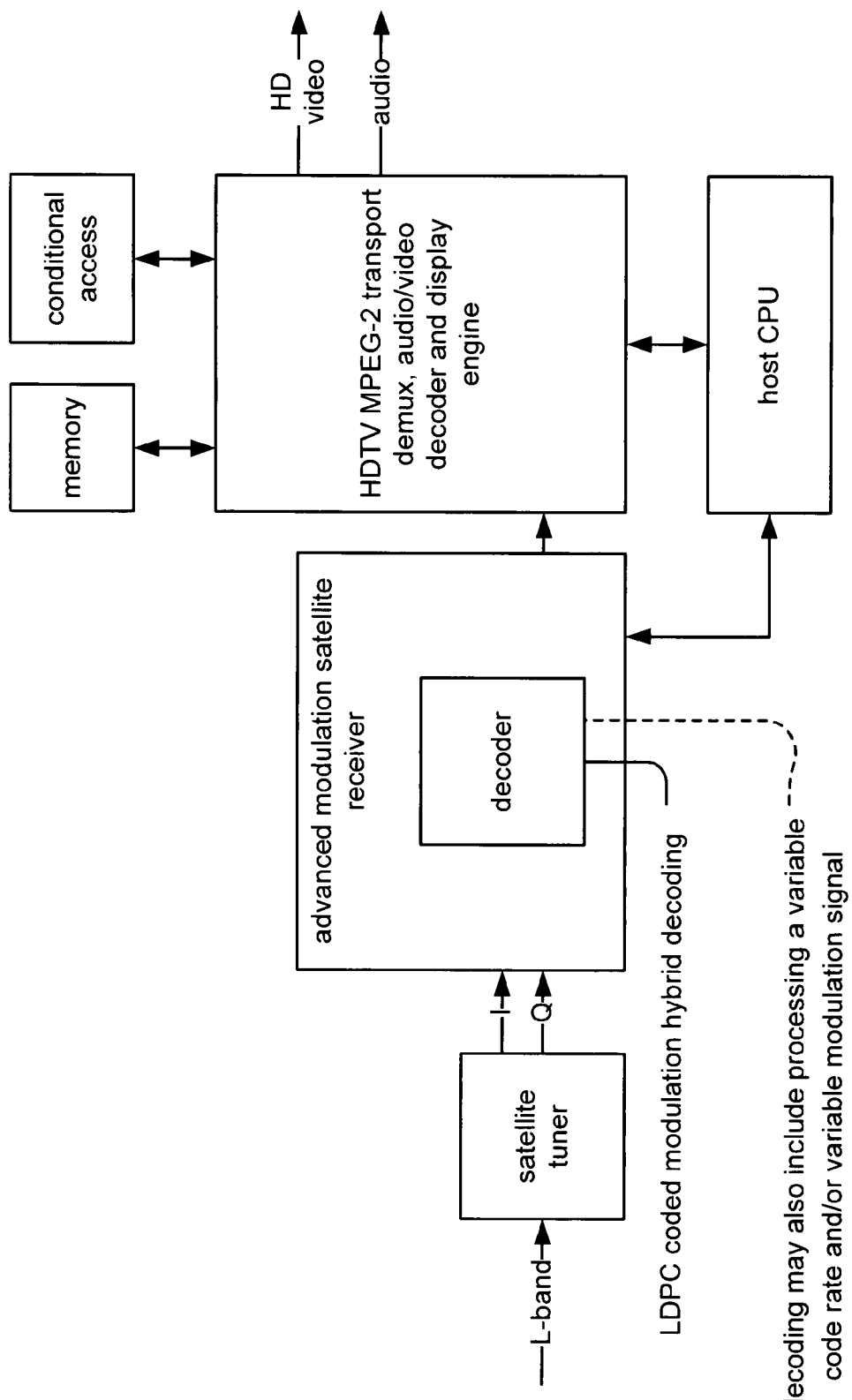
FIG. 15 is a system diagram illustrating an embodiment of a satellite receiver STB (Set Top Box) system that is built according to the invention.

FIG. 15 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band (e.g., within the frequency range between 390-1550 MHz (Mega-Hertz) in the ultrahigh radio frequency range). The satellite tuner extracts I, Q (in-phase and quadrature) components from a signal received from the L-band and provides them to the advanced modulation satellite receiver. The advanced modulation satellite receiver includes a decoder.

As within other embodiments that employ a decoder, the decoder may be implemented to perform decoding of LDPC coded signals. This LDPC decoding may be implemented to perform hybrid decoding within the iterative decoding processing. In addition, this LDPC decoding may also be implemented to accommodate decoding processing of an LDPC coded signal whose code rate and/or modulation (constellation and mapping) may vary as frequently as on a symbol by symbol basis.

The advanced modulation satellite receiver may be implemented to communicatively couple to an HDTV MPEG-2 (Motion Picture Expert Group, level 2) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that performs decoding of LDPC coded signals via hybrid decoding according to the invention. The advanced modulation satellite receiver is operable to receive communication provided to it from a transmitter device that includes an encoder as well.

In addition, several of the following Figures describe particular embodiments that may be used to implement some of the various aspects of the LDPC hybrid decoding according to the invention. It is also noted that the various aspects of LDPC hybrid decoding described herein may also be extended to perform decoding of LDPC coded signals whose code rate and/or modulation (constellation and mapping) may vary as frequently as on a symbol by symbol basis. Several details of these various aspects are provided below.

Figure 16:
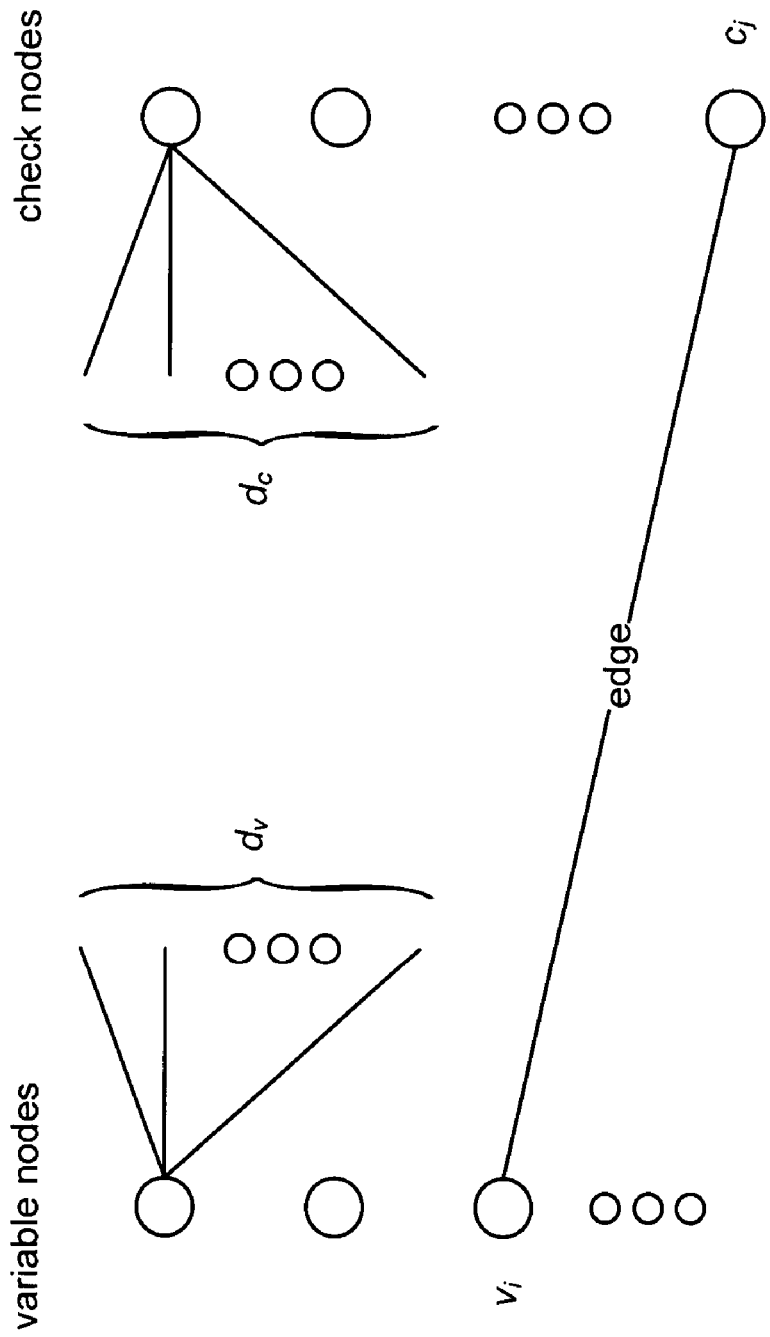
FIG. 16 is a diagram illustrating an embodiment of an LDPC (Low Density Parity Check) code bipartite graph.

FIG. 16 is a diagram illustrating an embodiment of an LDPC (Low Density Parity Check) code bipartite graph. An LDPC code may be viewed as being a code having a binary parity check matrix such that nearly all of the elements of the matrix have values of zeros. For example, $H=(h_{i,j})_{M \times N}$ may be viewed as being a parity check matrix of an LDPC code with block length N. If every column of the matrix has $d_v$ 1's, and every row of the matrix has $d_c$ 1's, then this code is referred to as a $(d_v, d_c)$ regular LDPC code. For example, a regular (4,72) LDPC code would be viewed as being a code whose binary parity check matrix would have 4 1's in every column and 72 1's in every row. These regular LDPC codes were introduced in R. Gallager, *Low-Density Parity-Check Codes*, Cambridge, Mass.: MIT Press, 1963.

A regular LDPC code can be represented as a bipartite graph by its parity check matrix with left side nodes representing variable of the code bits, and the right side nodes representing check equations. The bipartite graph of the code defined by H may be defined by N variable nodes and M check nodes. Every variable node of the N variable nodes has exactly $d_v$ edges connecting this node to one or more of the check nodes (within the check M nodes). This number of $d_v$ edges may be referred to as the degree of a variable node. Analogously, every check node of the M check nodes has exactly $d_c$ edges connecting this node to one or more of the variable nodes. This number of $d_c$ edges may be referred to as the degree of a check node.

An edge between a variable node $v_i$ and check node $c_j$ may be defined by $e=(i, j)$. However, on the other hand, given an edge $e=(i, j)$, the nodes of the edge may alternatively be denoted as by $e=(v(e),c(e))$. Given a variable node $v_i$, one may define the set of edges emitting from the node $v_i$ by $E_v(i)=\{e|v(e)=i\}$. Given a check node $c_j$, one may define the set of edges emitting from the node $c_j$ by $E_c(j)=\{e|c(e)=j\}$. Continuing on, the derivative result will be $|E_v(i)|=d_v$ and $|E_c(j)|=d_c$.

An irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby, M. Mitzenmacher, M. A. Shokrollahi, D. A. Spielman, and V. Stemann, "Practical Loss-Resilient Codes," *Proc. 29th Symp. on Theory of Computing*, 1997, pp. 150-159.

In general, with a graph of an LDPC code, the parameters of an LDPC code can be defined by a degree of distribution, as described within M. Lugy, et al. (referenced above) and also within T. J. Richardson and R. L. Urbanke, "The capacity of low-density parity-check code under message-passing decoding," *IEEE Trans. Inform. Theory*, Vol. 47, pp. 599-618, February 2001. This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

From certain perspectives, the invention may be implemented within communication systems that involve combining modulation coding with LDPC coding to generate LDPC coded signals. These LDPC coded signals may be such that they have a code rate and/or modulation (constellation and mapping) that varies as frequently as on a symbol by symbol basis. Up to now, there have been some attempts to combine modulation encoding with LDPC coding, yet they are all limited to employing only a single code rate or modulation (constellation and mapping) symbols generated thereby. Nevertheless, some of the possible approaches to combine modulation coding and LDPC coding are described below.

FIG. 17A is a diagram illustrating an embodiment of direct combining of LDPC (Low Density Parity Check) coding and modulation encoding. A binary sequence (e.g., a bit stream) is provided to an LDPC (Low Density Parity Check) encoder. The LDPC encoder introduces a degree of redundancy (or parity) within the bit sequence provided thereto. These LDPC coded bits are then provided to a S/P (Serial to Parallel) path such that the output symbols may be provided to a modulation encoder. This S/P path performs the bit to m-bit symbol transformation. The modulation encoder outputs a signal sequence that includes symbols (composed of LDPC coded bits) that correspond to a modulation having a constellation and a mapping.

FIG. 17B is a diagram illustrating an embodiment of BICM (Bit Interleaved Coded Modulation) that is employed in conjunction with LDPC (Low Density Parity Check) coding and modulation encoding. This embodiment is similar to the embodiment described above that performs direct combining of LDPC coding and modulation encoding, with the exception that an interleaver is interposed between the LDPC encoder and the modulation encoder.

A binary sequence (e.g., a bit stream) is provided to an LDPC encoder. The LDPC encoder introduces a degree of redundancy (or parity) within the bit sequence provided thereto. These LDPC coded bits are then provided to an interleaver to generate a degree of randomness within the LDPC coded bits thereby (hopefully) making that LDPC coded bit sequence to be more robust to interference, noise, and other deleterious effects. This LDPC coded bit sequence that has been interleaved is then provided to a S/P (Serial to Parallel) path such that the output symbols may be provided to a modulation encoder. Again, this S/P path performs the bit to m-bit symbol transformation. The modulation encoder outputs a signal sequence that includes symbols (composed of the interleaved LDPC coded bits) that correspond to a modulation having a constellation and a mapping.

FIG. 17C is a diagram illustrating an embodiment of multilevel coded modulation encoding. Rather than require a S/P (Serial to Parallel) path between a single LDPC encoder and a modulation encoder, this embodiment shows a plurality of LDPC encoders operating in parallel such that the outputs of each of the LDPC encoder is already within parallel format (thereby obviating the need for the S/P (Serial to Parallel) path employed within the embodiments described above). The outputs of these LDPC encoders are provided to a modulation encoder. The modulation encoder outputs a signal sequence that includes symbols (composed of the LDPC coded bits provided by the various LDPC encoders) that correspond to a modulation having a constellation and a mapping.

All 3 of these embodiments, described above that perform the combination of LDPC coding and modulation encoding, typically operate using a single code rate and also use a single modulation (constellation and mapping) to map the binary bits to a given constellation. That is to say, they all typically employ a single code rate and a single modulation (having a single constellation type and a single mapping) for that single constellation. This approach inherently limits the maximal performance that may be achieved using these approaches. In contradistinction, the invention is operable to operate on LDPC coded signals having a code rate and/or a modulation (constellation and mapping) that may vary as frequently as on a symbol by symbol basis. To illustrate further the single modulation approach of these 3 embodiments, a specific implementation that performs such a single mapping is described below.

Figure 18:
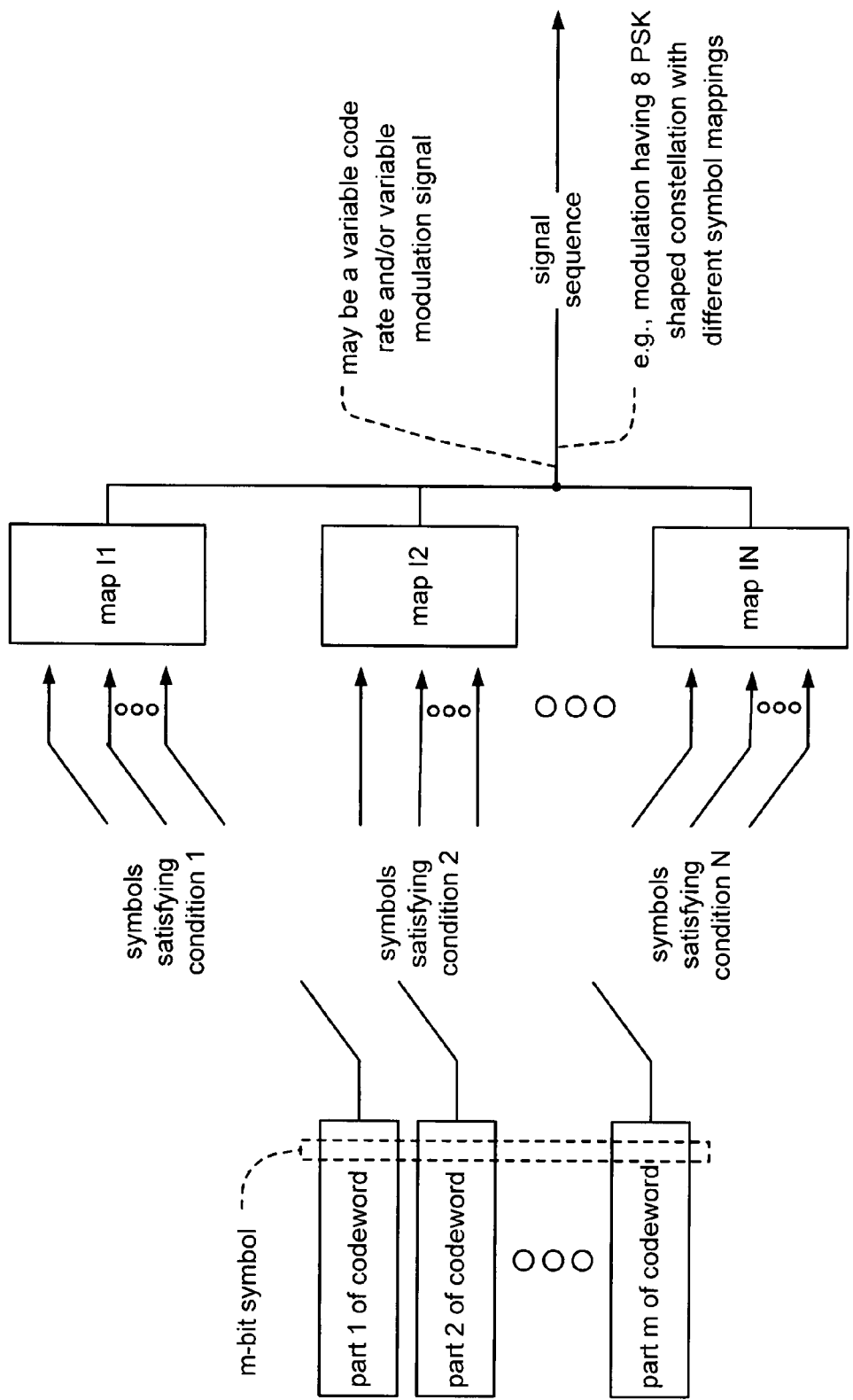
FIG. 18 is a diagram illustrating an embodiment of a variable signal mapping LDPC (Low Density Parity Check) coded modulation system that is built in accordance with invention.

FIG. 18 is a diagram illustrating an embodiment of a variable signal mapping LDPC (Low Density Parity Check) coded modulation system that is built in accordance with invention. This embodiment shows how a general implementation may be made for mapping an LDPC block coded modulation signal thereby generating LDPC coded signals having a modulation (constellation and mapping) that may vary as frequently as on a symbol by symbol basis.

In general, for any modulation, one can select as many as possible constellations and corresponding mappings, to construct an LDPC coded signal having a modulation (constellation and mapping) that may vary as frequently as on a symbol by symbol basis. This diagram illustrates a possible implementation for an m-bit constellation modulation. Moreover, it is also noted that the code can be any one of a variety of block codes.

In a very general illustration, a plurality of different encoders is employed. A first encoder employs a part 1 of a codeword, a second encoder employs a part 2 of a codeword, . . . , and a final encoder (of the plurality of encoders) employs a part m of a codeword. Those symbols that satisfy a condition 1 are provided to a map I1. Similarly, those symbols that satisfy a condition 2 are provided to a map I2, and those symbols that satisfy a condition N are provided to a map IN. The various conditions employed to govern the direction of which mapping to which the symbols are provided may be selected by a designer implementing the invention.

The signal sequence generated by this embodiment, or any of the other embodiments for which the decoding approaches of the invention may operate, may be a variable code rate and/or a variable modulation signal. For example, the code rate of the symbols of the signal sequence may vary as frequently as on a symbol by symbol basis. A first symbol may be encoded according to a first code rate, and a second symbol may be encoded according to a second code rate.

In addition, the modulation of the symbols of the signal sequence may vary as frequently as on a symbol by symbol basis. More specifically, for the variable modulation type signal, either one or both of the constellation or mapping of the symbols of the signal sequence may vary as frequently as on a symbol by symbol basis. As yet another example, multiple symbols of the signal sequence may all be mapped to a similarly shaped constellation, yet various symbols may also have different mappings to the same constellation. As one specific example, two symbols may each be associated with an 8 PSK (8 Phase Shift Key) shaped constellation, yet each of the symbols may be mapped differently within that 8 PSK shaped constellation. Clearly, other types of modulations may also be employed without departing from the scope and spirit of the invention.

Figure 19:
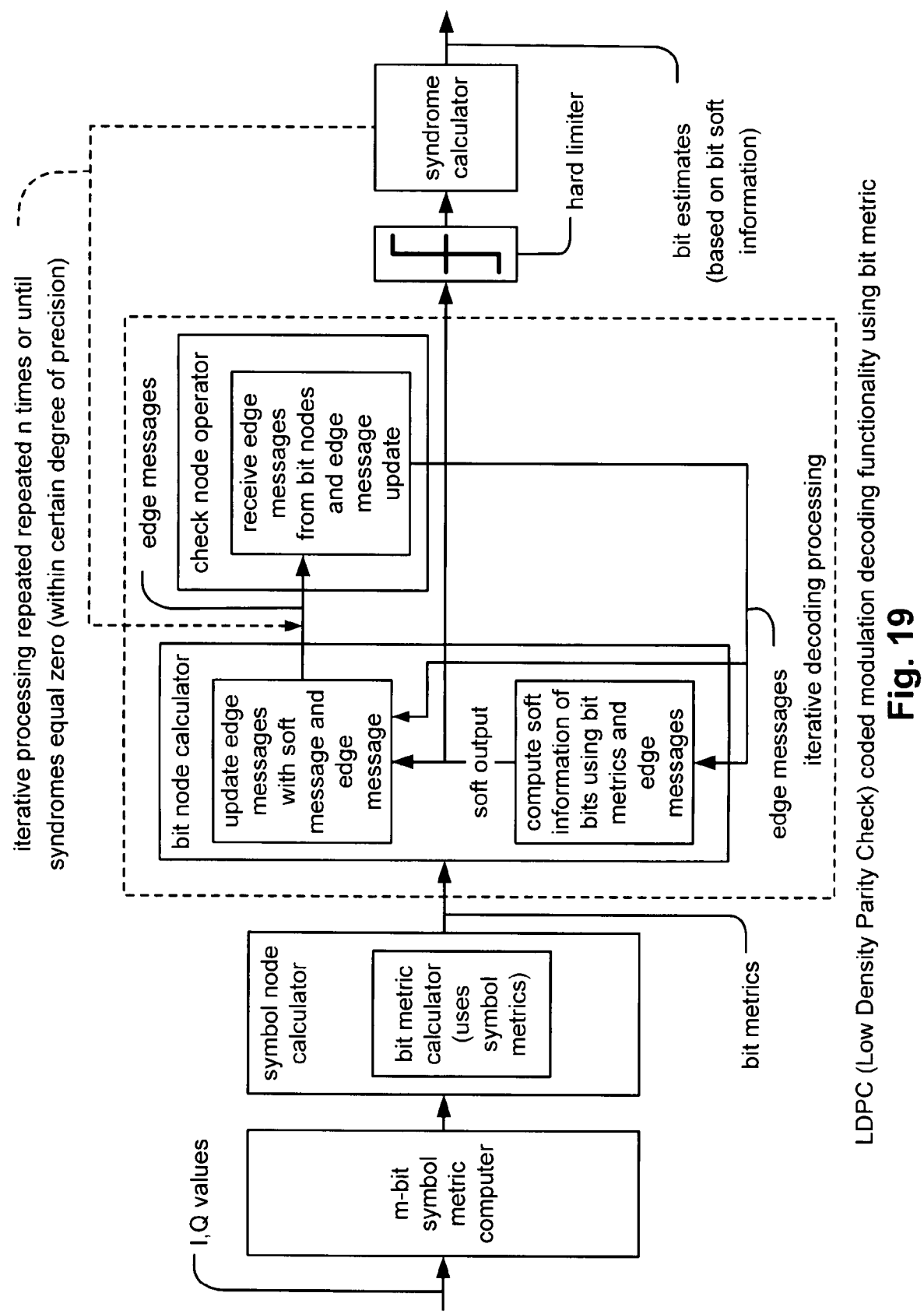
FIG. 19 is a diagram illustrating an embodiment of LDPC (Low Density Parity Check) coded modulation decoding functionality using bit metric according to the invention.

FIG. 19 is a diagram illustrating an embodiment of LDPC (Low Density Parity Check) coded modulation decoding functionality using bit metric according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 20:
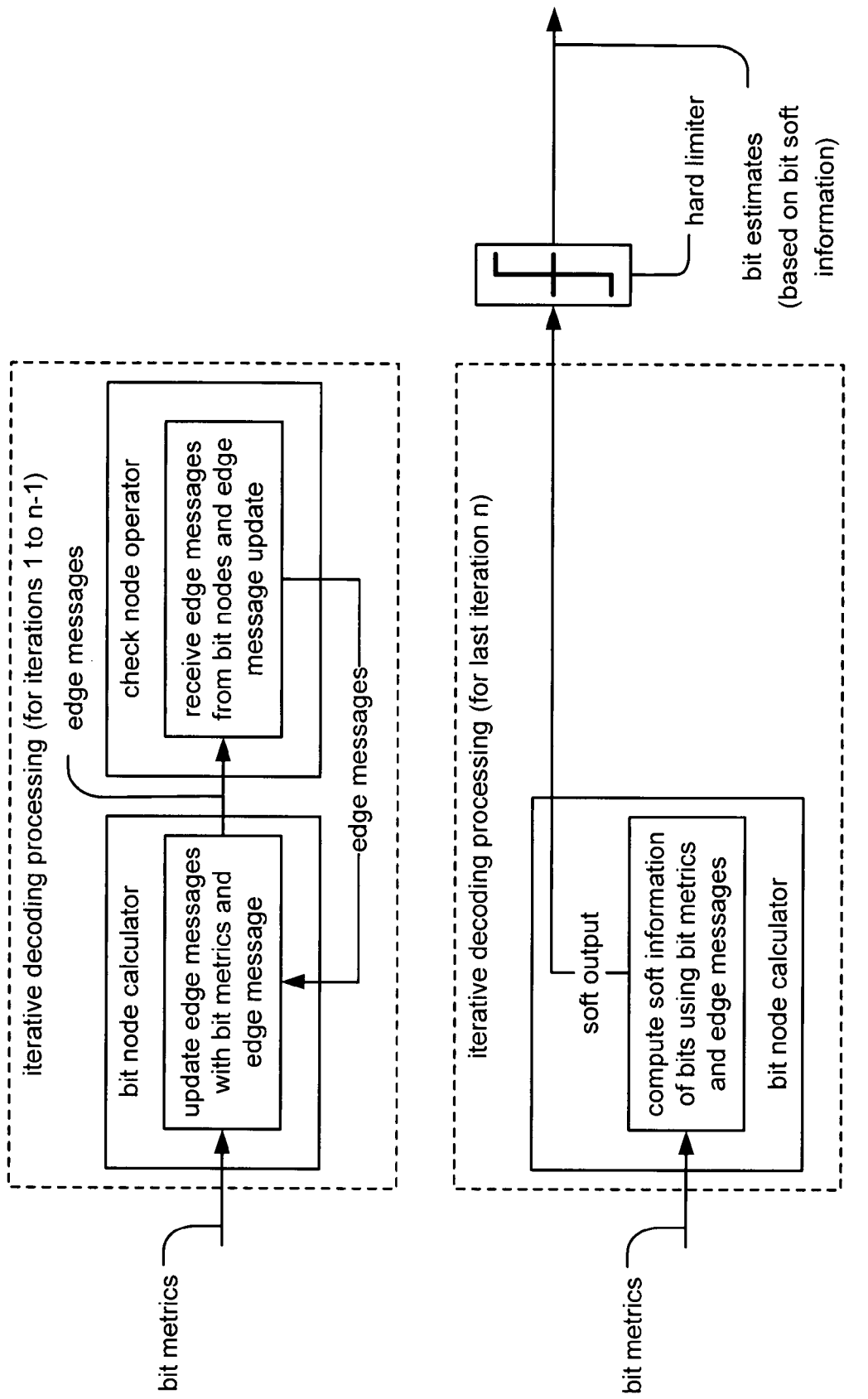
FIG. 20 is a diagram illustrating an alternative embodiment of LDPC coded modulation decoding functionality using bit metric according to the invention (when performing n number of iterations).

FIG. 20 is a diagram illustrating an alternative embodiment of LDPC coded modulation decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 21:
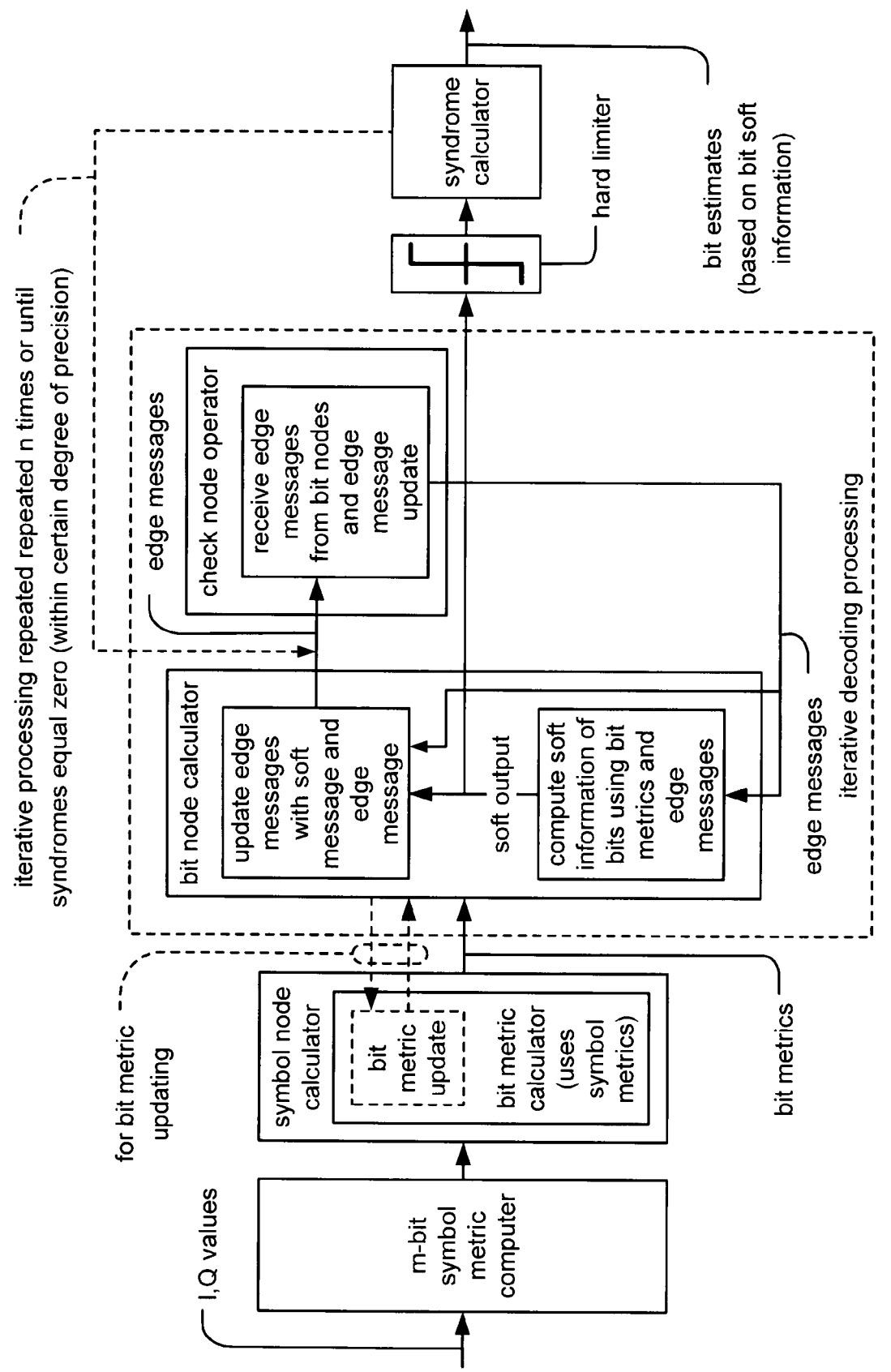
FIG. 21 is a diagram illustrating an alternative embodiment of LDPC (Low Density Parity Check) coded modulation decoding functionality using bit metric (with bit metric updating) according to the invention.

FIG. 21 is a diagram illustrating an alternative embodiment of LDPC (Low Density Parity Check) coded modulation decoding functionality using bit metric (with bit metric updating) according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. This updating of the edge messages may be performed using the updated bit metrics during subsequent iterations. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. At the same time, as the just calculated soft information of the bits (shown as the soft message) has been calculated, this information may be passed back to the symbol nodes (e.g., to the symbol node calculator functional block) for updating of the bit metrics employed within subsequent decoding iterations. The iterative processing continues between the bit nodes and the check nodes according to the LDPC code bipartite graph that was employed to encode the signal that is being decoded (by also employing the updated bit metrics during subsequent decoding iterations).

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When they are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 22:
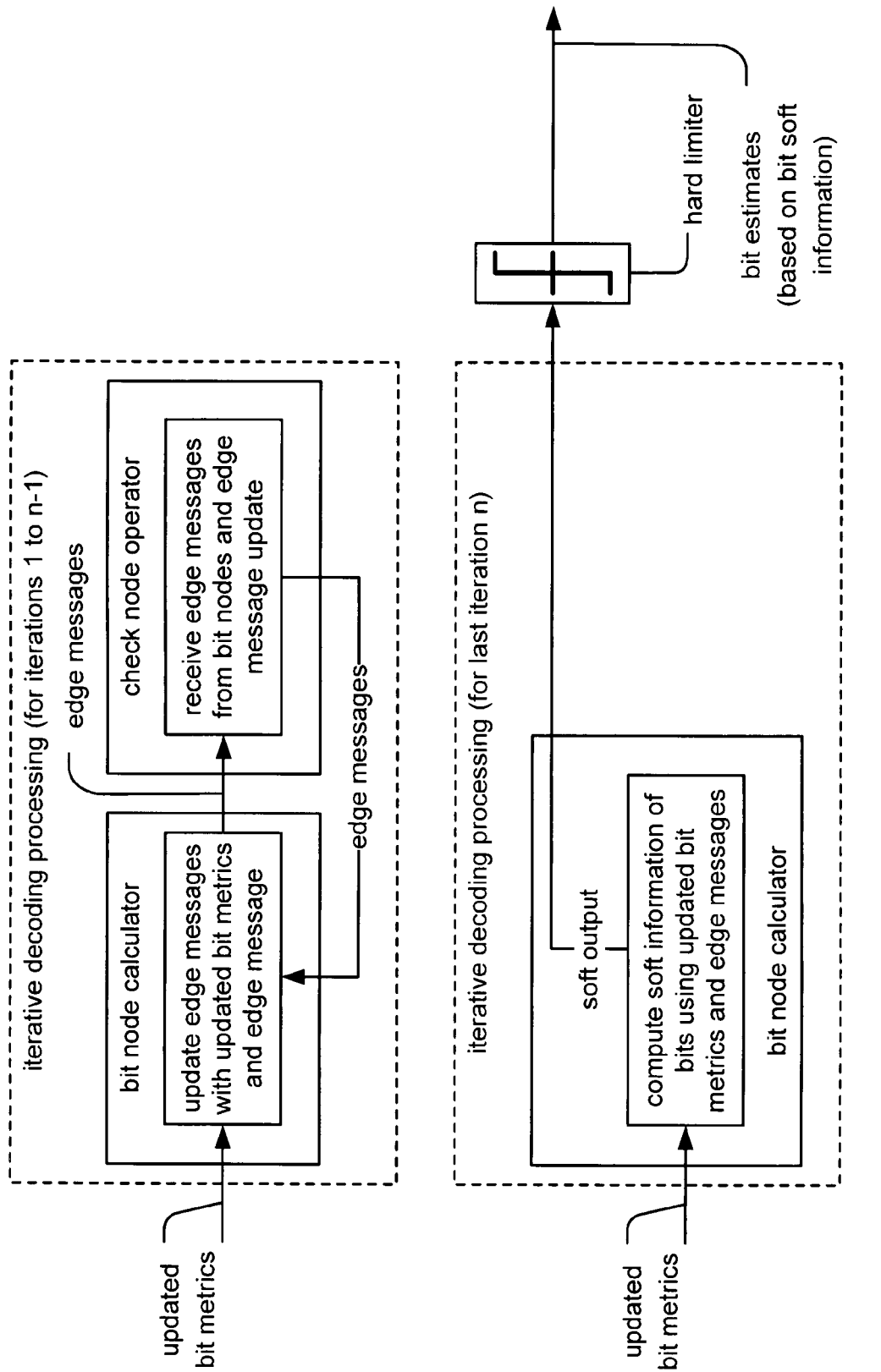
FIG. 22 is a diagram illustrating an alternative embodiment of LDPC coded modulation decoding functionality using bit metric (with bit metric updating) according to the invention (when performing n number of iterations).

FIG. 22 is a diagram illustrating an alternative embodiment of LDPC coded modulation decoding functionality using bit metric (with bit metric updating) according to the invention (when performing n number of iterations). This embodiment shows how the iterative decoding processing may be performed when a predetermined number of decoding iterations, shown as n, is performed (again, when employing bit metric updating). If the number of decoding iterations is known beforehand, as in a predetermined number of decoding iterations embodiment, then the bit node calculator functional block may perform the updating of its corresponding edge messages using the bit metrics/updated bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

FIG. 23A is a diagram illustrating bit decoding using bit metric (shown with respect to an LDPC (Low Density Parity Check) code bipartite graph) according to the invention. Generally speaking, after receiving I, Q values of a signal at a symbol nodes, the m-bit symbol metrics are computed. Then, at the symbol nodes, the symbol metric is used to calculate the bit metric. The bit metric is then passed to the bit nodes connected to the symbol nodes. At the bit nodes, the soft messages of the bits are computed, and they are used to update the edge message sent from the check nodes with the bit metric. These edge messages are then passed to the check nodes. At the check nodes, updating of the edge messages sent from the bit nodes is performed, and these values are pass back the bit nodes.

As also described above with respect to the corresponding functionality embodiment, after all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

FIG. 23B is a diagram illustrating bit decoding using bit metric updating (shown with respect to an LDPC (Low Density Parity Check) code bipartite graph) according to the invention. With respect to this LDPC code bipartite graph that performs bit metric updating, the decoding processing may be performed as follows:

After receiving the I, Q value of the signal at the symbol nodes, the m-bit symbol metrics are computed. Then, at the symbol nodes, the symbol metrics are used to calculate the bit metrics. These values are then passed to the bit nodes connected to the symbol nodes. At the bit nodes, the edge message sent from the check nodes are updated with the bit metrics, and these edge messages are passed to the check nodes. In addition, at the same time the soft bit information is updated and passed back to the symbol nodes. At the symbol nodes, the bit metrics are updated with the soft bit information sent from the bit nodes, and these values are passed back to the variable nodes. At the check nodes, the edge information sent from the bit nodes is updated, and this information is passed back to the bit nodes.

As also described above with respect to the corresponding functionality embodiment, after all of these iterative decoding processing steps have been performed, then the best estimates of the bits are output based on the bit soft information. Again, it is shown in this embodiment that the bit metric values are not fixed; they are updated for use within subsequent decoding iterations. This is again in contradistinction to the embodiment described above where the bit metric values that are calculated only once and remain fixed values for all of the decoding iterations.

Figure 24B:
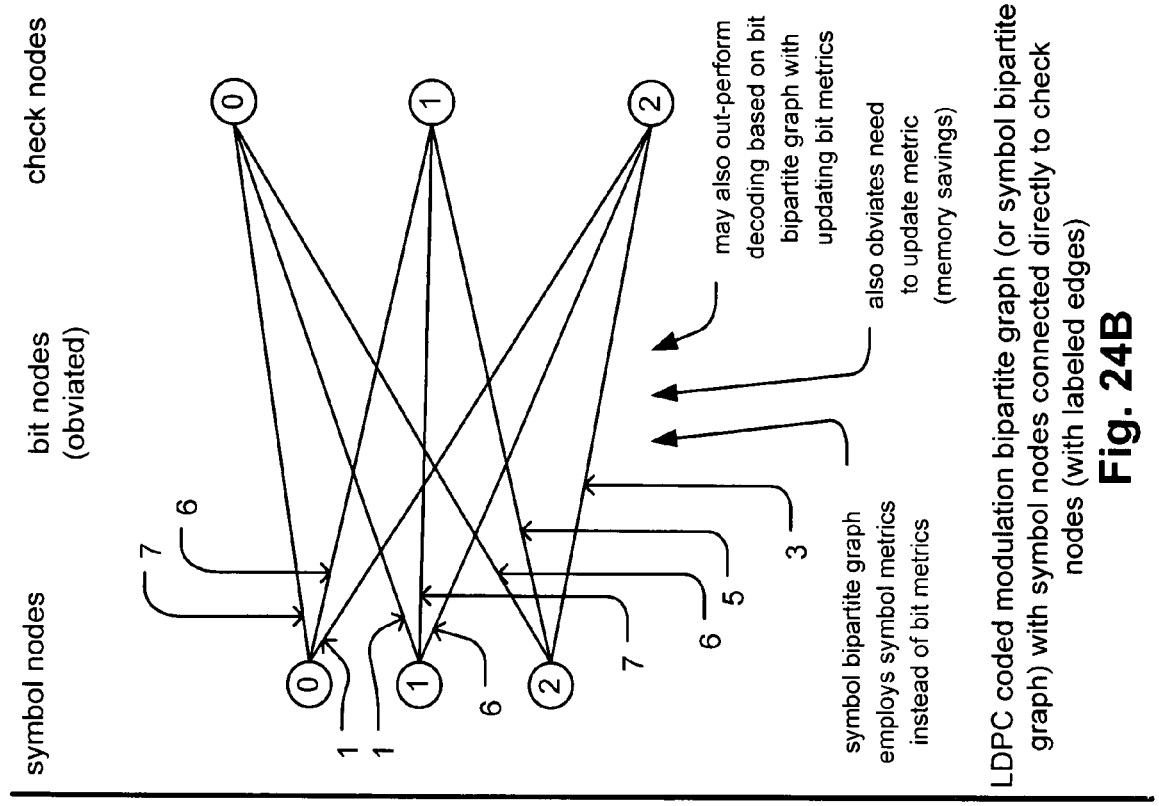
FIG. 24B is a diagram illustrating an LDPC (Low Density Parity Check) coded modulation bipartite graph (or symbol bipartite graph) with symbol nodes connected directly to check nodes according to the invention (this bipartite graph is generated from the tripartite graph shown in FIG. 24A).
Figure 24A:
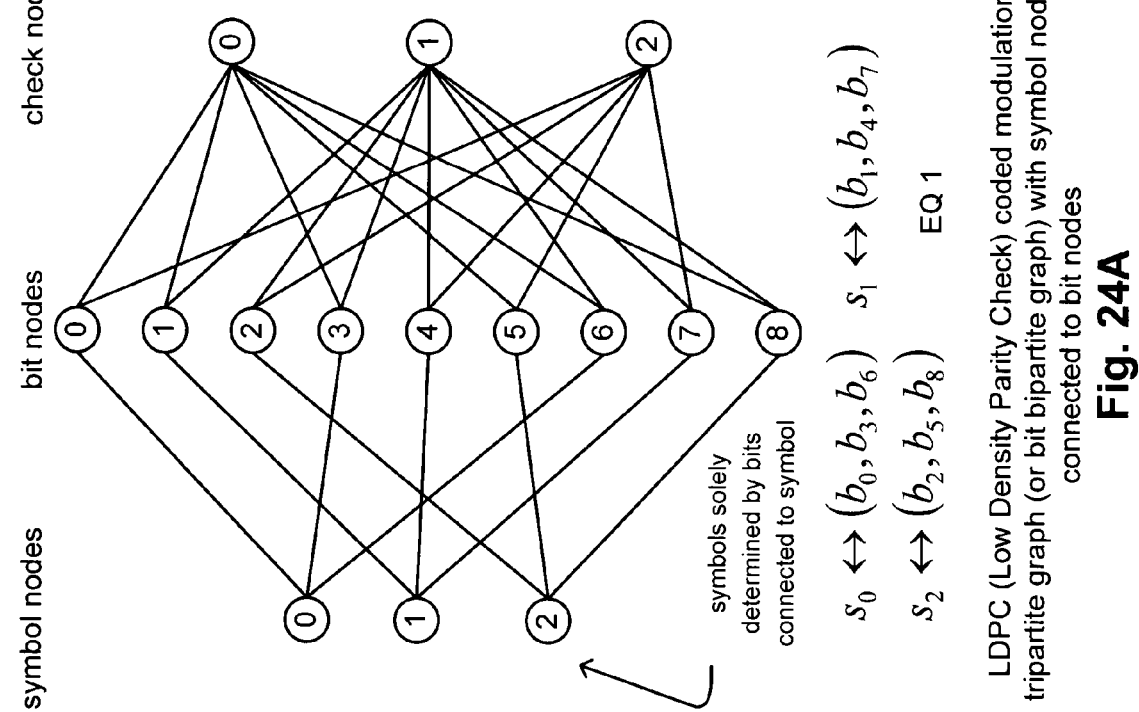
FIG. 24A is a diagram illustrating an LDPC (Low Density Parity Check) coded modulation tripartite graph with symbol nodes connected to bit nodes according to the invention.

FIG. 24A is a diagram illustrating an LDPC (Low Density Parity Check) coded modulation tripartite graph with symbol nodes connected to bit nodes according to the invention. In this embodiment, it can be seen that the bit nodes are connected to the symbol nodes. The appropriately corresponding bit nodes are also connected to the check nodes according to the LDPC code being employed. However, it is noted that the symbols to be decoded are solely determined by the bits connected to the corresponding symbol. This property is capitalized upon such that the bit nodes may be removed from the LDPC tripartite graph, so that the symbol nodes may be directly connected to the check nodes thereby generating an LDPC coded modulation bipartite graph.

As one example, 3 symbol nodes, $s_0, s_1, s_2$, are connected to the 9 bit nodes, $b_0, b_1, b_2, \ldots, b_8$, according to the following mapping:

$$s_0 \leftrightarrow (b_0, b_3, b_6)$$

$$s_1 \leftrightarrow (b_1, b_4, b_7)$$

$$s_2 \leftrightarrow (b_2, b_5, b_8) \quad \text{(EQ 1)}$$

The connections between the 9 bit nodes, $b_0, b_1, b_2, \ldots, b_8$, and the 3 check nodes, $c_0, c_1, c_2$, are made according to the following mapping:

$$b_0 \leftrightarrow (c_0, c_2)$$

$$b_1 \leftrightarrow (c_0, c_1)$$

$$b_2 \leftrightarrow (c_1, c_2)$$

$$b_3 \leftrightarrow (c_0, c_1)$$

$$b_4 \leftrightarrow (c_1, c_2)$$

$$b_5 \leftrightarrow (c_0, c_2)$$

$$b_6 \leftrightarrow (c_0, c_1)$$

$$b_7 \leftrightarrow (c_1, c_1)$$

$$b_8 \leftrightarrow (c_0, c_1)$$

FIG. 24B is a diagram illustrating an LDPC (Low Density Parity Check) coded modulation bipartite graph (or symbol bipartite graph) with symbol nodes connected directly to check nodes according to the invention (this bipartite graph is generated from the tripartite graph shown in FIG. 24A). One aspect of the invention is the ability to reduce the number of nodes within an LDPC bipartite graph by directly connecting the symbols nodes to the check nodes (e.g., by modifying an LDPC coded modulation tripartite graph to generate an LDPC coded modulation bipartite graph). However, this must be performed very carefully to ensure proper decoding of such LDPC coded signals. As is described herein, the labeling of the edges connected the symbols nodes to the check nodes needs to be done carefully to ensure proper decoding of symbols.

Within this LDPC code bipartite graph, the edges are only connected between the symbol nodes and the check nodes. In doing so, every edge connecting the symbol nodes and the check nodes is labeled by a value according to EQ 1 shown above. In some embodiments, these edges are labeled using octal values.

For example, using an octal labeling approach, the edge connecting the symbol node $s_0$ to the check node $c_0$, depicted as $(s_0, c_0)$, is labeled as 7 since all three bits $b_0, b_3, b_6$ are connected to $c_0$ (e.g., labeled as 7 because $b_0, b_3, b_6 = 111$). Similarly, the edge connecting the symbol node $s_0$ to the check node $c_1$, depicted as $(s_0, c_1)$, is labeled as 6 since only the two bits $b_0, b_3$ are connected to $c_1$ (e.g., labeled as 6 because $b_0, b_3, b_6 = 110$). As another example, , the edge connecting the symbol node $s_0$ to the check node $c_2$, depicted as $(s_0, c_2)$, is labeled as 1 since only the one bit $b_0$ is connected to $c_2$ (e.g., labeled as 1 because $b_0, b_3, b_6 = 100$). The additional edges that communicatively couple the symbols nodes to the check nodes may also be labeled according to this convention.

One of the advantages of the symbol node to check node LDPC code bipartite graph is that a decoder may use symbol metrics when performing the decoding processing of the LDPC coded symbols instead of bit metrics. In this way of performing the decoding processing, there is therefore no need to perform metric updating; the metric updating within the decoding processing may have the undesirable effect of requiring an increased amount of memory to be used. Moreover, the decoding based on the LDPC code bipartite graph (sometimes referred to as a symbol LDPC code bipartite graph) actually out-performs decoding processing that is based on an LDPC code tripartite graph (whose bit nodes are connected to check nodes). In addition, the LDPC symbol decoding provides comparable or better performance of LDPC bit decoding that involves updating of the bit metrics.

Figure 25A:
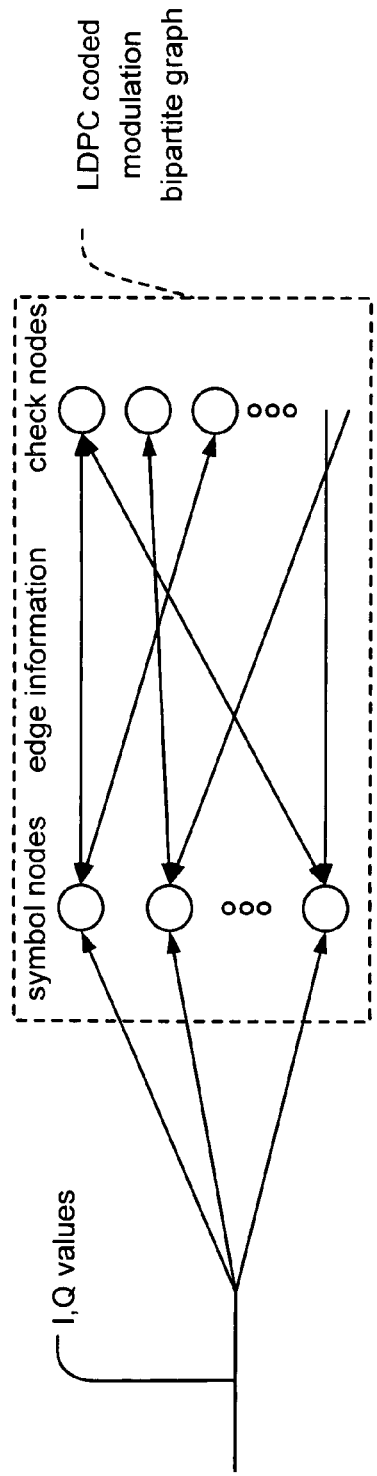
FIG. 25A is a diagram illustrating symbol decoding (shown with respect to an LDPC (Low Density Parity Check) coded modulation bipartite graph) according to the invention.

FIG. 25A is a diagram illustrating symbol decoding (shown with respect to an LDPC (Low Density Parity Check) coded modulation bipartite graph) according to the invention. The symbol decoding processing performed according to the invention may be performed using an LDPC coded modulation bipartite graph in which the symbol nodes are connected directly to the check nodes. In general, the I, Q values of a symbol are provided to the symbol nodes, and the iterative decoding processing is performed according to the manner in which the labeled edges communicatively couple the symbol nodes to the check nodes.

As an example of how the decoding processing may be performed using such an LDPC coded modulation bipartite graph, a rate 2/3 LDPC code with an 8 PSK (8 Phase Shift Key) modulation signal is decoded and explained in detail. This LDPC code may be a regular LDPC code or an irregular LDPC code without departing from the scope and spirit of the invention. The block length of the LDPC code is 3N and a 3 bit symbol $s_i$ is mapped (e.g., using a symbol mapper) according to the following notation:

$$s_i=(b_i,b_{N+i},b_{2N+i})$$

The parity check matrix of the LDPC code may be represented as $[h_{ij}]_{N \times 3N}$. The estimated symbols $r_i$ corresponding to the 3 bit symbol $s_i$ may be represented as $r_i=(r_{0i},r_{1i},r_{2i})$. The partial syndromes $S^m(i)$ and $S_m(i)$ (which may generally be referred to as syndromes, as they are up above in other embodiments) that are calculated using the estimated symbols and the parity check matrix of the LDPC code may be represented as follows:

$$S^m(i) = \sum_{j=0}^{m-1} (r_{0j}h_{ij} + r_{1j}h_{i(N+j)} + r_{2j}h_{i(2N+j)}) \quad (EQ\ 2)$$

$$S_m(i) = \sum_{j=m}^{N-1} (r_{0j}h_{ij} + r_{1j}h_{i(N+j)} + r_{2j}h_{i(2N+j)})$$

The following decoding processing description is described as being performed on a signal sequence Y. The probability of the signal sequence Y satisfying the partial syndrome, $p(S^j(i)=m|Y)$, to be equal to $A_{i,j}(m)$ is calculated (e.g., the probability of $p(S^j(i)=m|Y)=A_{i,j}(m)$). In addition, other probabilities are calculated; namely, the probability of the signal sequence Y satisfying the partial syndrome, $p(S_j(i)=m|Y)$, to be equal to $B_{i,j}(m)$ is calculated (e.g., the probability of $p(S_j(i)=m|Y)=B_{i,j}(m)$). These probabilities are all calculated based on the following conditions:

$A_{i,0}(0)=1$ $B_{i,deg(c_j)-1}(0)=1$, and $A_{i,0}(m)=0$ $B_{i,deg(c_j)-1}(m)=0$, where m≠0.

Since the decoding may be performed in the logarithmic domain thereby enabling multiplication operations to be performed using addition and division operations to be performed using subtraction, these variables may be redefined within the logarithmic domain as follows:

$\alpha_{i,j}(m)=\log(A_{i,j}(m))$ $\beta_{i,j}(m)=\log(B_{i,j}(m))$.

These values may be referred to as the alphas, or forward metrics, ($\alpha_{i,j}(m)$) and betas, or backward metrics, ($\beta_{i,j}(m)$) to be employed within the decoding processing.

The edge messages being passed from the check nodes to the symbol nodes may be represented as Medge[i][j][k], where i runs according to the appropriately labeled edges within the LDPC coded modulation bipartite graph.

As some examples:
1. if the label is 7, then k runs from 0 to 7,
2. if the label is 3, 5, or 6, then k runs from 0 to 3, and
3. if the label is 1, 2, or 6, then k runs between 0 to 1.

In addition, a new function x(v) that varies from $\{0, \ldots, 7\}$ to $\{0,1\}$ may be employed. The value v may be viewed as being an integer represented in octal. Then, the value of v may be represented as $v=(v_0,v_1,v_2)$. This new function x(v) may be represented as follows:

$$x(v)=v_0 \oplus v_1 \oplus v_2 \quad (EQ3)$$

where $\oplus$ is an exclusive-or function (e.g., binary addition).

The notation and definitions provided above are also employed to describe the symbol decoding processing in other embodiments whose decoding processing and/or functionality are described in more detail below. More specifically, the embodiments described in more detail below show how the check node updating and symbol sequence estimation, as well as symbol node updating, is performed using these various values.

Figure 25B:
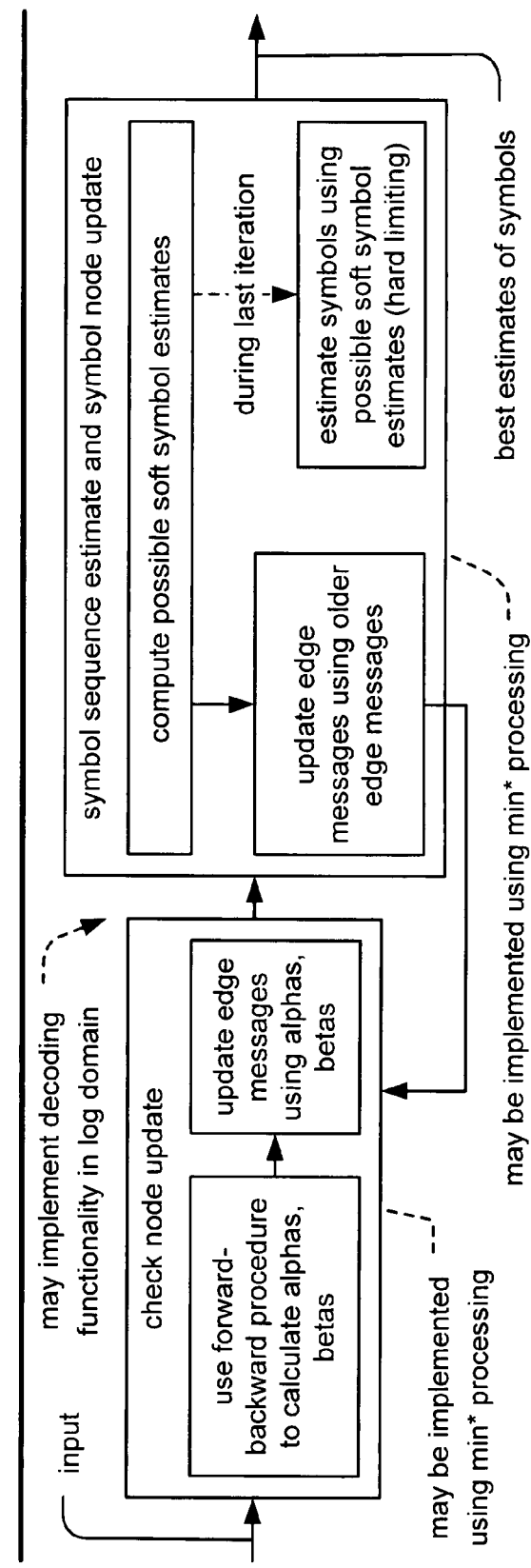
FIG. 25B is a diagram illustrating an embodiment of symbol decoding functionality (supported with an LDPC (Low Density Parity Check) coded modulation bipartite graph) according to the invention.

FIG. 25B is a diagram illustrating an embodiment of symbol decoding functionality (supported with an LDPC (Low Density Parity Check) coded modulation bipartite graph) according to the invention. This embodiment shows in more detail how the check node updating and symbol sequence estimation, as well as symbol node updating, is performed.

The decoding processing described in this embodiment may be better understood in the context of the check node updating and symbol sequence estimation, including the symbol node updating, that may be performed within in at least 2 different embodiments that are described herein in accordance with the invention: (1) symbol decoding and (2) hybrid decoding (that performs a combination of bit level and symbol level decoding). One possible embodiment of symbol decoding is described in this diagram (FIG. 25B), and various possible embodiments by which hybrid decoding may be implemented are described below with respect to the remaining diagrams of this disclosure.

Beginning from the left hand side of the diagram, input information corresponding to the calculated partial syndromes, that also includes the initial values of the alphas ($\alpha_{i,j}(m)$) and the betas ($\beta_{i,j}(m)$) (e.g., forward and backward metrics), are provided to a check node update functional block. Iterative decoding processing is performed within the check node update functional block over the total number of check nodes. For example, M iterations are performs over i (where i varies from 0 to M−1, and where M is the total number of check nodes of the LDPC bipartite graph).

In doing this iterative decoding processing, the check node updating initially involves calculating the values of the alphas ($\alpha_{i,j}(m)$) and the betas ($\beta_{i,j}(m)$) (beyond merely the initial values that are provided during the initial iteration) for each of the symbols of a received symbol block. This iterative decoding processing in calculating the alphas and betas may be performed using a forward-backward procedure through the received symbol block.

The calculation of the alphas and betas is described below.

For j=0 to deg($c_i$)−1 and m=0,1, the forward-backward processing procedure may be employed to calculate the alphas ($\alpha_{i,j}(m)$) and the betas ($\beta_{i,j}(m)$) as follows:

$$\alpha_{i,j}(m) = \min{}^*\{Medge[i][j-1][k] + \alpha_{i,j-1}(m \oplus x(k)) | \text{all possible } k\}$$

$$\beta_{i,j}(m) = \min{}^*\{Medge[i][j+1][k] + \beta_{i,j+1}(m \oplus x(k)) | \text{all possible } k\}$$

Now that these values of alpha and beta are available for each of the symbols within a received symbol block, the edge messages Medge[i][j][k] (that communicatively couple the symbol nodes to the check nodes) are updated using these calculated alphas and betas values.

For j=0 to deg($c_i$)−1 and all possible k, the updating of the edge messages Medge[i][j][k] may be performed as follows:

$$Medge[i][j][k] = \min{}^*\{\lfloor \alpha_{i,j}(0) + \beta_{i,j}(x(k)) \rfloor, \lfloor \alpha_{i,j}(1) + \beta_{i,j}(x(k) \oplus 1) \rfloor\}$$

The min* processing functionality described herein may be better understood by the following description. The min* processing includes determining a minimum value from among two values (e.g., shown as min(A,B) in min* processing) as well as determining a logarithmic correction factor (e.g., shown as $\ln(1+e^{-|A-B|})$ in min* processing) in selecting the smaller metric. In addition, it is also noted that max* processing may alternatively be performed in place of min* processing. The max* processing operation also includes a logarithmic correction in selecting the larger metric. It is noted that the various embodiments of the invention may be implemented using the max* operations in lieu of the min* operation when preferred in a given implementation.

The min* processing, when operating on inputs A and B, may be expressed as follows:

$$\min{}^*(A,B) = \min(A,B) - \ln(1+e^{-|A-B|})$$

Again, the min* processing may alternatively be performed using max* processing. The max* processing, when operating on inputs A and B, may be expressed as follows:

$$\max{}^*(A,B) = \max(A,B) + \ln(1+e^{-|A-B|})$$

Moreover, when multiple min* operations are to be performed on multiple values (e.g., more than 2), the min* processing may be expressed as follows:

$$\min{}^*(x_1, \ldots, x_N) = \min{}^*(\min{}^*(x_1, \ldots, x_{N-1}), x_N) \quad (EQ4)$$

After the check node processing has been completed, a symbol sequence estimate and symbol node update functional block operates using the check node update messages to continue the decoding processing.

Since the total number of edges is the same count from either side (e.g., from either the symbol node side or the check node side), the edges are intrinsically re-ordered according to the symbols that are being decoded. This re-ordering may be intrinsically performed using a LUT (Look-Up Table) to ensure the proper ordering of the check node updating. In other words, the LUT may be implemented to perform the function of which edge information to take when performing the symbol sequence estimate and symbol node update. In addition, this re-ordering functionality may be inherently implemented in hardware for proper ordering of the check node updating such that it corresponds to an order that is appropriate to the symbol node updating. For proper decoding of the symbols of the sequence (e.g., first symbol to last symbol), there needs to be some ordering of the symbols. However, this symbol ordering is not critical when performing the check node updating. That is to say, the ordering of the check node updating may then be performed according to any desired ordering, and to ensure proper decoding of the symbols according to the desired order (e.g., first symbol to last symbol), the check node updating is performed to ensure that the edge messages are inherently appropriately ordered according to the desired order for the decoding processing.

More specifically, this decoding processing may be understood with respect to the edge messages Medge[i][j][k], where i runs across all of the symbol nodes, where j runs according to the degree of the edges from the symbol nodes, and where k runs according to the labels of the LDPC bipartite graph.

This embodiment described with respect to this diagram is shown with respect to a code that includes 3 bit symbols, coded according to 8 PSK (8 Phase Shift Key) modulation. However, it is noted that such a decoding approach may also be adapted very easily to decoding signals having an even larger number of bits. For example, this decoding approach may be adapted to perform decoding of signals having symbols of higher order modulations including 16 QAM (16 Quadrature Amplitude Modulation), 16 APSK (16 Asymmetric Phase Shift Keying), 64 QAM, and even other modulation types without departing from the scope and spirit of the invention.

The label on the j-th edge from the check node i may be denoted as $L_{i,j}$. A new function, sh(L,v), may be defined and employed to assist in the decoding processing describer herein. This new function sh(L,v) may be defined as follows:

$$sh(L, (v_0, v_1, v_2)) = \begin{cases} v_2 & L = 1 \\ v_1 & L = 2 \\ (v_1, v_2) & L = 2 \\ v_0 & L = 4 \\ (v_0, v_2) & L = 5 \\ (v_0, v_1) & L = 6 \\ (v_0, v_1, v_2) & L = 7 \end{cases} \quad (EQ\ 5)$$

After the edge messages have been intrinsically and appropriately re-ordered using the approach described above, the symbol sequence estimate and symbol node update functional block continues to operate according to the following procedure.

For m=0, . . . ,7, the possible values for the soft symbol estimates are computed (e.g., the possible values for the soft information of the symbols is calculated) as follows:

$$p_i(m) = Metric_i[m] + \sum_{j=0}^{deg(s_i)-1}\left(\sum_{L,i,j} Medge[i][j][sh(L_{i,j}, m)]\right),$$

where Metric$_i$[m] is the appropriate symbol metric obtained from the received signal according to its appropriate modulation (constellation and mapping values).

The symbol sequence estimate and symbol node update functional block continues by estimating the symbols using the soft symbol estimates. More specifically, the estimate of the symbol $s_i$ to m is made such that $p_i(m)$ is the smallest value selected from among all of the possible values of $p_i(0), p_i(1), \ldots, p_i(7)$.

After the estimate of the symbols is made using the soft symbol estimates, the edge messages are updated within the symbol sequence estimate and symbol node update functional block using the older edge messages. More specifically, the edge message are updated as follows:

The processing may be better understood by considering the edge label $L_{i,j}$, 1. if $L_{i,j}=7$, then for $m=0, \ldots, 7$, Medge[i][j][k]=$p_i$[m]−Medge[i][j][m].

2. alternatively, if $L_{i,j}=3,5,6$, then for $m_0, m_1 \in \{0,1\}$, then the values of the edge messages may be defined as:

$$Medge[i][j][(m_0, m_1)] = \begin{cases} \min*(p_i(0, m_0, m_1), p_i(1, m_0, m_1)) - Medge[i][j][(m_0, m_1)] & L_{i,j} = 3 \\ \min*(p_i(m_0, 0, m_1), p_i(m_0, 1, m_1)) - Medge[i][j][(m_0, m_1)] & L_{i,j} = 5 \\ \min*(p_i(m_0, m_1, 0), p_i(m_0, m_1, 1)) - Medge[i][j][(m_0, m_1)] & L_{i,j} = 6 \end{cases}$$

3. alternatively, if $L_{i,j}=1,2,4$, then for $m=0,1$, then the values of the edge messages may be defined as:

$$Medge[i][j][(m)] = \begin{cases} \min^* \{p_i(k_0, k_1, m) | k_0, k_1 \in \{0, 1\}\} - Medge[i][j][m] & L_{i,j} = 1 \\ \min^* \{p_i(k_0, m, k_1) | k_0, k_1 \in \{0, 1\}\} - Medge[i][j][m] & L_{i,j} = 2 \\ \min^* \{p_i(m, k_0, k_1) | k_0, k_1 \in \{0, 1\}\} - Medge[i][j][m] & L_{i,j} = 4 \end{cases}$$

where the right hand side edge of these equations is the old edge message passed from the check node.

Continuing on with the iterative decoding processing, using the updated edge messages (that are updated either a predetermined number of times and/or until convergence of the edge messages has been met within a certain degree of precision), then the best estimates of the symbols of a received symbol block may be made.

Figure 26:
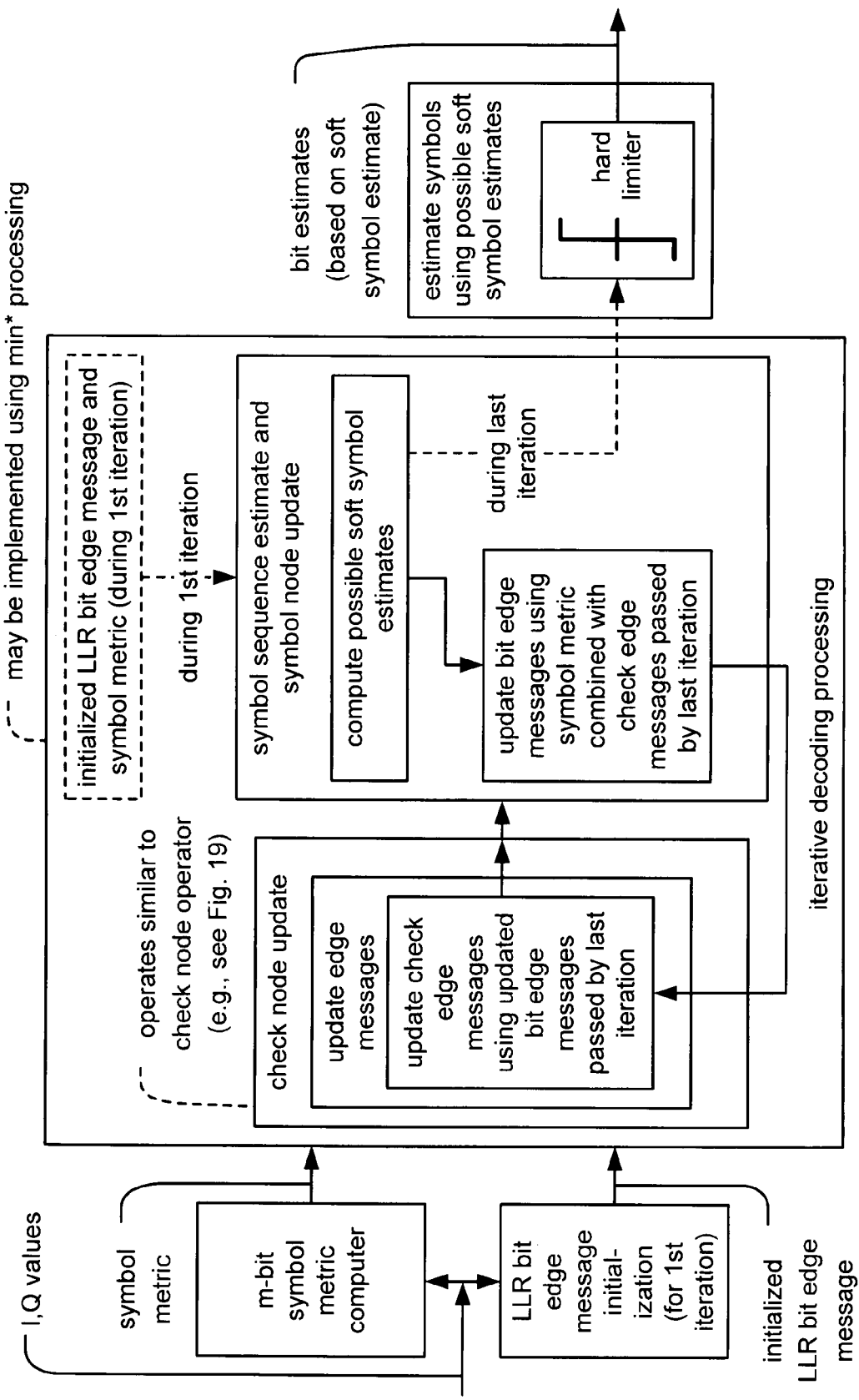
FIG. 26 is a diagram illustrating an embodiment of hybrid decoding functionality (having a reduced complexity when compared to symbol decoding) of LDPC (Low Density Parity Check) coded modulation signals according to the invention.

FIG. 26 is a diagram illustrating an embodiment of hybrid decoding functionality (having a reduced complexity when compared to symbol decoding) of LDPC (Low Density Parity Check) coded modulation signals according to the invention. This embodiment showing hybrid decoding processing may be viewed as being a modification (e.g., a departure) of the previous decoding processing approaches described up to now. In general, similar decoding functional blocks are employed within the iterative decoding processes as shown within the symbol decoding embodiments described above, but the manner in which these functional blocks operate is different; these differences provide for a less complex decoding approach, and (as is seen below with respect to comparing the performance of various decoding approaches) the hybrid decoding approach also provides for a significant improvement in performance (e.g., when compared to bit decoding only).

This hybrid decoding functionality begins by receiving the I, Q values of the received signal. Thereafter, an m-bit symbol metric computer functional block calculates the corresponding symbol metrics using the I, Q values. Also, a functional block performs the LLR (log likelihood ratio) bit edge message initialization for use in the first decoding iteration; this initialization need only be performed once. If desired, this initial LLR bit edge message may be initialized to a value of 0 for the initial iteration (e.g., iteration i=0). From these functional blocks, the symbol metric and the initialized LLR bit edge message are passed to an iterative decoding processing functional block that includes a check node update functional block and a symbol sequence estimate and symbol node update functional block. These initial conditions (or initial values) of the LLR bit edge message and the symbol metric are employed by the symbol sequence estimate and symbol node update functional block during a $1^{st}$ decoding iteration of the iterative decoding processing.

The check node update functional block operates in a relatively similar manner as the check node operator functional block that is described above with respect to the LDPC coded modulation decoding functionality using bit metric approach (e.g., see FIG. 19). In general, the check node update functional block performs updating of the edge messages received from a symbol sequence estimate and symbol node update functional block. This symbol sequence estimate and symbol node update functional block (of the hybrid decoding approach) differs from the symbol sequence estimate and symbol node update functional block (of the symbol decoding approach).

When performing the update of the edge messages within the check node update functional block, the check node update functional block updates the check edge messages using the updated bit edge messages passed by the last iteration. During a first decoding iteration, this may include using the initialized values of the bit edge message. However, during the iterative decoding processing, the check node update functional block passes the updated edge messages to the symbol sequence estimate and symbol node update functional block.

Again, it is noted that the symbol sequence estimate and symbol node update functional block uses the initial conditions of the LLR bit edge message during its first iteration of the iterative decoding processing. It also uses the initially received symbol metric value during subsequent iterations of the iterative decoding processing. The symbol sequence estimate and symbol node update functional block initially performs computation of the possible soft symbol estimates. Then, the symbol sequence estimate and symbol node update functional block uses this information to assist in the updating of the edge messages. More specifically, the symbol sequence estimate and symbol node update functional block updates the bit edge messages using the computed symbol metric (from the m-bit symbol metric computer) combined with the check edge messages passed by the last iteration from the check node update functional block. From one perspective, this shows the hybrid decoding functionality such that a combined use of bit level information and symbol level information are both used in a manner that (as is also described below) that provides a significant reduction in complexity and ease of implementation while providing performance that may be as good as the symbol decoding approach in some embodiments. In general, the performance of the hybrid decoding approach is as good as or worse than the symbol decoding approach; however, the hybrid decoding approach may be implemented significantly easier than the symbol decoding approach (e.g., with significantly reduced processing, memory, and memory management resources).

The iterative decoding processing continues between the symbol sequence estimate and symbol node update functional block and the check node update functional block such that the edge messages are continually, successively and alternatively updated in an effort to converge on a final value of the bit edge messages (either after performing a predetermined number of iterations or after a sufficient degree of accuracy is achieved). The updating is successive and alternative from the perspective that the symbol sequence estimate and symbol node update functional block performs an updating, and then the check node update functional block performs an updating, and then the iterative decoding processing continues.

During a last decoding iteration, the symbol sequence estimate and symbol node update functional block may be implemented to perform an estimate of the symbols using the possible soft symbol estimates that have been calculated. This soft symbol estimate is then output from the symbol sequence estimate and symbol node update functional block to a hard limiter where hard decisions may be made for the individual bits within the soft symbol estimate. This final output may be viewed as being the individual bit estimates of the bits within the symbol that is being decoded using the hybrid decoding approach. That is to say, the hard limiter makes bit estimates based on the best estimate for each of the symbols such that the bit estimates are hard decisions for each of the individual bits of those respective symbols.

In one implementation (described here with respect to the FIG. 26), these iterative decoding processing steps, performed by the symbol sequence estimate and symbol node update functional block and the check node update functional block, are repeated a predetermined number of iterations (e.g., repeated n times, where n is selectable).

Figure 27:
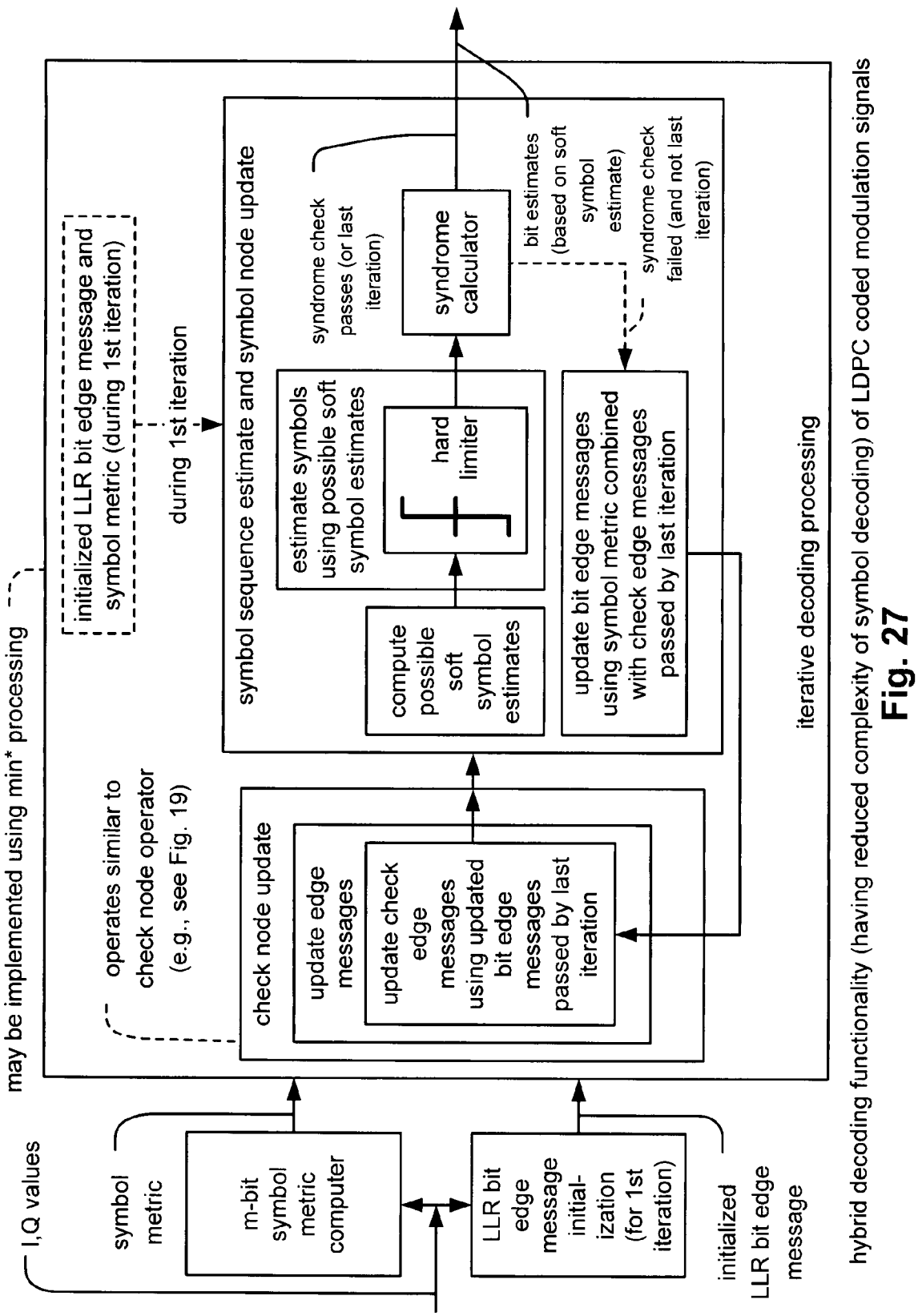
FIG. 27 is a diagram illustrating another embodiment of hybrid decoding functionality (having a reduced complexity when compared to symbol decoding) of LDPC coded modulation signals according to the invention.

FIG. 27 is a diagram illustrating another embodiment of hybrid decoding functionality (having a reduced complexity when compared to symbol decoding) of LDPC coded modulation signals according to the invention. In this alternative implementation, these iterative decoding processing steps are repeated until the syndromes of the LDPC code are all equal to zero (within a certain degree of precision). As mentioned above, soft symbol estimate is generated within the symbol sequence estimate and symbol node update functional block. This soft output information may be provided to a hard limiter where hard decisions may be made, and that hard information may be provided to a syndrome calculator to determined whether the syndromes of the LDPC code are all equal to zero (within a certain degree of precision). When they are not, a syndrome check failed signal may be provided to the iterative decoding processing functional block (and when it is determined that this decoding iteration is not the last decoding iteration), and the iterative decoding processing continues again by appropriately updating and passing the bit edge messages and the check edge messages between the check node update functional block and the symbol sequence estimate and symbol node update functional block. After all of these iterative decoding processing steps have been performed, then the best estimates of the bits are output based on the soft symbol estimates. It is also noted that some additional decisions and/or operations may be implemented when the situation arises where the syndromes of the LDPC code are not converging substantially to zero (within a certain degree of precision) and yet the last decoding iteration has in fact been performed.

This functionality diagrams described above with respect to the FIG. 26 and the FIG. 27 show at least two possible ways in which the hybrid decoding approach may be performed to allow for the decoding of LDPC coded signals using both bit level and symbol level information (e.g., thereby being hybrid). Other possible embodiments are also described below to show how this type of hybrid decoding may be performed.

It is also noted that this functionality (within the FIG. 26 and/or FIG. 27) may be implemented in the logarithmic domain thereby enabling multiplication operations to be performed using addition and division operations to be performed using subtraction. Moreover, many of the calculations may be performed using min* processing as is also described in greater detail below in other of the various embodiments.

Figure 28:
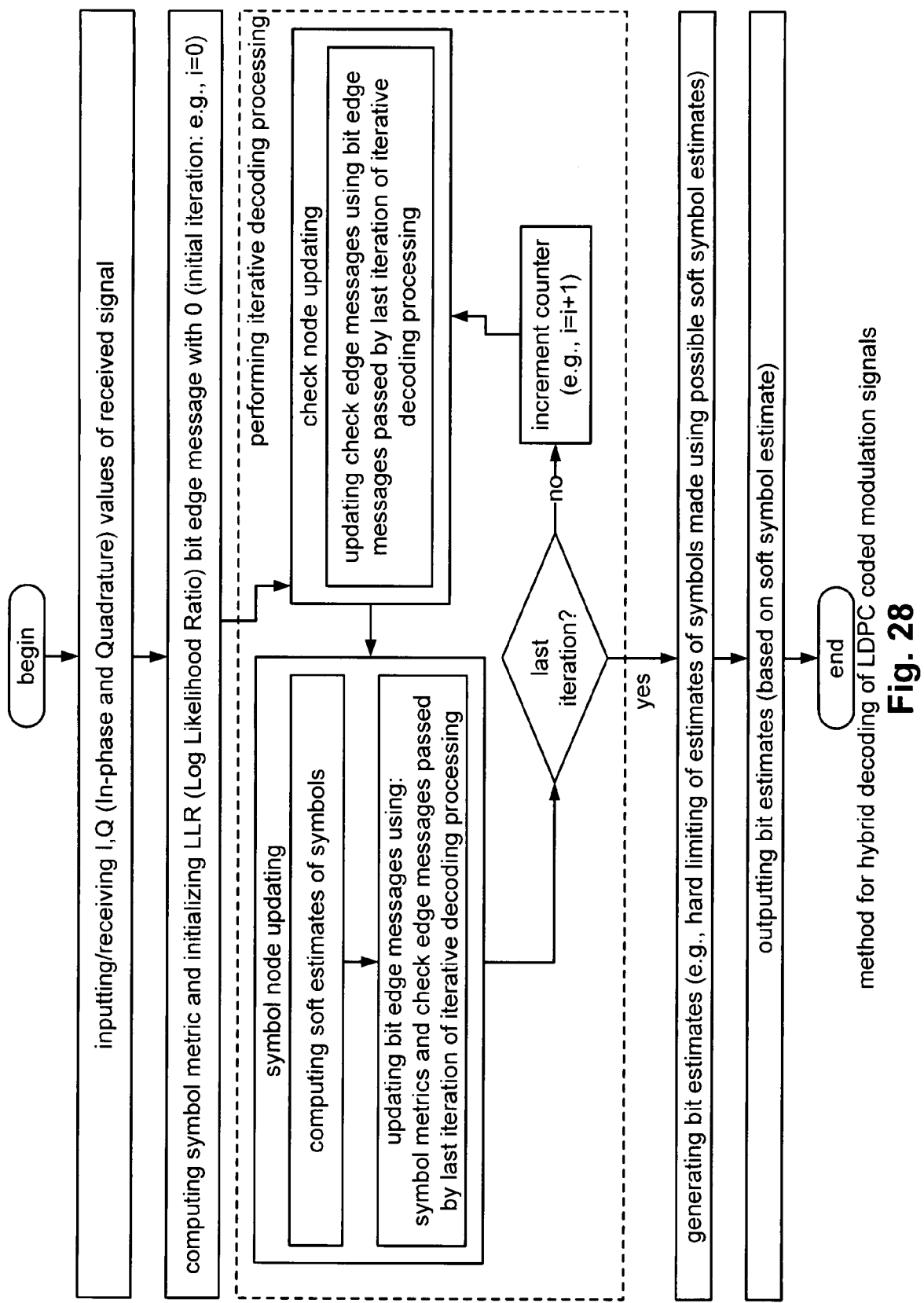
FIG. 28 is a flowchart illustrating an embodiment of a method for hybrid decoding of LDPC coded modulation signals according to the invention.

FIG. 28 is a flowchart illustrating an embodiment of a method for hybrid decoding of LDPC coded modulation signals according to the invention. This method begins by inputting/receiving the I, Q (In-phase, Quadrature) values of the received signal. The method then continues by computing the symbol metric of the received signal and initializing the LLR bit edge message with a value of 0 (for the initial hybrid decoding iteration—e.g., i=0).

The method then continues by performing the check node updating. This check node updating involves updating the check edge messages using the bit edge messages passed from the symbol node updating during the last decoding iteration of the iterative decoding processing.

The method then continues by performing the symbol node updating. This symbol node updating involves computing the possible soft estimates of the symbols of the signal. The symbol node updating also performs updating of the bit edge messages using both the computed symbol metrics and the check edge messages passed by the last iteration of the iterative decoding processing.

It is then determined if this is the last decoding iteration to be performed by the hybrid decoding approach. If it is not the last decoding iteration, then the method continues by performing another iteration of the iterative decoding processing (beginning again with the check node updating). The counter of the iterative decoding processing is then incremented (e.g., i=i+1), and the method then performs the next iteration of check node updating. This iterative decoding processing of the check node updating and the symbol node updating being performed successively and alternatively is performed until the last decoding iteration or until a final solution of the bit edge messages has been converged upon to a sufficient degree of precision.

It is then again determined if this is the last decoding iteration to be performed by the hybrid decoding approach. Once the last decoding iteration is performed, then the method continues by generating bit estimates of the symbol that is being decoded. This may be performed by doing hard limiting of the estimate of the symbol made from the possible soft symbol estimates. The method then continues by outputting the bit estimates that have been made using the soft symbol estimates generating during the last iterative decoding iteration.

Figure 29:
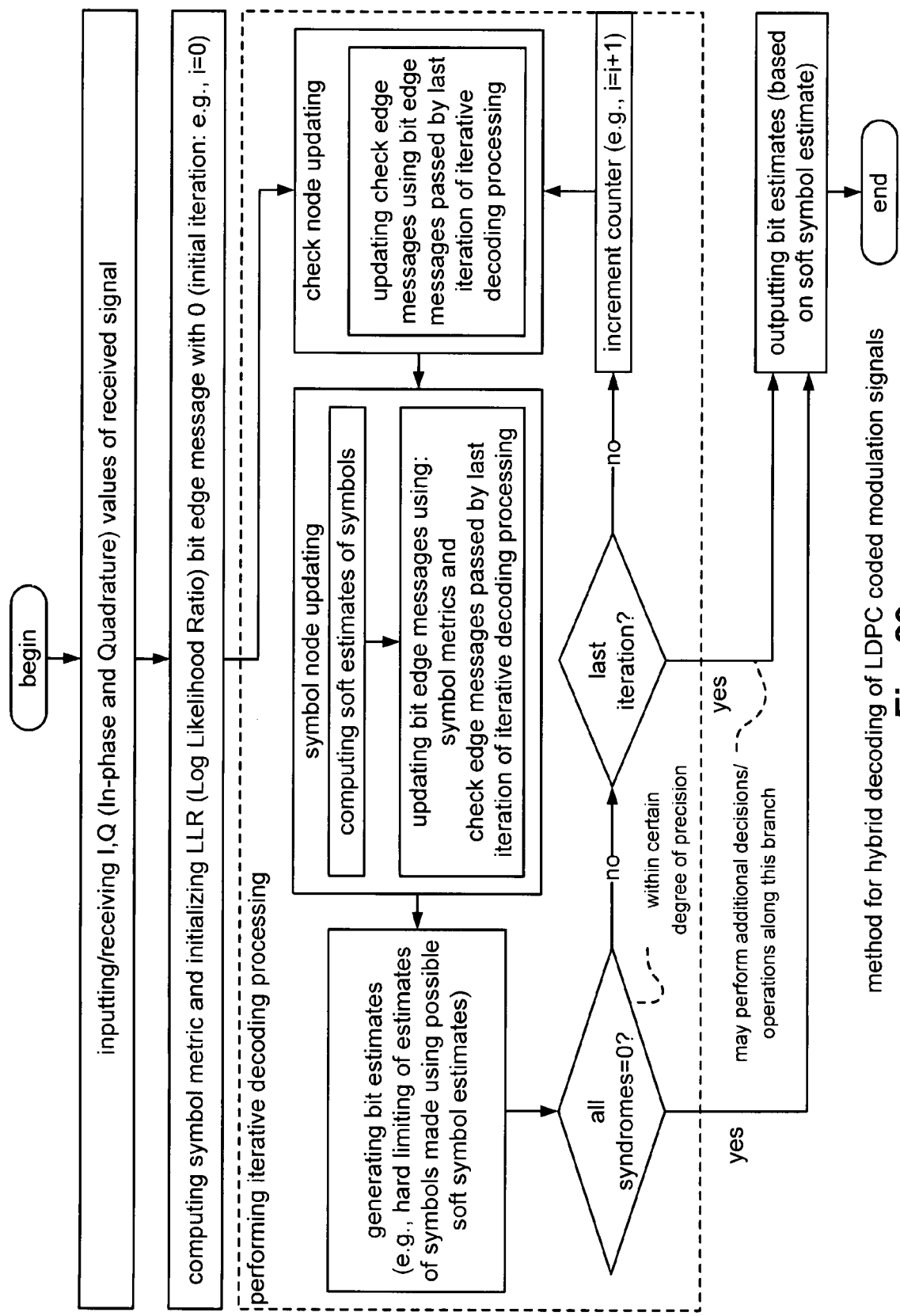
FIG. 29 is a flowchart illustrating an alternative embodiment of a method for hybrid decoding of LDPC coded modulation signals according to the invention.

FIG. 29 is a flowchart illustrating an alternative embodiment of a method for hybrid decoding of LDPC coded modulation signals according to the invention. This method is relatively analogous to the method for hybrid decoding of LDPC coded modulation signals that is described above with respect to the FIG. 28 with some differences. The methodology of performing the iterative decoding processing is slightly different than that described in the embodiment of FIG. 28.

Similar to the embodiment of FIG. 28, this method begins by inputting/receiving the I, Q values of the received signal. The method then continues by computing the symbol metric of the received signal and initializing the LLR bit edge message with a value of 0 (for the initial hybrid decoding iteration—e.g., i=0).

The method then continues by performing the check node updating. This check node updating involves updating the check edge messages using the bit edge messages passed from the symbol node updating during the last decoding iteration of the iterative decoding processing.

The method then continues by performing the symbol node updating. This symbol node updating involves computing the possible soft estimates of the symbols of the signal. The symbol node updating also performs updating of the bit edge messages using both the computed symbol metrics and the check edge messages passed by the last iteration of the iterative decoding processing.

Where this embodiment departs from the embodiment of the FIG. 28 is that the iterative decoding processing involves generating bit estimates during each decoding iteration. For example, this may be performed by doing hard limiting of the estimate of the symbol made from the possible soft symbol estimates. Then, once these hard bit estimates are provided, then the method determines whether the syndromes of the LDPC code are all equal to zero (within a certain degree of precision).

When the syndromes are not all equal to zero (within a certain degree of precision), the iterative decoding processing continues by then determining if this is the last decoding iteration to be performed by the hybrid decoding approach. If it is not the last decoding iteration, then the method continues by performing another iteration of the iterative decoding processing (beginning again with the check node updating). The counter of the iterative decoding processing is then incremented (e.g., i=i+1), and the method then performs the next iteration of check node updating. This iterative decoding processing of the check node updating and the symbol node updating being performed successively and alternatively (in conjunction with the bit estimating during each iteration along with the syndrome determination) is performed until the syndromes are all zero (within a certain degree of precision), until last decoding iteration, or until a final solution of the bit edge messages has been converged upon to a sufficient degree of precision.

If, however, the syndromes are all zero (within a certain degree of precision), then the method continues by outputting the bit estimates that have been made using the soft symbol estimates generating during the last iterative decoding iteration. Also, if it determined that this is the last decoding iteration to be performed by the hybrid decoding approach, then the method continues by outputting the bit estimates that have been made using the soft symbol estimates generating during the last iterative decoding iteration.

Figure 30:
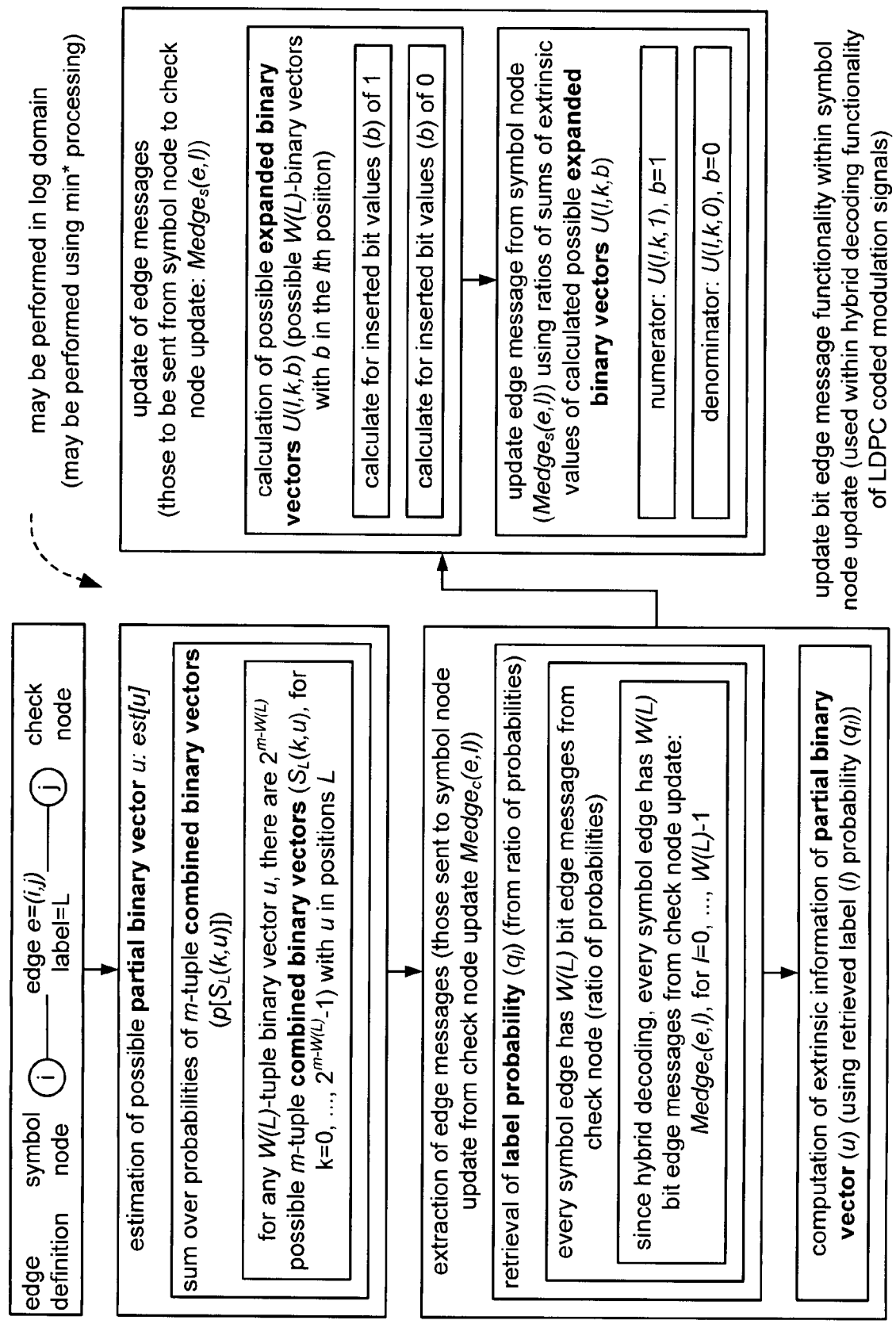
FIG. 30 is a diagram illustrating an embodiment of update bit message functionality within symbol node update (used within hybrid decoding functionality of LDPC coded modulation signals) according to the invention.

FIG. 30 is a diagram illustrating an embodiment of update bit message functionality within symbol node update (used within hybrid decoding functionality of LDPC coded modulation signals) according to the invention. From certain perspectives, the following description may be viewed as being within the context of the LDPC coded modulation bipartite graph (or symbol bipartite graph) shown above with respect to the FIG. 24B. For example, the labels (which may be represented as a label binary vector L) of the symbol bipartite graph is related to the number of bit edges in a corresponding LDPC coded modulation tripartite graph (or bit bipartite graph) shown above with respect to the FIG. 24A. For an m-bit coded modulation symbol with a label represented by an m-tuple symbol (or m-tuple binary vector), $L=(L_{m-1}, \ldots, L_0)$, $L_i=0,1$, then an edge weight function of label edges, W(L), to be the Hamming weight of L. As an example of this, for m=3, the edge weight function of label edges, W(L), may be provided as follows:

$$W(L) = \begin{cases} 1 & L = 1, 2, 4 \\ 2 & L = 3, 5, 6 \\ 3 & L = 7 \end{cases} \quad (\text{EQ 6})$$

The following is a description of the updating of the bit edge messages, shown as Medge(e,l) (where e=edge and l=label), and one possible approach for calculating the soft estimates of symbols, p(S), is described below with respect to the FIG. 33. This following description of the updating of the bit edge messages, Medge(e,l), is employed using an m-bit modulation system.

This update bit edge message functionality is shown by re-iterating the edge definition. An edge, e=(i,j), connects a symbol node i to a check node j and is labeled with label L. The update bit edge message functionality then supports the estimation of a possible partial binary vector u (whose estimation is shown as est[u]).

For any W(L)-tuple partial binary vector, u, there are $2^{m-W(L)}$ possible m-tuple binary vectors with u in the positions L, namely, $S_L(k,u)$, $k=0, \ldots, 2^{m-W(L)}-1$, which is hereinafter referred to as a combined binary vector. The manner in which the combined binary vector, $S_L(k,u)$, may be generated in described in greater detail below. Using this combined binary vector, $S_L(k,u)$, the estimation, est[u], of the partial binary vector, u, may be performed as follows:

$$est[u] = \sum_{k=0}^{2^{m-W(L)}-1} p[S_L(k, u)]. \quad (\text{EQ 7})$$

This is the summation of the probabilities of the combined binary vectors, $S_L(k,u)$, over $k=0, \ldots, 2^{m-W(L)}-1$.

Since the edge messages passed for subsequent used in check node updating are to be in an "extrinsic" format, the edge messages sent from the check node updating have to be extracted before performing the symbol node updating. To do this, the update bit edge message functionality within the symbol node update employed a functional block that performs the extraction of the edge messages (those sent to the symbol node update from the check node update: these edge messages are depicted as $Medge_c(e,l)$). Since the decoding approach described herein is hybrid in nature, every symbol edge has W(L) bit edge messages, $Medge_c(e,l)$, $l=0, \ldots, W(L)-1$, sent to the symbol node update functional block from the check node update functional block; these bit edge messages, $Medge_c(e,l)$, are actually ratios of the probabilities. To get back the label probability corresponding to the edges, shown as $q_l$, the following calculations may be performed:

$$q_l(1) = \frac{1}{(1 + Medge_c(e, l))} \quad (\text{EQ 8})$$

$$q_l(0) = 1 - q_l(1) = 1 - \frac{1}{(1 + Medge_c(e, l))}$$

The partial binary vector, u, may be denoted as $u=(u_{W(L)-1}, \ldots, u_0)$. Using this denotation of the partial binary vector, u, then the computation of the extrinsic information, extrinc[u], of the partial binary vector, u, may be performed as follows:

$$extrinc[u] = \frac{est[u]}{\prod_{l=0}^{W(L)-1} q_l(u_l)} \quad (EQ\ 9)$$

This extrinsic information, extrinc[u], of the partial binary vector, u, is the ratio of the estimation, est[u], of the partial binary vector, u, over the product of terms, $q_l(u_l)$, which indicates the label probabilities indexed by the elements of the partial binary vector, u, where i ranges from 0 to W(L)−1.

Now that the extrinsic information, extrinc[u], of the partial binary vector, u, has been extracted, the update bit edge message functionality employs an update of edge message functional block to update the bit edge messages within the symbol node update functional block; the bit edge messages are now denoted (with respect to the symbol node update functional block) as $Medge_s(e,l)$ where the s indicates the edge messages associated with the symbol node update functional block.

The update of edge message functional block then performs the calculation of possible expanded binary vectors, U(l,k,b). These possible expanded binary vectors, U(l,k,b), are formed by inserting a bit, b, into the various possible bit locations within binary vector. For example, for each of the labels, as directed by $l \in \{0, \ldots, E(L)-1\}$, there are N (where $N=2^{E(L)-1}$) possible W(L)-tuple vectors with the bit, b, in the l-th position. These possible expanded binary vectors, U(l,k,b), are indexed by the value of k. The possible expanded binary vectors, U(l,k,b), are calculated for the various inserted bit values of b=1 and b=0 into these various locations (e.g., calculating U(l,k,1) and U(l,k,0)). Then, the extrinsic values, extrinc[U(l,k,1)] and extrinc[U(l,k,0)], of these possible expanded binary vectors, U(l,k,b), are computed for use in updating the edge message with respect to the symbol node update functional block (e.g., $Medge_s(e,l)$). This new edge message may be calculated as follows:

$$Medge_s(e, l) = \frac{\sum_{k=0}^{N-1} extrinc[U(l, k, 1)]}{\sum_{k=0}^{N-1} extrinc[U(l, k, 0)]}, l = 0, \ldots, W(L)-1. \quad (EQ\ 10)$$

As mentioned above, this decoding processing may be implemented in the logarithmic domain thereby enabling multiplication operations to be performed using addition and division operations to be performed using subtraction. The use of min* processing may also be employed.

In the logarithmic domain, the calculation of the estimation, est[u], of the partial binary vector, u, may be performed as follows:

$$est[u] = min^*\{p/S(k,u)] | k=0, \ldots, 2^{m-W(L)}-1\}. \quad (EQ\ 11)$$

The min* processing functionality is described in greater detail above with respect to EQ 4.

In the logarithmic domain, the label probability corresponding to the edges, shown as $q_l$, the following calculations may be performed:

$$q_l(1) = -\ln(1+\exp(Medge_c(e,l)))$$

$$q_l(0) = Medge_c(e,l) - q_l(1) \quad (EQ\ 12)$$

Also in the logarithmic domain, the computation of the extrinsic information, extrinc[u], of the partial binary vector, u, may be performed as follows:

$$extrinc[u] = est[u] - \left(\sum_{l=0}^{W(L)-1} q_l(u_l)\right). \quad (EQ\ 13)$$

When the value of i=0 (e.g., the initial iteration), the initialization of $$\sum_{l=0}^{W(L)-1} q_l(u_l) = 1$$

may be made.

Also in the logarithmic domain, the new edge message may be calculated as follows (using both min* processing and the extrinsic calculation function):

$$Medge_s(e,l) = (min^*\{extrinc[U(l,k,1)] | k=0, \ldots, N-1\}) - min^*\{extrinc[U(l,k,0)] | k=0, \ldots, N-1\} \quad (EQ\ 14)$$

By allowing for the hybrid decoding processing to be performed in the logarithmic domain, there is afforded a significant ease of implementation when compared to performing all of the multiplications and divisions required when not operating in the logarithmic domain.

In the following 2 diagrams, possible approaches to performing generation of the combined binary vector, $S_L(k,u)$, and the possible expanded binary vectors, U(l,k,b), are presented.

Figure 31:
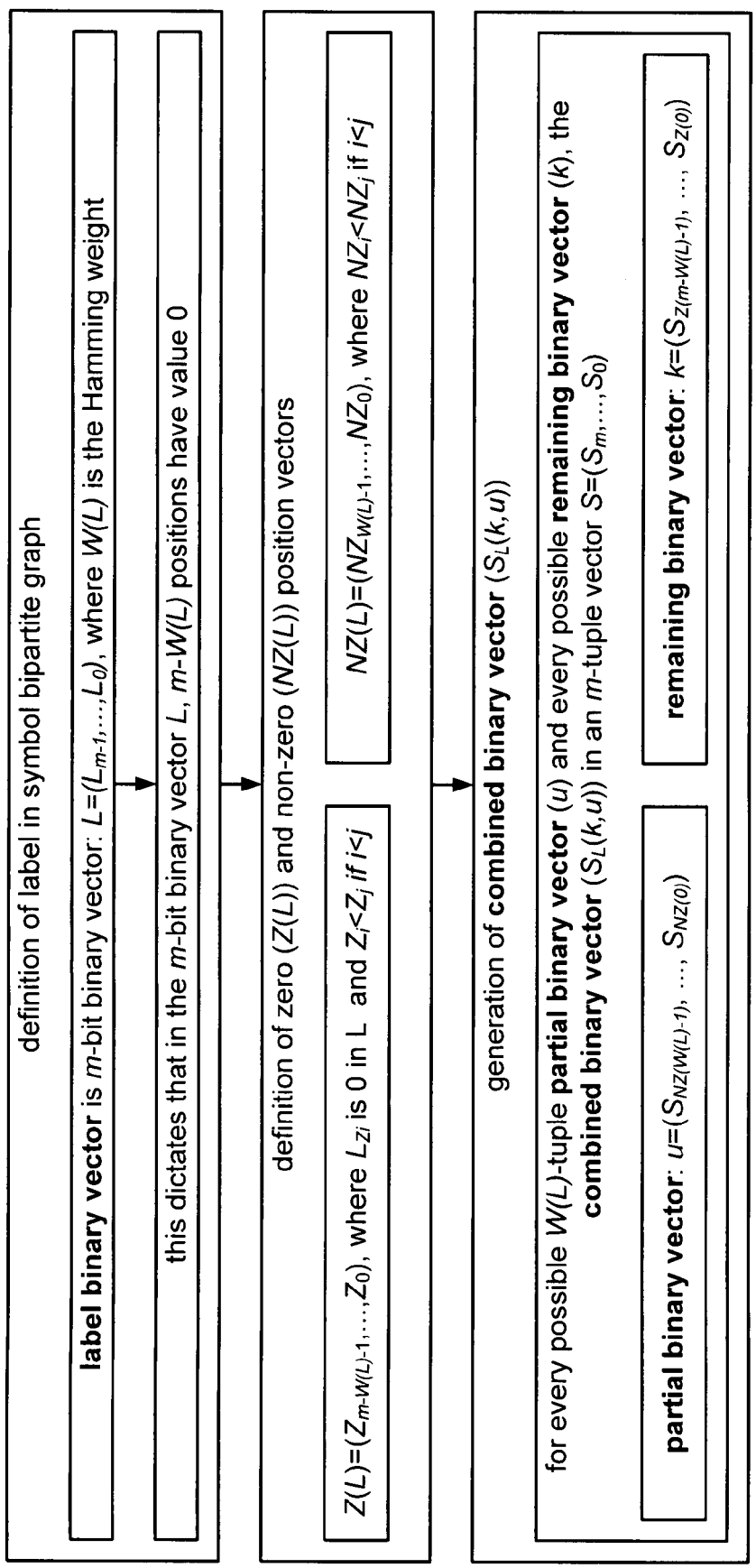
FIG. 31 is a diagram illustrating an embodiment of combined binary vector generation according to the invention.

FIG. 31 is a diagram illustrating an embodiment of combined binary vector generation according to the invention. As mentioned previously, a label in the LDPC coded modulation bipartite graph (or symbol bipartite graph) (as shown in the FIG. 24B) can be considered as an m-bit binary vector, namely $L=(L_{m-1}, \ldots, L_0)$, which has a Hamming weight W(L). This indicates that in the vector, L, there are m−W(L) positions having the value of 0. This combined binary vector generation then uses the definition of the zero, Z(L), and non-zero, NZ(L), position vectors.

The zero position vector, Z(L), may be defined as follows:

$$Z(L) = (Z_{m-W(L)-1}, \ldots, Z_0), \quad (EQ\ 15)$$

where $L_{Z_i}$ is zero in L and $Z_i < Z_j$ if i<j.

Similarly, the non-zero position vector, NZ(L), may be defined as follows:

$$NZ(L) = (NZ_{W(L)-1}, \ldots, NZ_0), \quad (EQ\ 16)$$

where $NZ_i < NZ_j$ if i<j.

For every possible W(L)-tuple partial binary vector, u, and every possible m-W(L)-tuple remaining binary vector k, the combined binary vector, $S_L(k,u)$, is defined to be an m-tuple vector $(S_m, \ldots, S_0)$, such that:

partial binary vector u: $u = (S_{NZ_{W(L)-1}}, \ldots, S_{NZ_0})$ (EQ 17A)

remaining binary vector k: $k = (S_{Z_{m-W(L)-1}}, \ldots, S_{Z_0})$ (EQ 17B)

As an example of how the combined binary vector, $S_L(k,u)$, may be formed using the partial binary vector, u, and the remaining binary vector, k, the following is provided for when m=3.

for m=3, partial binary vector u: $u=(u_{W(L)-1},\ldots,u_0)$ (EQ 18A)

for m=3, remaining binary vector k:
$k=(k_{3-W(L)-1},\ldots,k_0)$ (EQ 18B)

The combined binary vector, $S_L(k,u)$, for m=3, is then formed as follows:

$$S_L(k,u) = \begin{cases} (k_1,k_0,u_0) & L=1 \\ (k_1,u_0,k_0) & L=2 \\ (k_0,u_1,u_0) & L=3 \\ (u_0,k_1,k_0) & L=4 \\ (u_1,k_0,u_0) & L=5 \\ (u_1,u_0,k_0) & L=6 \\ (u_2,u_1,u_0) & L=7 \end{cases} \quad \text{(EQ 19)}$$

In general, the combined binary vector, $S_L(k,u)$, is formed using the partial binary vector, u, for the first portion of the binary vector and using the remaining binary vector, k, for the rest of the binary vector. However, care must be taken when forming the combined binary vector, $S_L(k,u)$. It is not a simple matter of placing the partial binary vector, u, adjacent to the remaining binary vector, k, to form the combined binary vector, $S_L(k,u)$. When considering the example shown above where m=3, it can be seen that the manner in which the partial binary vector, u, and the remaining binary vector, k, are combined to form the combined binary vector, $S_L(k,u)$, depends on the value of L that thereby dictates which elements of the partial binary vector, u, and the remaining binary vector, k, are used to form the combined binary vector, $S_L(k,u)$.

Figure 32:
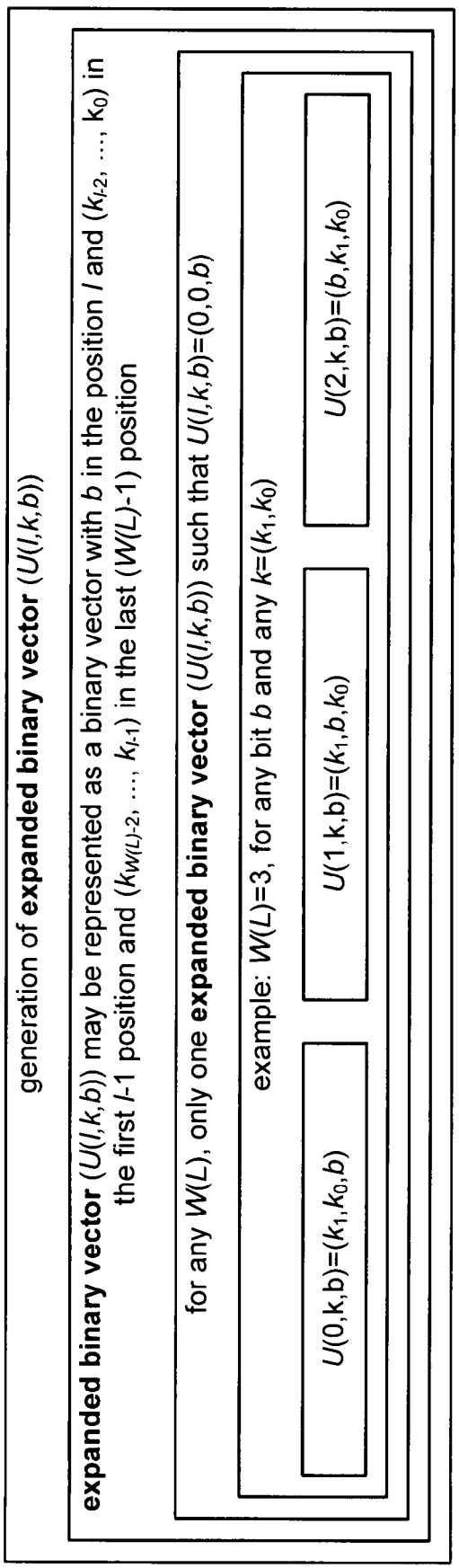
FIG. 32 is a diagram illustrating an embodiment of expanded binary vector generation according to the invention.

FIG. 32 is a diagram illustrating an embodiment of expanded binary vector generation according to the invention. The expanded binary vectors, U(l,k,b), are employed for subsequent use in calculating the extrinsic values, extrinc[U(l,k,1)] and extrinc[U(l,k,0)], of these possible expanded binary vectors, U(l,k,b). As a reminder, such values are then used in updating the edge message with respect to the symbol node update functional block (e.g., Medge$_s$(e,l)).

For any given bit, b, and any number, k (where k∈{0, . . . , $2^{W(L)-1}-1$}, which may alternatively be represented as $(k_{W(L)-2},\ldots,k_0)$), then the W(L)-tuple vector forming an expanded binary vector, U(l,k,b), is defined to be a binary vector with the bit, b, in the position l and $(k_{l-2},\ldots,k_0)$ in the first l-2 position and $(k_{W(L)-2},\ldots,k_{l-1})$ in the last W(L)−l position. It is also noted that when W(L)=1, there is only one expanded binary vector, U(l,k,b), such that l and k are 0; in other words, there is only one expanded binary vector, U(l,k,b), that is U(0,0,b).

As an example to illustrate this property, the following is provided for when Hamming weight W(L)=3. For any bit, b, and any number k (where k=($k_1,k_0$)) there are 3 vectors that may be represented as follows:

U(0,k,b)=($k_1,k_0$,b)

U(1,k,b)=($k_1$,b,$k_0$).

U(2,k,b)=(b,$k_1,k_0$) (EQ 20)

Figure 33:
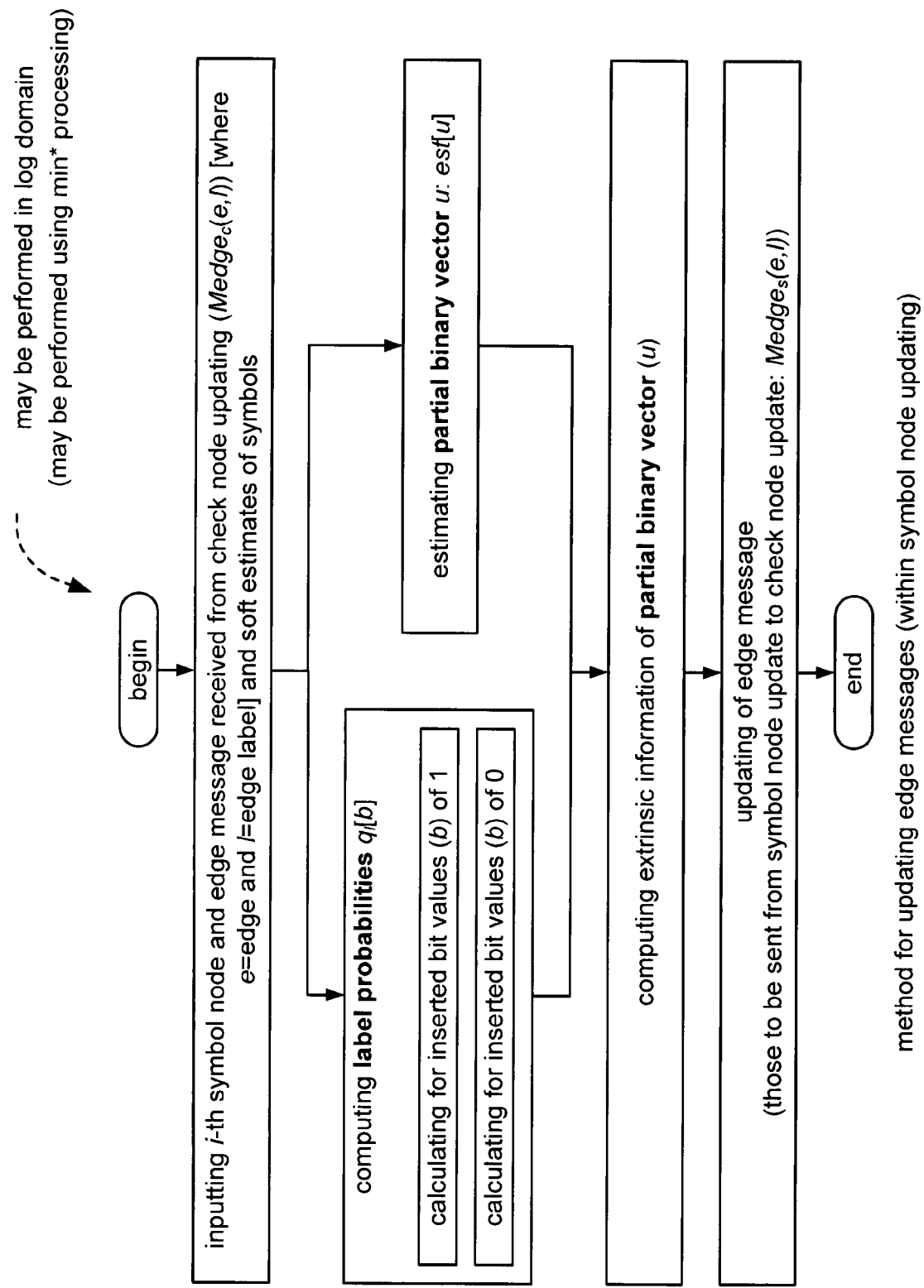
FIG. 33 is a flowchart illustrating an embodiment of a method for updating edge messages (within symbol node updating) according to the invention.

FIG. 33 is a flowchart illustrating an embodiment of a method for updating edge messages (within symbol node updating) according to the invention. This diagram shows one possible way in which a method may be implemented to perform the updating of the edge messages; this method shown in this embodiment may be viewed as performing the updating of the edge messages within a method that performs the symbol node updating that is itself a part of a method that performs part of hybrid decoding of LDPC coded modulation signals.

The method described with respect to this diagram (e.g., updating edge messages (within symbol node updating)) begins by inputting the i-th symbol node and edge message received from check node updating. This check node updating may be is itself a part of a method that performs part of hybrid decoding of LDPC coded modulation signals. This edge message may be represented as Medge$_c$(e,l), where e indicates the edge and l indicates the label associated therewith. Also, this method begins by inputting the soft estimates of the symbols that are being decoded as well.

The method then continues by computing of the label probabilities, q$_l$[b], and by estimating the partial binary vector, u, thereby calculating the estimation, est[u]. These two operations may be performed in parallel, if desired, in certain embodiments. The label probabilities, q$_l$[b], are calculated for the inserted bit value of both 1 and 0 (e.g., q$_l$[1] and q$_l$[0]).

The method continues by computing the extrinsic information, extrinc[u], of the partial binary vector, u. Then, the method continues by updating the edge message that is to be sent from the symbol node update to the check node update; this edge message may now be represented as Medge$_s$(e,l).

Figure 34:
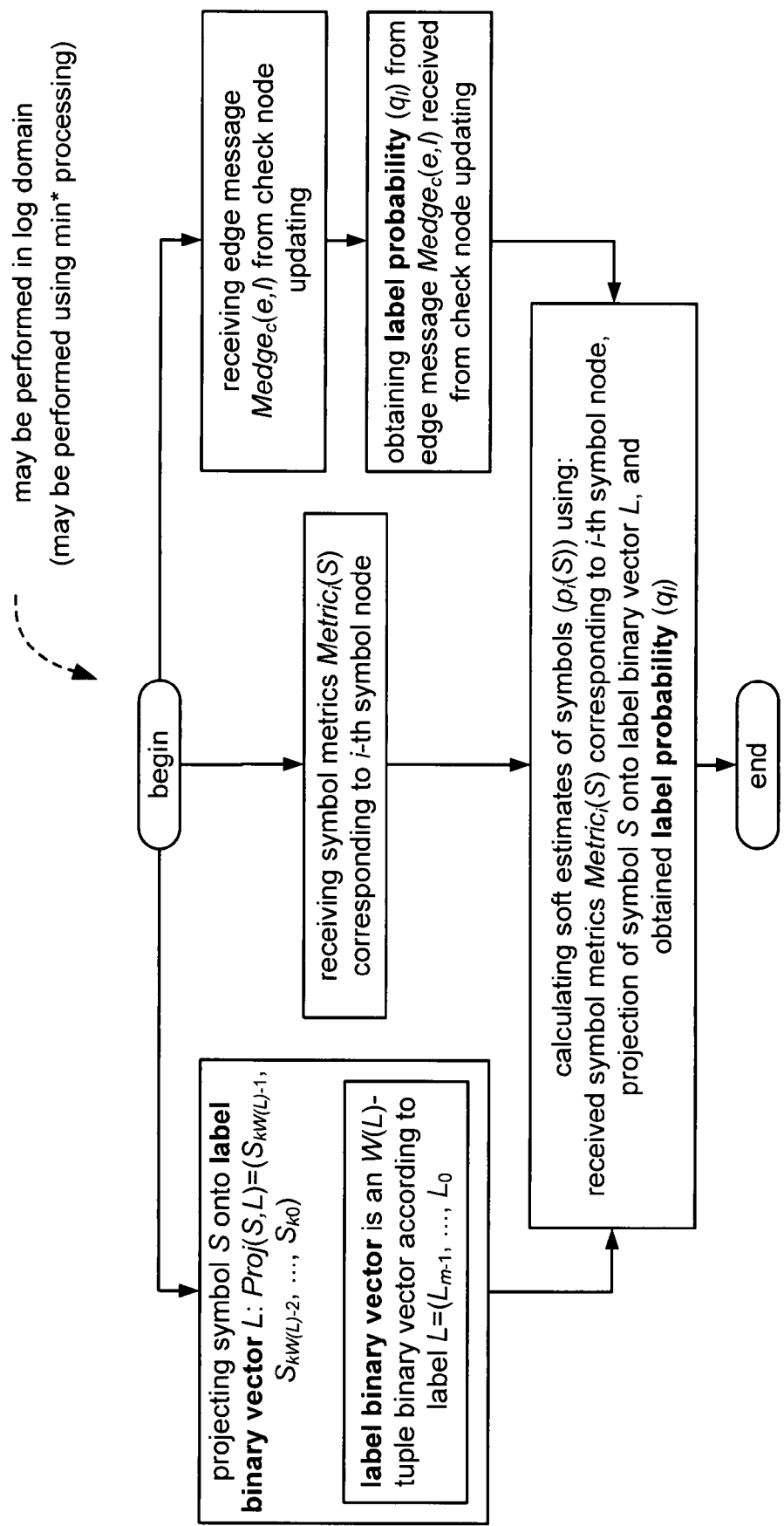
FIG. 34 is a flowchart illustrating an embodiment of a method for calculating soft estimates of symbols (within symbol node updating) according to the invention.

FIG. 34 is a flowchart illustrating an embodiment of a method for calculating soft estimates of symbols (within symbol node updating) according to the invention. This embodiment shows one possible method by which calculating of soft estimates of symbols may be performed. This method for calculating soft estimates of symbols may be viewed as being part of a symbol node updating method that it itself part of a method for hybrid decoding of LDPC coded modulation signals. The calculating of the soft estimate of the symbols may be implemented as performing 3 separate operations. These operations may be implemented in parallel, as desired, within a given application.

The method involves projecting a symbol, S, onto a label binary vector, L. It is noted here that the symbol, S, is not be confused with the combined binary vector combined binary vector, $S_L(k,u)$, which is described above with respect to the various embodiments for bit edge message updating functionality and methods.

Continuing on with the projecting of a symbol, S, onto a label binary vector, L, when considering an m-tuple symbol S (where S=($S_{m-1},\ldots,S_0$)) and a label binary vector, L, on one edge connecting the symbol node to a check node, that symbol, S, may then be projected to an W(L)-tuple binary vector according to the label. For example, for a label binary vector, L (where L=($L_{m-1},\ldots,L_0$)), with W(L) non-zero bits at positions $k_{W(L)-1},\ldots,k_0$, then the projection of symbol, S, onto a label binary vector, L, may be represented as follows:

$\text{Proj}(S,L)=(S_{k_{W(L)-1}},S_{k_{W(L)-2}},\ldots,S_{k_0})$ (EQ 21)

The method described in this diagram also involves receiving the symbol metrics, Metric$_i$(S), that correspond to the i-th symbol node. The symbol value, S, runs from all possible m-bit binary vectors that may compose S. For example, this may be viewed as the situation where there are n edges, $e_0,\ldots,e_{n-1}$, that connect the symbol node, i, to the check nodes associated with labels, $L^{\{i\}},\ldots,L^{\{n-1\}}$. This relationship is also described in a more detail and pictorially in the FIG. 33 below. Based on this relationship between the symbol node and the check nodes connected thereto via the n edges, then the projection of the symbol, S, onto the label binary vector, L, for the v-th edge may be denoted as follows:

$$Proj(S, L^{\{v\}}) = \left(S^{\{v\}}_{W(L^{\{v\}})-1}, S^{\{v\}}_{W(L^{\{v\}})-2}, \ldots, S^{\{v\}}_{0}\right) \quad (EQ\ 22)$$

The method described in this diagram also involves receiving an edge message, $Medge_c(e,l)$, from the check node updating. Once this edge message, $Medge_c(e,l)$, has been received, then the method involves obtaining the label probabilities, $q_l^{\{v\}}$, there from. Again, v is to the number corresponding to the edge of concern, and l corresponds to the label.

Once all of these values have been obtained, then the method described in this diagram may operate to perform the calculating of the soft estimates of the symbols for the i-th node. The method employs all of the above-mentioned elements when calculating the soft estimates of the symbols described here. As can be seen below, the soft estimates of the symbols is calculated using the received symbol metric corresponding to the i-th symbol node (e.g., $Metric_i(S)$), the individual elements of the projection ($Proj(S,L^{\{v\}})$) of the symbol, S, onto the label binary vector, L (e.g., individual elements represented as $S_l^{\{v\}}$), and the obtained label probabilities, $q_l^{\{v\}}$ (which will be one of two possible obtained label probabilities $q_l^{\{v\}}(0)$ and $q_l^{\{v\}}(1)$).

Mathematically, the operation of calculating of the soft estimates of the symbols, $p_i(S)$, for the i-th node may be represented as follows:

$$p_i(S) = Metric_i(S) + \sum_{v=0}^{n-1}\left(\sum_{l=0}^{W(L^{\{v\}})-1} q_l^{\{v\}}(S_l^{\{v\}})\right) \quad (EQ\ 23)$$

Again, it is noted that $S_l^{\{v\}}$ represents the individual elements of the vector that is the projection of the symbol, S, onto the v-th edge that connects the symbol node i to the check node j and that is the associated the label l.

It is also noted that the method described above with respect to the FIG. 33 and the FIG. 34 may also be performed within the log domain; in doing so, they may employ min* processing for many of the various calculations employed within such operations as well.

Figure 35:
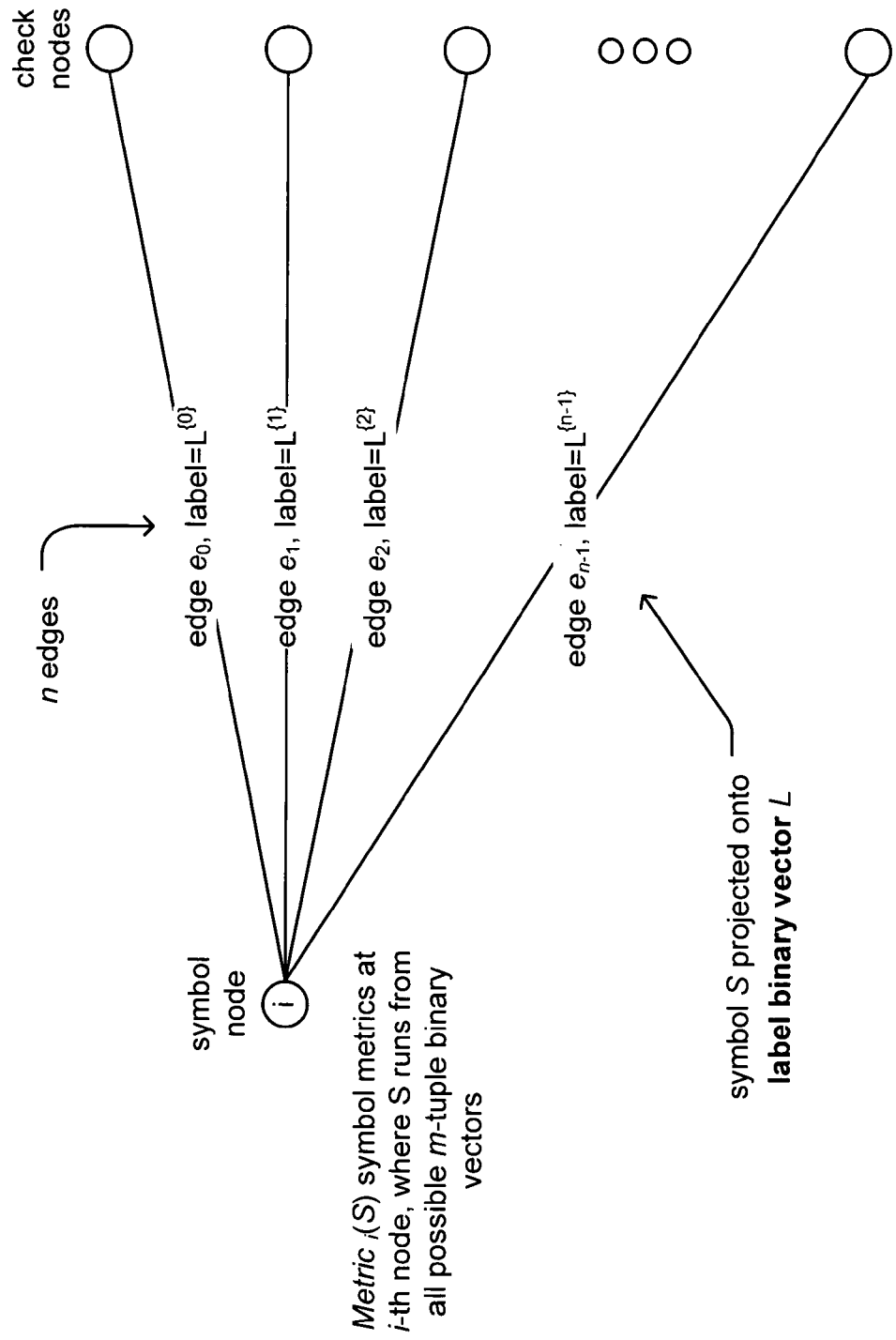
FIG. 35 is a diagram illustrating an embodiment of projection of a symbol onto a label binary vector according to the invention.

FIG. 35 is a diagram illustrating an embodiment of projection of a symbol onto a label binary vector according to the invention. This diagram pictorially shows how the received symbol metric corresponding to the i-th symbol node (e.g., $Metric_i(S)$), includes n edges that connect to the check nodes. The n edges, $e_0, \ldots, e_{n-1}$, are each associated with a particular element of the label binary vector, L. For example, an edge, $e_0$, may associated with a label element of the label binary vector, L, that is represented as $L^{\{0\}}$. Analogously, an edge, $e_3$, may associated with a label element of the label binary vector, L, that is represented as $L^{\{3\}}$.

The performances of various decoding approaches of a received symbol block are compared in the following diagram. The following diagram shows the improvement provided by the invention of using the hybrid decoding approach when decoding LDPC coded signals. This performance diagram is described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR) thereby providing a relatively concise representation of the performance of the decoding approach.

Figure 36:
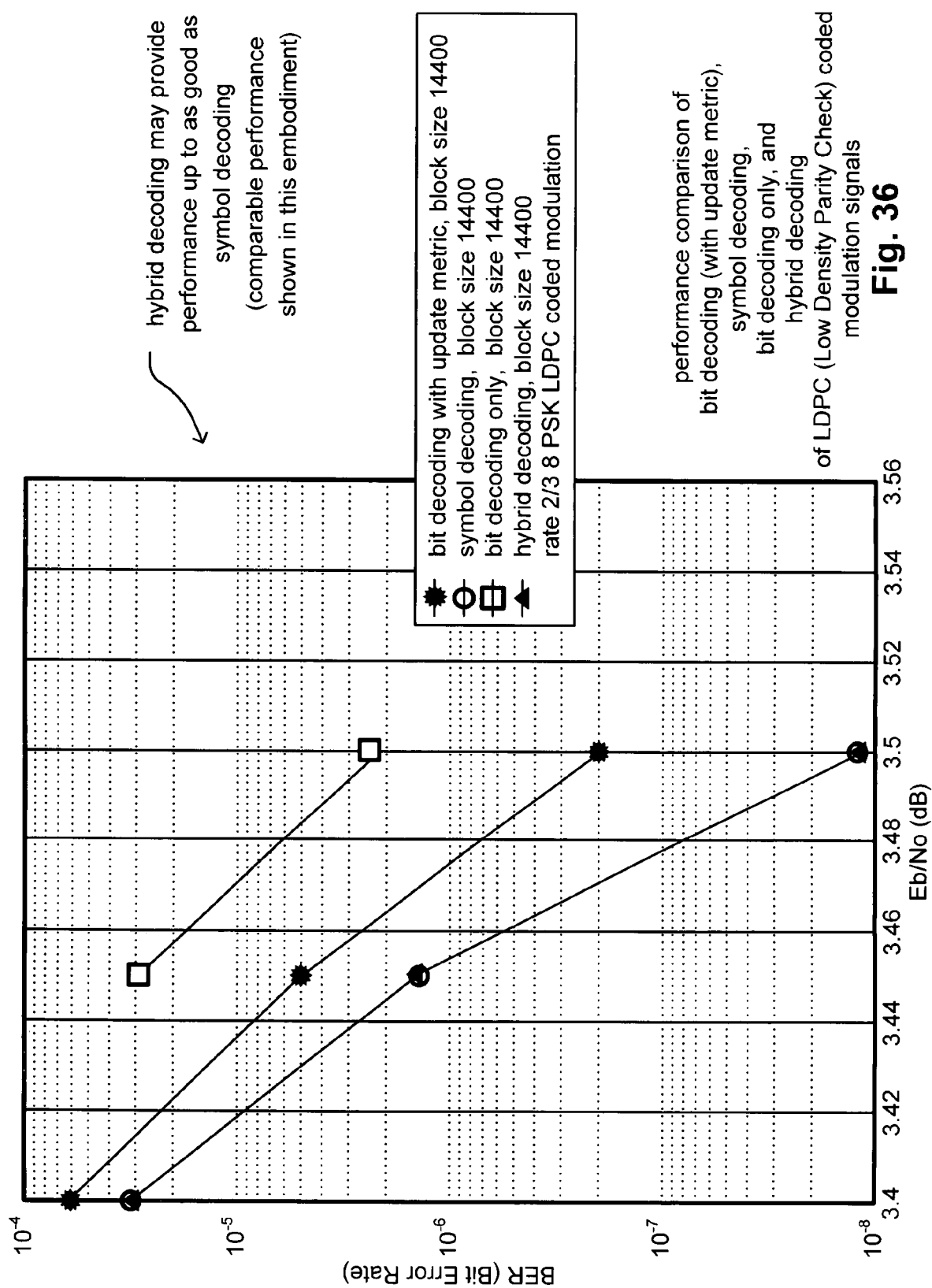
FIG. 36 is a diagram illustrating an embodiment of performance comparison of decoding of LDPC (Low Density Parity Check) coded modulation signals using bit decoding (with update metric), symbol decoding, bit decoding only, and hybrid decoding according to the invention.

FIG. 36 is a diagram illustrating an embodiment of performance comparison of decoding of LDPC (Low Density Parity Check) coded modulation signals using bit decoding (with update metric), symbol decoding, bit decoding only, and hybrid decoding according to the invention. As can be seen within this comparative performance diagram, for a variety of values of $E_b/N_o$ (or SNR), the BER that may be achieved when employing hybrid decoding of LDPC coded modulation signals may be significantly lower than when performing other approaches of decoding LDPC coded modulation signals. More specifically, the performance of the hybrid decoding of LDPC coded modulation signals is typically better than decoding approaches performing bit decoding only or bit decoding in accompany with bit metric updating. However, the hybrid decoding approach does not out-perform the symbol decoding approach. In general, the performance of the hybrid decoding approach is as good as or worse than the symbol decoding approach. In other words, the best performance than can be expected for the hybrid decoding approach would be to match the performance of the symbol decoding approach.

Four different decoding approaches are compared when decoding LDPC coded modulation signals. Within this comparison, the block size of the LDPC code is 14400, and the signal is a code rate 2/3 8 PSK (8 Phase Shift Key) LDPC coded modulation signal.

As one example, the worst performing performance curve corresponds to bit decoding only; when operating at an $E_b/N_o$ of approximately 3.5 dB (decibels), the BER of the bit decoding only approach is approximately $2.5 \times 10^{-6}$.

The next better performance curve corresponds to performing bit decoding in accompany with bit metric updating; for this decoding approach, when operating at an $E_b/N_o$ of approximately 3.5 dB, the BER of the bit decoding approach (that also included metric updating) decreases even more to below approximately under $2 \times 10^{-7}$.

In this performance diagram, the hybrid decoding approach and the symbol decoding approach provided for comparable results. However, it is again noted that the performance of the hybrid decoding approach typically will be only as good as (or worse) than the symbol decoding approach. This embodiment shows the example where the hybrid decoding approach is able to achieve comparable performance as the symbol decoding approach (as can be seen by their respective overlapping data points).

The next better performance curves correspond to performing symbol decoding and hybrid decoding. As can be seen when comparing these various approaches to performing decoding of LDPC coded modulation signals, the symbol decoding and hybrid decoding approaches may be implemented as to provide for much improved performance.

As can be seen, an improvement of over approximately two orders of magnitude of performance may be achieved when performing LDPC hybrid decoding or LDPC symbol decoding when compared to just performing bit decoding only (e.g., at an $E_b/N_o$ of approximately 3.5 dB, bit decoding only provides a BER of approximately $2.5 \times 10^{-6}$ when compared to hybrid decoding or symbol decoding that provide a BER of approximately $1.25 \times 10^{-8}$). Similarly, a significant performance may be achieved when performing LDPC hybrid decoding or symbol decoding when compared to performing bit decoding with update metric as well (e.g., at an $E_b/N_o$ of approximately 3.5 dB, bit decoding with update metric provides a BER of approximately $2 \times 10^{-7}$ when compared to hybrid decoding or symbol decoding that provide for a BER of approximately $1.25 \times 10^{-8}$ at a comparable $E_b/N_o$).

Various embodiments have been described herein. For example, a novel encoding approach has been shown that includes combining LDPC encoding and modulation encoding that is operable to generate LDPC variable code rate and/or modulation signals. In addition, a novel decoding approach has also been shown where hybrid decoding processing is employed within the iterative decoding processing of LDPC coded signals.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to perform hybrid decoding of an LDPC (Low Density Parity Check) coded signal, the decoder comprising:
   a symbol sequence estimate and symbol update module that is operable to update a bit edge message using a symbol metric corresponding to a symbol of the LDPC coded signal and a first check edge message; and
   a check node update module that is operable to update the first check edge message using the updated bit edge message thereby generating a second check edge message; and wherein:
   the symbol sequence estimate and symbol update module is operable to make a soft estimate of the symbol of the LDPC coded signal using the symbol metric and the second check edge message.

2. The decoder of claim 1, further comprising:
   a symbol metric computer that is operable to calculate the symbol metric corresponding to the symbol of the LDPC coded signal.

3. The decoder of claim 1, further comprising:
   a bit edge message initialization module that is operable to calculate an initial LLR (log likelihood ratio) bit edge message corresponding to a bit of the LDPC coded signal for use by the symbol sequence estimate and symbol update module when performing a first decoding iteration.

4. The decoder of claim 1, further comprising:
   a hard limiter that is operable to process the soft estimate of the symbol of the LDPC coded signal thereby making a best estimate of an individual bit within the symbol of the LDPC coded signal.

5. The decoder of claim 1, further comprising:
   a syndrome calculator that is operable to determine whether all syndromes of an LDPC code by which the LDPC coded signal is generated have passed during each decoding iteration of a plurality of decoding iterations; and wherein:
   if at least one syndrome of the LDPC code fails as determined by the syndrome calculator, the decoder is operable to perform at least one additional decoding iteration.

6. The decoder of claim 1, further comprising:
   a syndrome calculator that is operable to determine whether all syndromes of an LDPC code by which the LDPC coded signal is generated have passed; and wherein:
   the symbol sequence estimate and symbol update module and the check node update module operate cooperatively by alternatively and successively performing a plurality of decoding iterations to update bit edge messages and check edge messages, respectively;
   if at least one syndrome of the LDPC code fails as determined by the syndrome calculator, the symbol sequence estimate and symbol update module and the check node update module operate to perform at least one additional decoding iteration of the plurality of decoding iterations; and
   if all syndromes of the LDPC code pass as determined by the syndrome calculator, the symbol sequence estimate and symbol update module and the check node update module operate have performed a final decoding iteration of the plurality of decoding iterations.

7. The decoder of claim 1, wherein:
   the symbol sequence estimate and symbol update module and the check node update module operate cooperatively by alternatively and successively performing a predetermined plurality of decoding iterations to update bit edge messages and check edge messages, respectively.

8. The decoder of claim 1, wherein:
   the LDPC coded signal is a variable modulation signal;
   a first symbol of LDPC coded signal is mapped according to a first modulation that includes a first constellation and a corresponding first mapping; and
   a second symbol of the LDPC coded signal is mapped according to a second modulation that includes a second constellation and a corresponding second mapping.

9. The decoder of claim 1, wherein:
   the LDPC coded signal is a variable code rate signal;
   a first symbol of the LDPC coded signal is encoded according to a first code rate; and
   a second symbol of the LDPC coded signal is encoded according to a second code rate.

10. The decoder of claim 1, wherein:
    the decoder is implemented within a communication device; and
    the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

11. A decoder that is operable to perform hybrid decoding of an LDPC (Low Density Parity Check) coded signal, the decoder comprising:
    a symbol metric computer that is operable to calculate a symbol metric corresponding to a symbol of the LDPC coded signal;
    a symbol sequence estimate and symbol update module that is operable to update a bit edge message using the symbol metric and a first check edge message of a previous decoding iteration; and a check node update module that is operable to:
  update the first check edge message using the updated bit edge message thereby generating a second check edge message; and
  make a soft estimate of the symbol of the LDPC coded signal using the symbol metric and the second check edge message; and
a hard limiter that is operable to process the soft estimate of the symbol of the LDPC coded signal thereby making a best estimate of an individual bit within the symbol of the LDPC coded signal.

12. The decoder of claim 11, further comprising:
a bit edge message initialization module that is operable to calculate an initial LLR (log likelihood ratio) bit edge message corresponding to a bit of the LDPC coded signal for use by the symbol sequence estimate and symbol update module when performing a first decoding iteration.

13. The decoder of claim 11, further comprising:
a syndrome calculator that is operable to determine whether all syndromes of an LDPC code by which the LDPC coded signal is generated have passed during each decoding iteration of a plurality of decoding iterations; and wherein:
if at least one syndrome of the LDPC code fails as determined by the syndrome calculator, the decoder is operable to perform at least one additional decoding iteration.

14. The decoder of claim 11, wherein:
the symbol sequence estimate and symbol update module and the check node update module operate cooperatively by alternatively and successively performing a predetermined plurality of decoding iterations to update bit edge messages and check edge messages, respectively.

15. The decoder of claim 11, wherein:
the LDPC coded signal is a variable modulation signal;
a first symbol of LDPC coded signal is mapped according to a first modulation that includes a first constellation and a corresponding first mapping; and
a second symbol of the LDPC coded signal is mapped according to a second modulation that includes a second constellation and a corresponding second mapping.

16. The decoder of claim 11, wherein:
the LDPC coded signal is a variable code rate signal;
a first symbol of the LDPC coded signal is encoded according to a first code rate; and
a second symbol of the LDPC coded signal is encoded according to a second code rate.

17. The decoder of claim 11, wherein:
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

18. A method for performing hybrid decoding of an LDPC (Low Density Parity Check) coded signal, the method comprising:
calculating a symbol metric corresponding to a symbol of the LDPC coded signal;
updating a bit edge message using the symbol metric and a first check edge message;
updating the first check edge message using the updated bit edge message thereby generating a second check edge message; and
making a soft estimate of the symbol of the LDPC coded signal using the symbol metric and the second check edge message.

19. The method of claim 18, further comprising:
hard limiting the soft estimate of the symbol of the LDPC coded signal thereby making a best estimate of an individual bit within the symbol of the LDPC coded signal.

20. The method of claim 18, further comprising:
determining whether all syndromes of an LDPC code by which the LDPC coded signal is generated have passed during each decoding iteration of a plurality of decoding iterations; and
if at least one syndrome of the LDPC code fails, performing at least one additional decoding iteration.

* * * * *